United States Patent
Roberts et al.

(10) Patent No.: US 9,627,473 B2
(45) Date of Patent: Apr. 18, 2017

(54) PARASITIC CHANNEL MITIGATION IN III-NITRIDE MATERIAL SEMICONDUCTOR STRUCTURES

(71) Applicant: M/A-COM Technology Solutions Holdings, Inc., Lowell, MA (US)

(72) Inventors: John Claassen Roberts, Hillsborough, NC (US); Kevin J. Linthicum, Cary, NC (US); Allen W. Hanson, Cary, NC (US); James W. Cook, Jr., Raleigh, NC (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 14/847,325

(22) Filed: Sep. 8, 2015

(65) Prior Publication Data

US 2017/0069713 A1    Mar. 9, 2017

(51) Int. Cl.
*H01L 23/58* (2006.01)
*H01L 29/06* (2006.01)
*H01L 29/778* (2006.01)

(52) U.S. Cl.
CPC ...... *H01L 29/0638* (2013.01); *H01L 29/7787* (2013.01)

(58) Field of Classification Search
CPC .......................... H01L 29/0638; H01L 29/1025
USPC ................................. 257/652, 145, 372, 394
See application file for complete search history.

(56) References Cited

U.S. PATENT DOCUMENTS

| | | | |
|---|---|---|---|
| 3,544,864 A | 12/1970 | Richman | |
| 3,717,790 A | 2/1973 | Dalton et al. | |
| 4,843,440 A | 6/1989 | Huang | |
| 5,192,987 A | 3/1993 | Khan et al. | |
| 5,239,188 A | 8/1993 | Takeuchi et al. | |
| 5,290,393 A | 3/1994 | Nakamura | |
| 5,296,395 A | 3/1994 | Khan et al. | |
| 5,389,571 A | 2/1995 | Takeuchi et al. | |
| 5,393,993 A | 2/1995 | Edmond et al. | |
| 5,523,589 A | 6/1996 | Edmond et al. | |
| 5,633,192 A | 5/1997 | Moustakas et al. | |
| 5,679,965 A | 10/1997 | Schetzina | |
| 5,739,554 A | 4/1998 | Edmond et al. | |
| 5,741,724 A | 4/1998 | Ramdani et al. | |
| 5,760,426 A | 6/1998 | Marx et al. | |
| 5,786,606 A | 7/1998 | Nishio et al. | |
| 5,815,520 A | 9/1998 | Furushima | |
| 5,838,029 A | 11/1998 | Shakuda | |
| 5,838,706 A | 11/1998 | Edmond et al. | |
| 5,874,747 A | 2/1999 | Redwing et al. | |
| 5,929,467 A | 7/1999 | Kawai et al. | |
| 6,051,849 A | 4/2000 | Davis et al. | |
| 6,064,078 A | 5/2000 | Northrup et al. | |
| 6,064,082 A | 5/2000 | Kawai et al. | |
| 6,069,021 A | 5/2000 | Terashima et al. | |

(Continued)

FOREIGN PATENT DOCUMENTS

WO    WO 96/41906 A1    12/1996
WO    WO 01/13436 A1    2/2001

*Primary Examiner* — Tan N Tran

(74) *Attorney, Agent, or Firm* — Wolf, Greenfield & Sacks, P.C.

(57) ABSTRACT

III-nitride materials are generally described herein, including material structures comprising III-nitride material regions and silicon-containing substrates. Certain embodiments are related to gallium nitride materials and material structures comprising gallium nitride material regions and silicon-containing substrates.

18 Claims, 22 Drawing Sheets

(56) References Cited

U.S. PATENT DOCUMENTS

| | | | |
|---|---|---|---|
| 6,100,545 A | 8/2000 | Chiyo et al. |
| 6,120,600 A | 9/2000 | Edmond et al. |
| 6,121,121 A | 9/2000 | Koide |
| 6,139,628 A | 10/2000 | Yuri et al. |
| 6,146,457 A | 11/2000 | Solomon |
| 6,153,010 A | 11/2000 | Kiyoku et al. |
| 6,156,581 A | 12/2000 | Vaudo et al. |
| 6,177,688 B1 | 1/2001 | Linthicum et al. |
| 6,180,270 B1 | 1/2001 | Cole et al. |
| 6,201,262 B1 | 3/2001 | Edmond et al. |
| 6,255,198 B1 | 7/2001 | Linthicum et al. |
| 6,261,929 B1 | 7/2001 | Gehrke et al. |
| 6,261,931 B1 | 7/2001 | Keller et al. |
| 6,265,289 B1 | 7/2001 | Zheleva et al. |
| 6,291,319 B1 | 9/2001 | Yu et al. |
| 6,329,063 B2 | 12/2001 | Lo et al. |
| 6,380,108 B1 | 4/2002 | Linthicum et al. |
| 6,391,748 B1 | 5/2002 | Temkin et al. |
| 6,403,451 B1 | 6/2002 | Linthicum et al. |
| 6,420,197 B1 | 7/2002 | Ishida et al. |
| 6,426,512 B1 | 7/2002 | Ito et al. |
| 6,440,823 B1 | 8/2002 | Vaudo et al. |
| 6,441,393 B2 | 8/2002 | Goetz et al. |
| 6,459,712 B2 | 10/2002 | Tanaka et al. |
| 6,465,814 B2 | 10/2002 | Kasahara et al. |
| 6,486,502 B1 | 11/2002 | Sheppard et al. |
| 6,498,111 B1 | 12/2002 | Kapolnek et al. |
| 6,521,514 B1 | 2/2003 | Gehrke et al. |
| 6,524,932 B1 | 2/2003 | Zhang et al. |
| 6,548,333 B2 | 4/2003 | Smith |
| 6,583,034 B2 | 6/2003 | Ramdani et al. |
| 6,583,454 B2 | 6/2003 | Sheppard et al. |
| 6,586,781 B2 | 7/2003 | Wu et al. |
| 6,610,144 B2 | 8/2003 | Mishra et al. |
| 6,611,002 B2 | 8/2003 | Weeks et al. |
| 6,617,060 B2 | 9/2003 | Weeks et al. |
| 6,624,452 B2 | 9/2003 | Yu et al. |
| 6,649,287 B2 | 11/2003 | Weeks, Jr. et al. |
| 6,765,240 B2 | 7/2004 | Tischler et al. |
| 6,765,241 B2 | 7/2004 | Ohno et al. |
| 6,777,278 B2 | 8/2004 | Smith |
| 6,841,409 B2 | 1/2005 | Onishi |
| 6,849,882 B2 | 2/2005 | Chavarkar et al. |
| 7,071,498 B2 | 7/2006 | Johnson et al. |
| 7,141,489 B2 | 11/2006 | Burgener, II et al. |
| 7,247,889 B2 | 7/2007 | Hanson et al. |
| 2001/0042503 A1 | 11/2001 | Lo et al. |
| 2002/0020341 A1 | 2/2002 | Marchand et al. |
| 2002/0117695 A1 | 8/2002 | Borges et al. |
| 2003/0136333 A1 | 7/2003 | Semond et al. |
| 2004/0119063 A1 | 6/2004 | Guo et al. |
| 2004/0119067 A1 | 6/2004 | Weeks et al. |
| 2005/0133818 A1 | 6/2005 | Johnson et al. |

PARASITIC CHANNEL MITIGATION IN III-NITRIDE MATERIAL SEMICONDUCTOR STRUCTURES

TECHNICAL FIELD

III-nitride materials are generally described, including gallium nitride materials and associated material structures including substrates comprising silicon.

BACKGROUND

III-nitride materials include gallium nitride (GaN), aluminum nitride (AlN), indium nitride (InN) and their respective alloys (e.g., AlGaN, InGaN, AlInGaN and AlInN). In particular, gallium nitride materials include gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap which permits highly energetic electronic transitions to occur. Such electronic transitions can result in gallium nitride materials having a number of attractive properties including the ability to efficiently emit blue light, the ability to transmit signals at high frequency, and others.

In many applications, III-nitride materials are typically grown heteroepitaxially on a substrate. However, property differences between III-nitride materials (e.g., gallium nitride materials) and many substrate materials can present challenges. For example, gallium nitride materials (e.g., GaN) have a different thermal expansion coefficient (i.e., thermal expansion rate) and lattice constant than many substrate materials and, in particular, silicon. These differences may lead to formation of cracks and/or other types of defects in gallium nitride material layers that are grown heteroepitaxially on silicon. In some methods, a transition layer is used to mitigate the effects of these differences in order to grow high quality gallium nitride material on silicon. However, these differences (and others) have limited the performance and commercialization of structures and devices that include gallium nitride material formed on silicon substrates.

III-nitride materials (e.g., gallium nitride materials) are being investigated in high frequency (e.g., RF and power management) device applications. When energy is dissipated in high frequency devices through undesirable mechanisms (e.g., parasitic losses and capacitive coupling), the performance of the device may be impaired. These so-called parasitic losses can reduce output power, switching speed, power gain, and efficiency. Therefore, it is generally desirable to limit the parasitic losses in high frequency (and other types of) RF and power management devices.

SUMMARY

III-nitride materials are generally described herein, including material structures comprising III-nitride material regions and silicon-containing substrates. Certain embodiments are related to gallium nitride materials and material structures comprising gallium nitride material regions and silicon-containing substrates. The subject matter of the present invention involves, in some cases, interrelated products, alternative solutions to a particular problem, and/or a plurality of different uses of one or more systems and/or articles.

Certain embodiments are related to semiconductor structures. Some embodiments are related to methods of forming semiconductor structures.

According to certain embodiments, the semiconductor structure comprises a substrate comprising silicon, and a III-nitride material region located over a surface region of the substrate, wherein the surface region of the substrate comprises a low-conductivity parasitic channel or the substrate is free of a parasitic channel, and at least a region of the substrate comprises at least one species having a relative atomic mass of less than 5 at a concentration of at least about $10^{19}/cm^3$.

In some embodiments, the method of forming a semiconductor structure comprises implanting a species having a relative atomic mass of less than 5 into a substrate comprising silicon to produce a surface region comprising no parasitic channel or comprising a low-conductivity parasitic channel wherein, during the implanting step, at least a portion of the species is implanted through a III-nitride material region.

The method of forming a semiconductor structure comprises, according to some embodiments, implanting a species having a relative atomic mass of less than 5 into a structure comprising a III-nitride material region and a substrate comprising silicon, wherein at least a portion of the species is implanted through the substrate without being implanted through the III-nitride material region, and implanting the species produces a surface region comprising no parasitic channel or a low-conductivity parasitic channel.

In certain embodiments, the semiconductor structure comprises a substrate comprising silicon, and a III-nitride material region located over a surface region of the substrate, wherein the substrate comprises at least one p-type dopant defining a p-type dopant concentration profile, and the substrate comprises at least one n-type dopant defining an n-type dopant concentration profile that is substantially matched to the p-type dopant concentration profile.

The method of forming a semiconductor structure comprises, according to certain embodiments, implanting a counter-dopant into a semiconductor structure comprising a III-nitride material region and a substrate comprising silicon such that a concentration profile of the counter-dopant substantially matches a concentration profile of a second dopant present within the substrate.

The semiconductor structure comprises, according to some embodiments, a substrate comprising silicon and at least one active species coupled with an external species or capable of reacting with an external species, and a III-nitride material region located over a surface region of the substrate, wherein the concentration of the active species is at least about $10^{19}/cm^3$.

In certain embodiments, the method of forming a semiconductor structure comprises forming a III-nitride material region over a surface region of a substrate comprising silicon such that a species within the substrate reacts with at least a portion of an external species that contacts the substrate during the formation of the III-nitride material region.

According to some embodiments, the semiconductor structure comprises a substrate comprising silicon and comprising at least a layer having a resistivity of greater than $10^2$ Ohms-cm; a low-temperature AlN region located over the substrate; a high-temperature AlN region located over the substrate; and a III-nitride material region located over the low-temperature AlN region and over the high-temperature AlN region.

The method of forming a semiconductor structure comprises, in certain embodiments, forming a first AlN region over a substrate comprising silicon and comprising at least a layer having a resistivity of greater than $10^2$ Ohms-cm, wherein the temperature of the environment in which the first AlN region is formed is between about 700° C. and about 950° C.; forming a second AlN region over the substrate, wherein the temperature of the environment in which the second AlN region is formed is from about 950° C. to about 1150° C.; and forming a III-nitride material region over the first AlN region and over the second AlN region.

The semiconductor structure comprises, according to some embodiments, a substrate comprising silicon and comprising at least a layer having a resistivity of greater than $10^2$ Ohms-cm; a diffusion barrier region comprising a rare-earth oxide and/or a rare-earth nitride located over a surface of the substrate; and a III-nitride material region located over the diffusion barrier region comprising the rare-earth oxide and/or the rare-earth nitride.

The method of forming a semiconductor structure comprises, according to certain embodiments, forming a diffusion barrier region comprising a rare-earth oxide and/or a rare-earth nitride over a substrate comprising silicon, the substrate comprising at least a layer having a resistivity of greater than $10^2$ Ohms-cm; and forming a III-nitride material region over the diffusion barrier region comprising the rare-earth oxide and/or the rare-earth nitride.

In certain embodiments, the semiconductor structure comprises a substrate comprising silicon and comprising at least a layer having a resistivity of greater than $10^2$ Ohms-cm; a diffusion barrier region comprising silicon carbide located over a surface of the substrate; and a III-nitride material region located over the diffusion barrier region comprising silicon carbide.

In some embodiments, the method of forming a semiconductor structure comprises forming a diffusion barrier region comprising silicon carbide over a substrate comprising silicon, the substrate comprising at least a layer having a resistivity of greater than $10^2$ Ohms-cm; and forming a III-nitride material region over the diffusion barrier region comprising silicon carbide.

The semiconductor structure comprises, according to some embodiments, a substrate comprising silicon and comprising at least a layer having a resistivity of greater than $10^2$ Ohms-cm; a diffusion barrier region comprising an elemental diboride located over a surface of the substrate; and a III-nitride material region located over the diffusion barrier region.

In certain embodiments, the method of forming a semiconductor structure comprises forming a diffusion barrier region comprising an elemental diboride over a substrate comprising silicon, the substrate comprising at least a layer having a resistivity of greater than $10^2$ Ohms-cm; and forming a III-nitride material region over the diffusion barrier region.

According to certain embodiments, the semiconductor structure comprises a substrate comprising silicon; a III-nitride material region located over a surface region of the substrate; and an implanted species arranged within the surface region of the substrate in a pattern spatially defined across at least one lateral dimension of the substrate, wherein the implanted species is present within at least a portion of the surface region of the substrate at a concentration of at least about $10^{19}/cm^3$.

The method of forming a semiconductor structure comprises, according to some embodiments, implanting a species into a surface region of a substrate comprising silicon such that the implanted species forms a pattern spatially defined across at least one lateral dimension of the substrate, wherein, during the implanting step, at least a portion of the species is implanted through a III-nitride material region, and after the implanting step, the implanted species is present within at least a portion of the surface region of the substrate at a concentration of at least about $10^{19}/cm^3$.

According to some embodiments, the semiconductor structure comprises a substrate comprising silicon; a III-nitride material region located over a surface region of the substrate; a first implanted species arranged within the surface region of the substrate in a first pattern spatially defined across at least one lateral dimension of the substrate; and a second implanted species arranged within the III-nitride material region in a second pattern spatially defined across at least one lateral dimension of the substrate.

The method of forming a semiconductor structure comprises, according to some embodiments, implanting a first species and a second species into a semiconductor structure comprising a substrate comprising silicon and a III-nitride material region located over the substrate, wherein the first species is implanted into a surface region of the substrate such that the first species forms a pattern spatially defined across at least one lateral dimension of the substrate; and the second species is implanted into the III-nitride material region such that the second species forms a pattern spatially defined across at least one lateral dimension of the III-nitride material region.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Figure 1A:
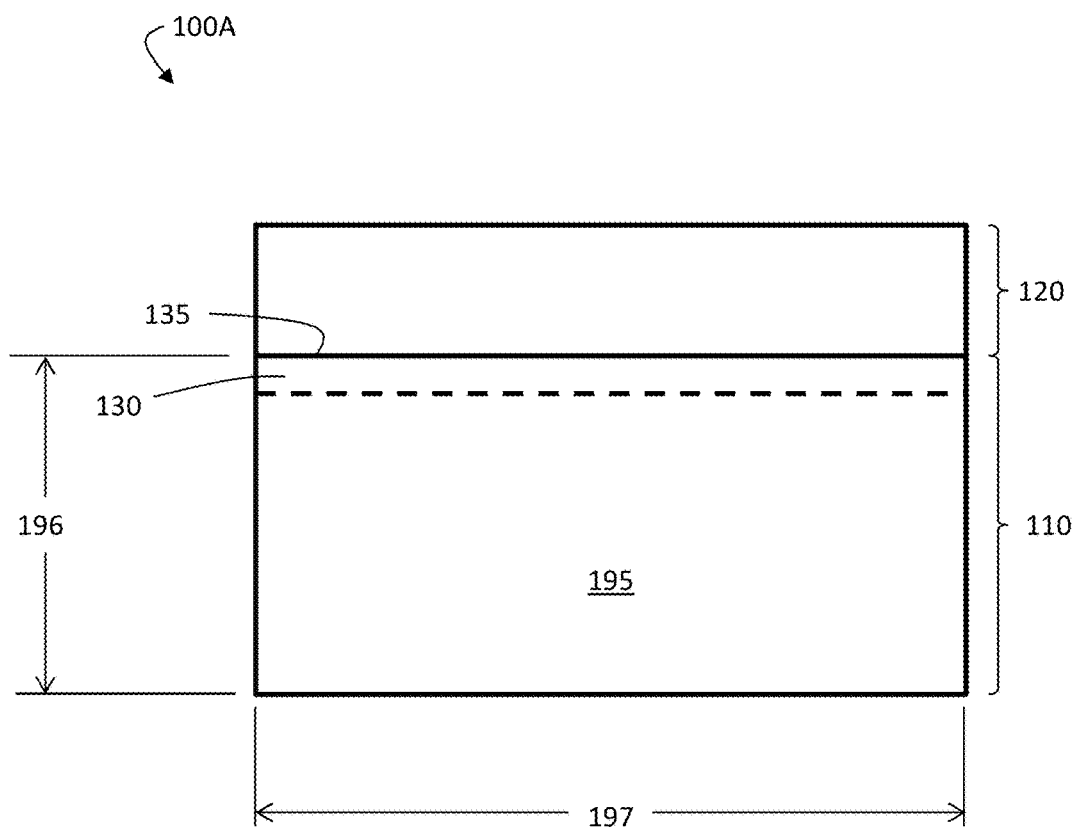
FIG. 1A is a cross-sectional schematic illustration of a semiconductor structure, according to certain embodiments.

III-nitride materials are generally described herein, including material structures comprising III-nitride material regions and silicon-containing substrates. Certain embodiments are related to gallium nitride materials, and material structures comprising gallium nitride material regions and silicon-containing substrates.

Some embodiments are related to mitigating the effect of parasitic channels (also sometimes referred to as parasitic conducting channels) present within semiconductor structures and/or inhibiting or preventing the formation of parasitic channels within semiconductor structures. Parasitic channels can arise when growing III-nitride materials (e.g., gallium nitride materials) on substrates comprising silicon, and particularly on substrates comprising silicon that are highly resistive (e.g., having an electrical resistivity of greater than or equal to about $10^2$ Ohm-cm). It is believed that the parasitic channel is formed by the diffusion of dopants that are unintentionally introduced into the substrate prior to, or during, the growth of layers/regions (e.g., III-nitride material region) on the substrate. As described further below, the dopants may include the elements (e.g., Group III element(s) and/or nitrogen) from the reactive species which participate in the reaction that forms the III-nitride material region. For example, the dopants may be gallium and/or aluminum; though, it should be understood that other dopants may also contribute to forming the parasitic channel. Once diffused into the substrate, the dopants can generate free carriers (i.e., electrons or holes) which, in effect, form a conductive channel at or near the substrate surface.

Parasitic channels are typically formed in a surface region (e.g., at or near a surface of the substrate over which the III-nitride material is grown also referred to herein as the "top" surface of the substrate). A "surface region" of a substrate can include an external surface of a substrate and a portion of the substrate underneath and close to the external surface. In some embodiments, the surface region of a substrate extends to a depth of about 5 microns, to a depth of about 2 microns, to a depth of about 1 micron, to a depth of about 500 nm, or to a depth of about 200 nm, or less. The "top surface region" is the surface region associated with the top surface of a substrate. In any instances in which a surface region of a substrate is recited herein, the surface region may correspond to the top surface region of the substrate. According to certain embodiments, the surface region of the substrate is all or part of a silicon layer.

According to certain embodiments, semiconductor structures comprising a parasitic channel (e.g., a high-conductivity parasitic channel) can be processed such that the adverse impact of an existing parasitic channel is reduced or eliminated. The adverse impact of an existing parasitic channel can be reduced or eliminated, for example, by reducing the free carrier concentration in the parasitic channel. In some such embodiments, parasitic losses and/or capacitive coupling associated with undesired conduction through the parasitic channel are reduced or minimized. In some embodiments, one or more species can be implanted into a semiconductor structure such that the electronic conductivity of the high-conductivity parasitic channel within the semiconductor structure is reduced (e.g., such that it becomes a low-conductivity parasitic channel or such that the parasitic channel is eliminated). Reduction of the conductivity of the high-conductivity parasitic channel may be achieved, for example, by implanting a species (e.g., a small-atom species) that disrupts the structure of the high-conductivity parasitic channel. For example, the implanted species may disrupt the crystalline lattice structure of the substrate and/or the high-conductivity parasitic channel. The disruption of the crystalline lattice structure of the substrate and/or the high-conductivity parasitic channel may reduce the ability of the dopants to contribute to conduction (e.g., by reducing the mobility of the dopants). Reduction of the conductivity of the parasitic channel can also be achieved, for example, by implanting one or more counter dopants into the semiconductor structure such that the concentration profile of the counter dopant substantially matches the concentration profile of the dopant within the high-conductivity parasitic channel. In this way, the contribution of the original dopant to the electronic conductivity of the high-conductivity parasitic channel can be at least partially negated by the counter dopant.

Some embodiments relate to methods (and associated structures) that can be used to inhibit or prevent the diffusion of material that increases the conductivity of the substrate, which can lead to the formation of high-conductivity parasitic channels. For example, in some embodiments, one or more species capable of reacting with a species external to the semiconductor structure are located within a substrate of the semiconductor structure, and a III-nitride material region is formed over the substrate. During the formation of the III-nitride material region, the reactive species within the substrate can react with a diffusing Group III element(s), nitrogen, or other species originating from outside the semiconductor structure, which can, according to certain embodiments, inhibit or prevent the formation of a high-conductivity parasitic channel. The diffusion of material can also be inhibited or prevented, for example, via the use of one or more layers positioned between the III-nitride material region and the substrate. The one or more layers positioned between the III-nitride material region and the substrate may act, in some embodiments, as a diffusion barrier. According to certain embodiments, careful selection of an appropriate diffusion barrier material is considered, to allow for heteroepitaxial formation of high quality gallium nitride material and/or gallium nitride material microelectronic and/or optoelectronic device layers.

As described further below, mitigating the effects of parasitic channels can be desirable because parasitic channels can be particularly significant in leading to parasitic losses in semiconductor structures, including semiconductor structures formed on highly resistive substrates (e.g., highly resistive silicon substrates). The parasitic channels can provide a mechanism for undesired energy absorption within the structure. When processing methods are used to mitigate the effects of parasitic channels present in semiconductor structures and/or to inhibit or prevent the formation of such parasitic channels, the parasitic losses in the resulting semiconductor structures may be significantly reduced which can result in performance improvements. As one non-limiting example, certain devices (such as High Electron Mobility Transistors (HEMTs) and RF devices) formed of certain structures described herein may have higher output power, power gain, and/or efficiency, (even at higher operating frequencies), amongst other advantages. In yet another non-limiting example, certain power switching devices may exhibit a lower Rds(on) shift and/or degradation.

Certain embodiments are related to inventive semiconductor structures. Certain inventive semiconductor structures can comprise a substrate (e.g., a substrate comprising silicon) and a III-nitride material region located over a surface region of the substrate. FIG. 1A is a cross-sectional schematic illustration of a semiconductor structure 100A, according to certain embodiments. Semiconductor structure 100A comprises substrate 110 and a III-nitride material region 120 located over surface 135 of substrate 110 (and, thus, over surface region 130 of substrate 110). According to certain embodiments, surface 135 of substrate 110 can be a silicon surface. For example, surface 135 may correspond to a surface of a bulk silicon wafer, in some embodiments. In certain embodiments, the top surface (e.g., surface 135 in the figures) may correspond to a silicon surface of a composite substrate (e.g., comprising a silicon layer and one or more additional underlying layers). For example, in some embodiments, surface 135 may correspond to a surface of a silicon portion of a silicon-on-insulator substrate, surface 135 may correspond to a surface of a silicon-on-sapphire substrate, or surface 135 may correspond to a silicon surface of a separation by implantation of oxygen (SIMOX) substrate.

According to certain embodiments, the substrates of the semiconductor structures described herein comprise silicon (i.e., a substrate containing the element silicon in any form). Examples of substrates comprising silicon that can be used in various embodiments include, but are not limited to, silicon carbide substrates, bulk silicon wafers, and silicon on insulator substrates. In some embodiments, the substrate comprises a silicon substrate. As used herein, a silicon substrate refers to any substrate that includes a silicon surface. Examples of suitable silicon substrates include substrates that are composed entirely of silicon (e.g., bulk silicon wafers), silicon-on-insulator (SOI) substrates, silicon-on-sapphire substrate (SOS), and separation by implantation of oxygen (SIMOX) substrates, amongst others. Suitable silicon substrates also include composite substrates that have a silicon wafer bonded to another material such as diamond or other crystallographic forms of carbon, aluminum nitride (AlN), silicon carbide (SiC), or other crystalline or polycrystalline materials. Silicon substrates having different crystallographic orientations may be used, though single crystal silicon substrates may be preferred in certain, but not necessarily all, embodiments. In some embodiments, silicon (111) substrates are used. In certain embodiments, silicon (100) or (110) substrates are used.

As used herein, a silicon carbide substrate refers to any substrate that includes a silicon carbide surface. Examples of suitable silicon carbide substrates include substrates that are composed entirely of silicon carbide (e.g., bulk silicon carbide wafers), silicon carbide composite wafers (e.g., wafers comprising a silicon carbide layer and a second layer of a material that is not silicon carbide), and the like.

In certain embodiments, the substrate may have various device layers, homojunctions, heterojunctions, or circuit layers embedded in the substrate, or formed on the front-side or back-side of the substrate. Such substrates may be semi-spec standard thickness, or thicker, or in some implementations thinner than semi-spec standards. In some cases, for example, the Si substrate may have a diameter of less than one hundred millimeters (100 mm), while in other implementations, the substrate may have a diameter in a range from approximately 100 mm to approximately 150 mm. In certain embodiments, the substrate diameter may be in a range from approximately 150 mm to approximately 200 mm, or larger. In still other embodiments, the substrate may include a textured surface or may have a non-planar surface. The substrate may also have any of a variety of suitable thicknesses. For example, in some embodiments, the substrate has a thickness greater than or equal to about 250 micrometers, greater than or equal to about 500 micrometers, greater than or equal to about 625 micrometers, greater than or equal to about 675, greater than or equal to about 1 mm, or thicker (e.g., having a thickness of up to about 2 mm, up to about 3 mm, up to about 5 mm, up to about 10 mm, or thicker). In some embodiments, the substrate has a thickness of less than about 10 mm, less than about 5 mm, less than about 3 mm, less than about 2 mm, less than about 1 mm, less than about 500 microns, less than about 200 microns, less than about 150 microns, less than about 100 microns, less than about 50 microns, or less. According to certain embodiments, the thickness of the substrate may be selected based on the final device and heteroepitaxial specifications (e.g., wafer warp and bow), for example, as needed for successful high yielding semiconductor fabrication.

In some embodiments, the substrate comprises at least a layer having a high resistivity. For example, in certain embodiments in which silicon substrates are used, the silicon substrate (or at least the silicon portion of the substrate for substrates that include a silicon portion formed on another material) is highly resistive. According to certain embodiments, the substrate comprises at least a layer having a resistivity of greater than or equal to about $10^2$ Ohms-cm (or greater than or equal to about $10^4$ Ohms-cm, or greater than or equal to about $10^5$ Ohms-cm). For example, in certain embodiments in which silicon substrates are used, the resistivity of the silicon substrate (or the silicon portion of the substrate) may be greater than or equal to about $10^2$ Ohms-cm (or greater than or equal to about $10^4$ Ohms-cm, or greater than or equal to about $10^5$ Ohms-cm). In certain embodiments, the resistivity of the surface region of the substrate may be greater than or equal to about $10^2$ Ohms-cm (or greater than or equal to about $10^4$ Ohms-cm, or greater than or equal to about $10^5$ Ohms-cm). Highly resistive substrates comprising silicon (e.g., silicon substrates or other substrates comprising silicon) may be particularly useful in some (but not necessarily all) structures that are used to form devices that operate at high frequencies (e.g., RF devices). According to certain embodiments, the high resistivity can reduce so-called substrate losses which otherwise may arise and sacrifice performance. These substrate losses may render substrates comprising silicon with lower resistivities unsuitable in high frequency devices.

It has been observed that parasitic channels generally have a significantly greater effect in structures that include highly resistive substrates comprising silicon as compared to structures that include substrates having more conventional resistivities (e.g., 0.01-0.1 Ohms-cm). Because substrates comprising silicon having more conventional resistivities typically have bulk free carrier concentrations on the order of $10^{18}/cm^3$, the dopant diffusion phenomena described above may not substantially, or even at all, change the free carrier concentration at the substrate surface. Thus, a parasitic channel may not be generated in such substrates. In contrast, the dopant diffusion phenomena can have a significant effect on the free carrier concentration at the surface region in substrates having high resistivities which typically have bulk free carrier concentrations on the order of $10^{14}/cm^3$ or lower. For these reasons, it is generally more critical to reduce the effects of the parasitic channel in structures that include highly resistive substrates comprising silicon.

As used herein, the term "III-nitride material" refers to any Group III element-nitride compound. Non-limiting examples of III-nitride materials include boron nitride (BN), aluminum nitride (AlN), gallium nitride (GaN), indium nitride (InN), and thallium nitride (TlN), as well as any alloys including Group III elements and Group V elements (e.g., $Al_xGa_{(1-x)}N$, $Al_xIn_yGa_{(1-x-y)}N$, $In_yGa_{(1-y)}N$, $Al_xIn_{(1-x)}N$, $GaAs_aP_bN_{(1-a-b)}$, $Al_xIn_yGa_{(1-x-y)}As_aP_bN_{(1-a-b)}$, and the like). Typically, when present, arsenic and/or phosphorus are at low concentrations (e.g., less than 5 weight percent). III-nitride materials may be doped n-type or p-type, or may be intrinsic. III-nitride materials may have any polarity including but not limited to Ga-polar, N-polar, semi-polar, or non-polar crystal orientations. A III-nitride material may also include either the Wurtzite, Zincblende, or mixed polytypes, and may include monocrystalline, polycrystalline, or amorphous structures.

In some embodiments, the III-nitride material region comprises a gallium nitride material, as described further below. As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphoride nitride ($GaAs_aP_bN_{(1-a-b)}$), aluminum indium gallium arsenide phosphoride nitride ($Al_xIn_yGa_{(1-x-y)}As_aP_bN_{(1-a-b)}$), amongst others. Typically, when present, arsenic and/or phosphorus are at low concentrations (i.e., less than 5 weight percent). In certain embodiments, the gallium nitride material has a high concentration of gallium and includes little or no amounts of aluminum and/or indium. In high gallium concentration embodiments, the sum of (x+y) may be less than 0.4, less than 0.2, less than 0.1, or even less. In some cases, it is preferable for the gallium nitride material layer to have a composition of GaN (i.e., x+y=0). Gallium nitride materials may be doped n-type or p-type, or may be intrinsic.

When a structure (e.g., layer and/or device) is referred to as being "on," "over," or "overlying" another structure (e.g., layer or substrate), it can be directly on the structure, or an intervening structure (e.g., a layer, air gap) also may be present. A structure that is "directly on" or "in direct contact with" another structure means that no intervening structure is present. It should also be understood that when a structure is referred to as being "on" or "over" another structure, it may cover the entire structure, or a portion of the structure.

Figure 1B:
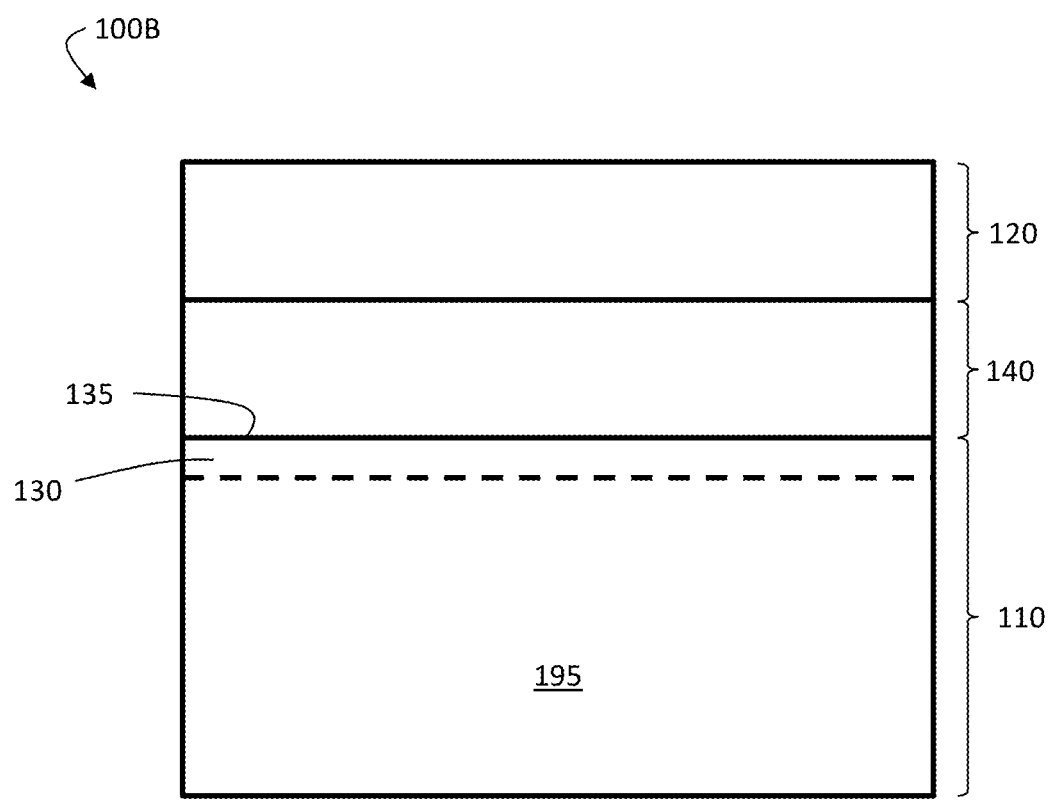
FIG. 1B is a cross-sectional schematic illustration of a semiconductor structure comprising an optional diffusion barrier region, according to certain embodiments.

In certain embodiments, the substrate and the III-nitride material region can be in direct contact, as illustrated in FIG. 1A. In some such embodiments, a silicon portion of the substrate and the III-nitride material region are in direct contact. Inventive semiconductor structures are not limited to arrangements in which the substrate and the III-nitride material region are in direct contact, and in some embodiments, one or more regions may be positioned between the substrate and the III-nitride material region. For example, in some embodiments, a diffusion barrier region is positioned between the substrate and the III-nitride material region. FIG. 1B is a cross-sectional schematic illustration of a semiconductor structure 100B, according to certain embodiments. In FIG. 1B, semiconductor structure 100B comprises optional diffusion barrier region 140 positioned between substrate 110 and III-nitride material region 120.

In some embodiments in which the diffusion barrier region is present, the diffusion barrier region is in direct contact with the substrate (e.g., a silicon surface of the substrate). For example, in the illustrative embodiment shown in FIG. 1B, diffusion barrier region 140 is in direct contact with substrate 110. In other embodiments, one or more layers may be positioned between the diffusion barrier region and the substrate (e.g., between the diffusion barrier region and a silicon surface of the substrate).

In certain embodiments, the diffusion barrier region is in direct contact with the III-nitride material region. For example, in the illustrative embodiment shown in FIG. 1B, diffusion barrier region 140 is in direct contact with III-nitride material region 120. In other embodiments, one or more layers may be positioned between the diffusion barrier region and the III-nitride material region.

In some embodiments, the diffusion barrier region may be formed prior to the introduction into the reaction chamber of reactive species (e.g., Al, Ga species) that react to form the III-nitride material region. In some such embodiments, the diffusion barrier region limits, or prevents, dopant accumulation on the substrate surface, amongst other functions. Because the dopant concentration accumulated on the substrate surface is reduced, dopant diffusion into the substrate is also decreased, which can result in the parasitic conducting channel (e.g., within the surface region of the substrate) having a lower conductivity. It should be understood, however, that in some cases, some dopant diffusion may occur through the diffusion barrier region and into the substrate.

The diffusion barrier region may be formed of a number of materials, as described in more detail below. In some embodiments, the diffusion barrier region has an amorphous (i.e., non-crystalline) crystal structure. In some embodiments, the diffusion barrier region may have a single crystal or poly-crystalline structure.

In some embodiments, the diffusion barrier region may be very thin. For example, according to certain embodiments, the diffusion barrier region has a thickness of less than about 500 nm, less than about 200 nm, less than about 100 nm, less than about 50 nm, less than about 20 nm, or less than about 10 nm (and/or, in some embodiments, as thin as 5 nm, as thin as 1 nm, or thinner). Thicker diffusion barrier regions could also be used. For example, in some embodiments, the diffusion barrier region has a thickness of less than about 5 microns, less than about 4 microns, less than about 3 microns, less than about 2 microns, or less than about 1 micron. In some embodiments, the diffusion barrier region has a thickness of at least about 10 nm or at least about 100 nm.

In some, but not necessarily all, embodiments, it may be beneficial to employ a very thin diffusion barrier region when the diffusion barrier region is amorphous. Not wishing to be bound by any particular theory, very thin layers formed directly on the substrate may absorb strain associated with lattice and thermal expansion differences between the substrate and overlying layers/regions (e.g., III-nitride material region). This absorption of strain may reduce generation of misfit dislocations (and other types of defects) and limit/prevent crack generation in the overlying layers/regions. In certain although not necessarily all embodiments, it may be beneficial to use a thin diffusion barrier if the diffusion barrier is made of a poor thermal conductor. In some such cases, using a thin diffusion barrier layer can minimize the adverse effect on thermal conduction of the final III-nitride material-based device.

In the embodiment illustrated in FIG. 1B, diffusion barrier region 140 covers substantially the entire top surface 135 of substrate 110. This arrangement may be preferable, in certain but not necessarily all embodiments, for example, to minimize dopant diffusion and the generation of dislocations in overlying regions. In other embodiments, the diffusion barrier region does not completely cover the top surface of the substrate. In some embodiments, the layer may cover a majority of the top surface of the substrate (e.g., greater than about 50 percent or greater than about 75 percent of the top surface area).

Figure 1C:
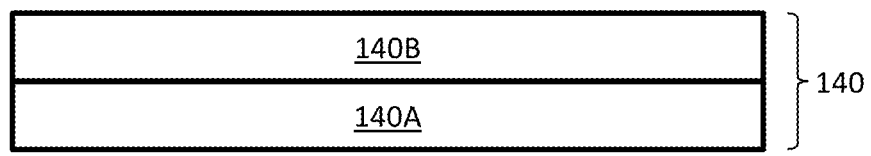
FIG. 1C is, according to some embodiments, a cross-sectional schematic illustration of a multi-layered diffusion barrier region.

It should be understood that the term "region" may refer to one layer or may refer to multiple layers. As one non-limiting example, the diffusion barrier region may be made of a single layer or it may comprise a plurality of layers. FIG. 1C is a cross-sectional schematic illustration of a diffusion barrier region 140 comprising multiple layers 140A and 140B. In one set of embodiments, layers 140A and 140B correspond to a high-temperature AlN layer and a low-temperature AlN layer, as described in more detail below. Multi-layer diffusion barrier region 140 illustrated in FIG. 1C can be used in association with any of the embodiments described herein. Alternatively, as noted above, the diffusion barrier regions described herein may be single-layer structures.

Figure 1D:
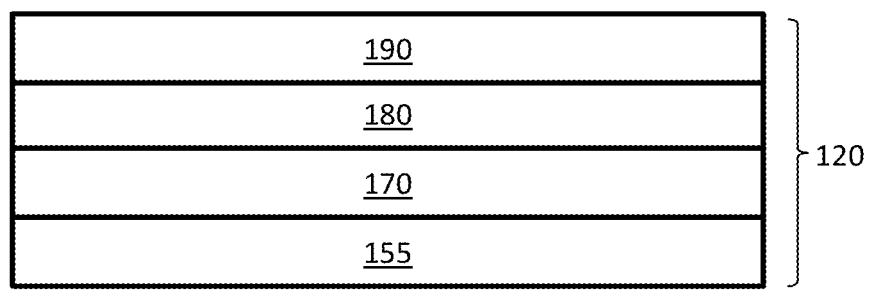
FIG. 1D is a cross-sectional schematic illustration of a multi-layered III-nitride material region, according to some embodiments.

Similarly, the III-nitride material region may be made of a single layer or it may comprise a plurality of layers. In some cases, the III-nitride material region may also comprise a non-III-nitride material layer or feature. FIG. 1D is a cross-sectional schematic illustration of a III-nitride material region 120 comprising multiple layers. Multi-layer III-nitride material region 120 illustrated in FIG. 1D can be used in association with any of the embodiments described herein. Alternatively, as noted above, the III-nitride material regions described herein may be single-layer structures.

In certain embodiments, the III-nitride material region comprises an optional III-nitride material nucleation layer. For example, referring to the exemplary embodiment of FIG. 1D, III-nitride material region 120 comprises III-nitride material nucleation layer 155. It should be understood that nucleation layer 155 is optional, and in other embodiments, III-nitride material region 120 does not include nucleation layer 155.

The nucleation layer can, according to certain embodiments, prepare a surface of the substrate for growth of III-nitride material over the substrate. In certain cases, III-nitride material (e.g., gallium nitride materials and/or other III-nitride materials) can be difficult to grow heteroepitaxially directly on the substrate (and/or another region that is over a surface of the substrate), for example, because the III-nitride material one wishes to grow may have a lattice structure and/or a lattice constant which is significantly different than the substrate or other underlying region. According to certain embodiments, the nucleation layer forms an appropriate template to transition from the lattice of the substrate (or other underlying layer) to a template more suitable for III-nitride growth. In certain embodiments, the nucleation layer can accommodate the difference in the lattice constants of an overlying layer in the III-nitride material region (e.g., the III-nitride material region portion in direct contact with the nucleation layer) and the region underneath the nucleation layer (e.g., the substrate and/or another underlying region, which in some cases, may be in direct contact with the nucleation layer). In some embodiments, the nucleation layer can accommodate the difference in the thermal expansion coefficients of an overlying layer in the III-nitride material region (e.g., the III-nitride material region portion in direct contact with the nucleation layer) and the region underneath the nucleation layer (e.g., the substrate and/or another underlying region, which in some cases, may be in direct contact with the nucleation layer). According to certain embodiments, the nucleation layer can accommodate both the difference in lattice constants and the difference in thermal expansion coefficients of an overlying layer in the III-nitride material region and the region underneath the nucleation layer.

According to certain embodiments, the nucleation layer comprises an aluminum nitride material. As used herein, the phrase "aluminum nitride material" refers to aluminum nitride (AlN) and any of its alloys, such as aluminum gallium nitride ($Al_{(1-x)}Ga_{(x)}N$), aluminum indium nitride ($Al_{(1-x)}In_{(x)}N$), aluminum indium gallium nitride ($Al_{(1-x-y)}In_{(x)}Ga_{(y)}N$), aluminum indium gallium arsenide phosphoride nitride ($Al_{(1-x-y)}In_xGa_yAs_aP_bN_{(1-a-b)}$), amongst others. In certain embodiments, the aluminum nitride material has a high concentration of aluminum and includes little or no amounts of gallium and/or indium. In high aluminum concentration embodiments, the sum of (x+y) may be less than 0.4, less than 0.2, less than 0.1, or even less. In some cases, it is preferable for the aluminum nitride material to have a composition of AlN (i.e., x+y=0). Aluminum nitride materials may be doped n-type or p-type, or may be intrinsic. In certain embodiments, the use of an aluminum nitride material as the nucleation layer may be preferred in certain cases in which the III-nitride material is formed on the substrate without the use of a diffusion barrier region between the III-nitride material and the substrate. In certain embodiments, it may be preferred to forego the use of a nucleation layer if a diffusion barrier region between the substrate and the III-nitride material region is employed that comprises a lattice type and/or a lattice constant that is more suitable or favorable for the growth of the III-nitride material region. Non-limiting examples of such diffusion barrier regions include, but are not limited to, aluminum nitride diffusion barrier regions, rare-earth oxide and/or rare-earth nitride diffusion barrier regions, silicon carbide diffusion barrier regions, and elemental diboride diffusion barrier regions, examples of which are described in more detail below.

According to certain embodiments, the nucleation layer may comprise one or more layers. When multiple nucleation layers are present, the nucleation layers may be made of the same material or different materials. In addition, in certain embodiments in which multiple nucleation layers are present, the nucleation layers may be formed using different semiconductor growth conditions. For example, in some embodiments, the nucleation layers may comprise two or more aluminum nitride material layers formed at different growth temperatures (e.g., one at a relatively low temperature and another at a relatively high temperature). In some embodiments, other growth conditions (e.g., pressure, reactant flow rates, etc.) may be varied from the growth of one nucleation layer to another.

Suitable materials from which the III-nitride material nucleation layer may be formed include, but are not limited to, aluminum nitride materials (e.g., aluminum nitride, aluminum nitride alloys) and gallium nitride materials. The III-nitride material nucleation layer typically has a constant composition.

In some embodiments, the nucleation layer comprises a first aluminum nitride-based layer and a second aluminum nitride-based layer. The aluminum nitride-based nucleation layer can include aluminum nitride as well as other optional elements, such as silicon and/or oxygen. For example, in some embodiments, the aluminum nitride-based nucleation layer can be a thin (e.g., from about 10 Angstroms to about 20 Angstroms, or thinner) amorphous or non-crystalline (unordered) material comprising aluminum and nitrogen, and optionally silicon and/or oxygen. In some embodiments, the amorphous aluminum nitride-based layer may also act as a diffusion barrier region as discussed further below. In other embodiments, one or more separate diffusion barrier layers can be used in combination with the aluminum-nitride based layer.

In certain embodiments, a III-nitride material nucleation layer has a single crystal structure. It may be advantageous, in some but not necessarily all embodiments, for a III-nitride material nucleation layer to have a single crystal structure because such structures can facilitate formation of one or more single crystal layers (e.g., gallium nitride material layers) above the III-nitride material nucleation layer.

It should also be understood that a III-nitride material nucleation layer may not have a single crystal structure and may be amorphous or polycrystalline, though certain of the advantages associated with the single crystal nucleation layers may not be achieved in some such embodiments.

The III-nitride material nucleation layer may have any suitable thickness. For example, the III-nitride material nucleation layer may have a thickness of between about 10 nanometers and about 5 microns, though other thicknesses are also possible. In certain embodiments in which more than one nucleation layer is employed, the combined thickness of the nucleation layers may be between about 10 nanometers and about 5 microns, though other thicknesses are also possible.

In certain embodiments, the III-nitride material region comprises an optional III-nitride material transition layer. For example, referring to the exemplary embodiment of FIG. 1D, III-nitride material region 120 comprises III-nitride material transition layer 170. It should be understood that transition layer 170 is optional, and in other embodiments, III-nitride material region 120 does not include transition layer 170.

In FIG. 1D, transition layer 170 is formed directly on nucleation layer 155. In other embodiments, one or more materials may be positioned between transition layer 170 and nucleation layer 155.

In some embodiments, the III-nitride material transition layer comprises a compositionally graded III-nitride material. Examples of such materials are described, for example, in U.S. Pat. No. 6,649,287, issued Nov. 18, 2003, and entitled "Gallium Nitride Materials and Methods," which is incorporated herein by reference in its entirety for all purposes. Compositionally-graded transition layers have a composition that is varied across at least a portion of the layer (e.g., across at least a portion of the thickness of the layer). For example, according to certain embodiments in which the transition layer comprises a III-nitride material layer, the concentration of at least one of the elements (e.g., Ga, Al, In) of the III-nitride material is varied across at least a portion of the thickness of the transition layer. Compositionally-graded transition layers are particularly effective, according to certain embodiments, in reducing crack formation in gallium nitride material regions formed on the transition layer, for example, by lowering thermal stresses that result from differences in thermal expansion rates between the gallium nitride material and the substrate (e.g., silicon). Compositionally-graded transition layers may also contribute to reducing generation of screw dislocations in the III-nitride material layer(s)/region(s) (e.g., gallium nitride material layer(s)). In some cases, the compositionally-graded transition layers may also contribute to reducing mixed and edge dislocation densities.

The composition of a compositionally-graded III-nitride material layer can be graded, for example, discontinuously (e.g., step-wise) or continuously. The composition of the compositionally-graded layer can be graded across the entire thickness of the layer, or across only a portion of the thickness of the layer.

According to one set of embodiments, the transition layer is compositionally-graded and formed of an alloy of gallium nitride such as $Al_xIn_yGa_{(1-x-y)}N$, $Al_xGa_{(1-x)}N$, and $In_yGa_{(1-y)}N$. In some such embodiments, the concentration of at least one of the elements (e.g., Ga, Al, In) of the alloy is varied across at least a portion of the thickness of the transition layer. In certain embodiments in which the transition layer has an $Al_xIn_yGa_{(1-x-y)}N$ composition, x and/or y may be varied. In certain embodiments in which the transition layer has a $Al_xGa_{(1-x)}N$ composition, x may be varied. In certain embodiments in which the transition layer has a $In_yGa_{(1-y)}N$ composition, y may be varied.

In certain embodiments, it is desirable for the transition layer to have a low gallium concentration at a back surface which is graded to a high gallium concentration at a front surface. It has been found that such transition layers can be particularly effective in relieving internal stresses within overlying gallium nitride material layers. For example, the transition layer may have a composition of $Al_xGa_{(1-x)}N$, where x is decreased from the back surface to the front surface of the transition layer (e.g., x is decreased from a value of 1 at the back surface of the transition layer to a value of 0 at the front surface of the transition layer).

In some embodiments, the semiconductor structure includes an aluminum nitride nucleation layer and a compositionally-graded transition layer. In some embodiments, the compositionally-graded transition layer has a composition of $Al_xGa_{(1-x)}N$, where x is continuously graded from a value of 1 at the back surface of the transition layer to a value of 0 at the front surface of the transition layer. One discontinuous grade may include steps of AlN, $Al_{0.6}Ga_{0.4}N$, and $Al_{0.3}Ga_{0.7}N$ (step grades) proceeding in a direction toward the gallium nitride material layer. In another example of a discontinuously graded III-nitride material transition layer, there may be periodic layers and/or intervening layers inserted between one or more of the step layers making up the step grade. The periodic layers and/or intervening layers, for example, may be layers of aluminum nitride material (e.g., AlN or AlGaN) formed at the same or different (e.g., lower) temperatures than are used to form the step grade layers. Another example of periodic layers or intervening layers include silicon nitride and/or aluminum silicon nitride layers, which can act as masking layers to pin the vertical threading and screw dislocations which may extend from one layer to the next.

It should be understood that, in other cases, the transition layer may have a constant composition and may not be compositionally-graded. In some cases (e.g., in certain cases in which the substrate is not a silicon substrate and/or in certain cases in which a diffusion barrier layer is positioned between the substrate and the III-nitride material region), the transition layer may have a constant composition. Suitable compositions include, but are not limited to, aluminum nitride-based materials (e.g., aluminum nitride, aluminum nitride alloys) and gallium nitride materials. In these constant composition embodiments, the transition layer may be similar to the nucleation layer described above. In certain embodiments which utilize a diffusion barrier, the constant composition of the III-nitride transition layer may have a lattice constant that approximates the lattice constant of the diffusion barrier.

According to certain embodiments, the transition layer may be made of, at least in part, one or more superlattices (including strained layer superlattices (SLS) or multiple quantum wells (MQW)) and/or a compositionally-graded superlattice or compositionally graded MQW.

In certain embodiments, the III-nitride material region comprises an optional III-nitride material buffer layer. For example, referring to the exemplary embodiment of FIG. 1D, III-nitride material region 120 comprises III-nitride material buffer layer 180. It should be understood that buffer layer 180 is optional, and in other embodiments, III-nitride material region 120 does not include buffer layer 180.

The buffer layer can, according to certain embodiments, provide a surface for the growth of epitaxial III-nitride material above the buffer layer.

According to certain embodiments, the buffer layer comprises an aluminum gallium nitride material. In some such embodiments, the buffer layer comprises $Al_xGa_{(1-x)}N$. In certain embodiments in which the buffer layer comprises $Al_xGa_{(1-x)}N$, x may be less than about 0.2, less than about 0.1, less than about 0.05, or less than about 0.01. In some embodiments, the buffer layer comprises GaN.

The buffer layer may be formed over the transition layer, for example, using any of a number of known growth techniques. For example, according to certain embodiments, the buffer layer may be formed over the transition layer using molecular-beam epitaxy (MBE) or metalorganic vapor phase epitaxy (MOVPE). In certain embodiments (including certain embodiments in which the desired epitaxial material structure will be used in the fabrication of transistors such as field effect transistors (FETs) and/or High Electron Mobility Transistors (HEMTs)), it may be desirable to form a channel layer above the buffer layer. Typically, in some such embodiments, it would then be desirable for the buffer layer bandgap to be greater than or equal to the bandgap of the channel layer. For example, in certain transistor designs using back barriers, the channel layer may comprise gallium nitride while the buffer layer may comprise aluminum gallium nitride. In some such cases, the buffer layer may comprise of a substantially uniform composition of AlGaN with a bandgap larger than the channel layer but smaller than the underlying transition layer alloy composition. In other examples, the buffer layer may itself be a compositionally graded layer which has a larger aluminum composition formed near the transition layer, and a smaller aluminum concentration formed near the channel layer.

In some embodiments, the composition of the channel layer and the buffer layer may be substantially the same. Although the intrinsic material properties of GaN materials can allow for the formation of high performance devices in theory, conventional growth environments of GaN nitride materials typically include impurity sources. For example, carbon impurities resulting from metalorganic precursors may be, in some cases, introduced into the GaN materials grown using MOCVD, also known more generically as organometallic vapor phase epitaxy (OMVPE). The presence of these impurities in the GaN growth environment can cause unintentional doping in or near critical device layers, for example the channel layer. In certain embodiments (e.g., including certain embodiments in which enhancing the standoff voltage is desired), it may be desirable to incorporate impurities into the buffer layer. For example, the addition of impurities such as carbon (C) and iron (Fe) into the buffer layers of gallium nitride based transistors may increase the vertical and lateral breakdown voltage capability and/or reduce the leakage levels of the device. However, addition of certain impurities within close proximity to the channel layer may result in dispersive device performance (e.g., exhibited by high levels of drain and gate lag). As such, in certain embodiments, it may be beneficial to form the buffer layer such that there is a substantially low impurity concentration throughout the thickness of the buffer layer. In certain other embodiments, there may be a graded (continuously or discontinuously) impurity level within the buffer layer, with a higher impurity concentration near the transition layer, and a lower impurity concentration formed nearer to the channel layer. In certain other embodiments, the transition layer(s) may also include one or more impurities. In some such embodiments, the concentration of impurities in the transition layer(s) may be higher than the concentration(s) of the impurities within the buffer layer and/or within the channel layer.

The III-nitride material region comprises, according to certain embodiments, an optional III-nitride material device region. For example, referring to the exemplary embodiment of FIG. 1D, III-nitride material region 120 comprises III-nitride material device region 190. It should be understood that device region 190 is optional, and in other embodiments, III-nitride material region 120 does not include device region 190.

In some embodiments, the III-nitride material region includes at least one gallium nitride material layer. For example, in certain embodiments, the III-nitride material device region comprises at least one gallium nitride material layer. Referring to FIG. 1D, for example, in some embodiments, III-nitride material device region 190 can include at least one gallium nitride material layer. As described further below, oftentimes, the structure includes more than one gallium nitride material layer which form, in part, the active region of the device.

Figure 1E:
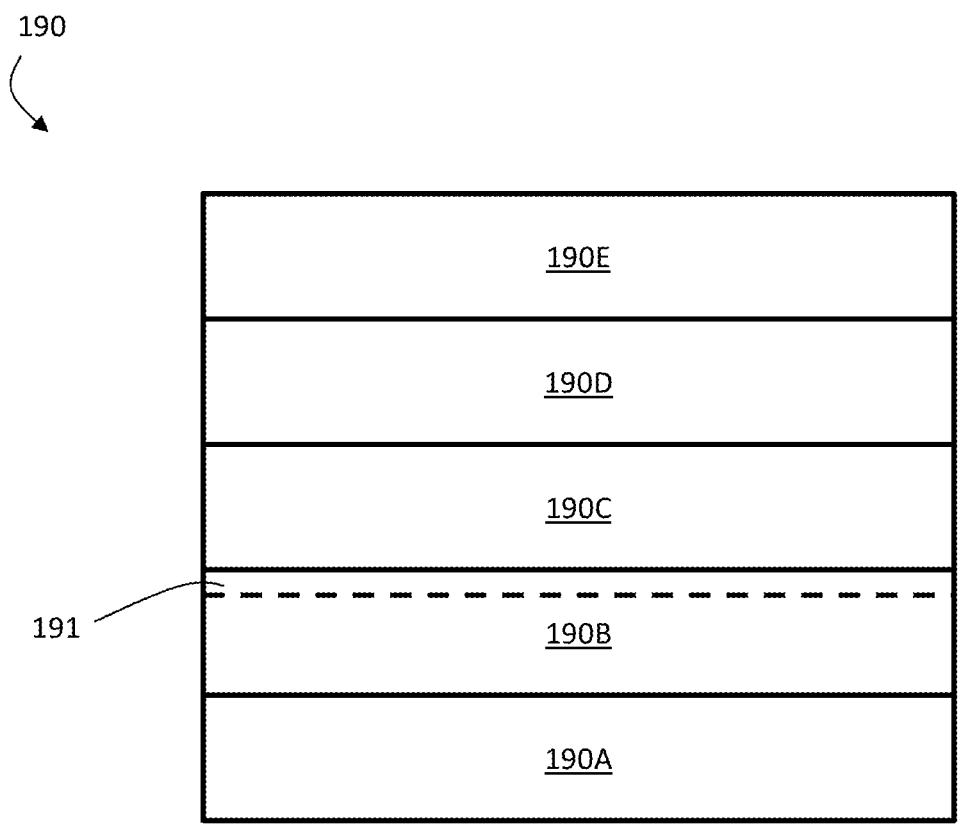
FIG. 1E is a cross-sectional schematic illustration of a multi-layered III-nitride material device region, according to certain embodiments.

As noted above, in some embodiments, the device region comprises one or more III-nitride material layers. FIG. 1E is a cross-sectional schematic illustration of a III-nitride material device region 190, according to certain embodiments. In some embodiments, the III-nitride material device region comprises an optional back barrier layer. According to certain embodiments, when present, the optional back barrier layer is the layer of the III-nitride material region that is the closest to the underlying substrate. For example, in FIG. 1E, exemplary III-nitride material device region 190 comprises optional back barrier layer 190A, which as shown in FIG. 1E, is the closest of the layers within III-nitride material region to substrate 110. When used, the optional back barrier can create a double heterostructure (e.g., due to the bandgap off sets with the buffer layer, such as a GaN buffer layer). This may be desirable, in certain cases, in devices which operate under higher drain bias as they can prevent injection of electrons from the channel layer into the buffer layer, thereby reducing drain leakage and punch through of the device. Additionally, in some cases, the buffer layer may contain higher levels of impurities, intentionally (e.g., iron and carbon used to increase breakdown voltage) or unintentionally (e.g., carbon impurities incorporated into the buffer layer as byproducts from the crystal growth methodologies employed). These impurities and/or other defects may, in certain cases, act as trapping centers and cause deleterious performance results (e.g., memory effects) for the device if electrons from the channel layer penetrate into the underlying buffer layer. Back barrier layers can, in certain cases, help confine the electrons in the channel layer and prevent spill over into the more defective buffer layer and/or other underlying III-nitride layers. In certain embodiments, one or more AlGaN back barrier layers may be used. In certain embodiments, one or more InGaN back barrier layers may be used. In some embodiments, one or more AlInN back barrier layers may be employed. According to certain embodiments, the thickness of the back-barrier (either in the form of a single layer or a combination of layers) is in the range of about 1-300 angstroms.

In some embodiments, the III-nitride material device region comprises an optional channel layer. The channel layer may be positioned, according to certain embodiments, over the back barrier layer when present. For example, in FIG. 1E, exemplary III-nitride material device region 190 comprises optional channel layer 190B, which as shown in FIG. 1E, is positioned over optional back barrier layer 190A. In other embodiments in which the back barrier layer is not present, the channel layer can be the layer within the III-nitride material device region that is closest to the underlying substrate. According to certain embodiments, the channel layer composition is selected with a smaller bandgap than either the spacer and or front-barrier layers (described in more detail below). Such arrangements can create a heterostructure forming a two-dimensional electron gas (2DEG) near the interface between the channel layer and an overlying layer (e.g., the spacer layer and/or the front barrier layer, described in more detail below). Such arrangements may be present, for example, in High Electron Mobility Transistors (HEMTs). Electron flow through HEMTs and HFETs between the source and the drain of the device can, in some instances, be controlled by the gate of the device which acts to interrupt electron current flow between the source and drain. The channel layer can be formed, in certain cases, such that impurities or other point defects (which can act as trapping centers) are kept at a relatively low level, for example, to avoid impeding the mobility of the electrons and/or to avoid adding memory effects to the device. Trapping centers can adversely impact linearity in RF devices and turn-on and turn-off (switching) speeds in power management devices. The thickness of the channel layer can vary, for example, depending on the operational voltage desired for the device. As the drain voltage is increased, the depth of the depletion area between the gate and drain generally increases. In certain cases, if the channel is formed too thin, punch through into the buffer layer can occur, which can result in drain leakage and breakdown of the device.

According to certain embodiments, the III-nitride material device region comprises an optional spacer layer (sometimes also referred to as an interlayer). The spacer layer may be positioned, according to certain embodiments, over the channel layer and/or the back barrier layer when present. For example, in FIG. 1E, exemplary III-nitride material device region 190 comprises optional spacer layer 190C, which as shown in FIG. 1E, is positioned over optional back barrier layer 190A and over optional channel layer 190B. In some embodiments, the interface between the channel layer and the spacer layer can form a 2-dimensional electron gas region (i.e., a "2DEG region"). For example, in FIG. 1E, 2DEG region 191 is located at the interface of spacer layer 190C and channel layer 190B. Typically the spacer layer, when used, is formed with a high aluminum content. In some embodiments, the spacer layer is configured to have a relatively high bandgap offset with the underlying channel layer (e.g., by using a relatively high aluminum content in the spacer layer), which can lead to enhancement of the 2DEG. In certain embodiments, the spacer layer comprises $Al_xGa_{(1-x)}N$. In certain such embodiments, $(1-x)=0.5$ or greater. In some embodiments, the spacer layer comprises AlN. According to certain embodiments, the spacer layer is relatively thin (for example, less than about 50 Angstroms, less than about 20 Angstroms, or less). The use of a relatively thin spacer layer can avoid, in some cases, adversely impacting the ohmic contact resistance of the source and drain to the 2DEG and channel layer of the device.

The III-nitride material device region comprises, in some embodiments, an optional front barrier layer. The front barrier layer may be positioned, according to certain embodiments, over the spacer layer, the channel layer, and/or the back barrier layer when present. For example, in FIG. 1E, exemplary III-nitride material device region 190 comprises optional front barrier layer 190D, which as shown in FIG. 1E, is positioned over optional back barrier layer 190A, over optional channel layer 190B, and over optional spacer layer 190C. According to certain embodiments (and as described above), if the device structure is a HEMT and/or if a 2DEG is desired, the optional front-barrier can be formed over the channel (or spacer, if used) to form a heterojunction The composition of the front-barrier is selected, according to certain embodiments, such that the carrier density and/or sheet charge of the 2DEG is tailored (e.g., optimized) for the device desired. In certain embodiments, the front-barrier layer comprises AlGaN. According to certain embodiments in which an AlGaN-containing front-barrier layer is used, the aluminum concentration of the AlGaN front-barrier is less than about 30 atomic percent (at %), less than about 25 at %, or between about 15 at % and about 20 at %. In certain embodiments, it may be desirable to match or substantially match the lattice constant between the channel and the front-barrier, and to maintain a bandgap offset, for example, to create a 2DEG. In some such cases, an AlInN or InGaN front-barrier layer can be created to provide the bandgap offset and match or substantially match the lattice constants.

According to some embodiments, the III-nitride material device region comprises an optional cap layer. The cap layer may be positioned, according to certain embodiments, over the front barrier layer, the spacer layer, the channel layer, and/or the back barrier layer when present. For example, in FIG. 1E, exemplary III-nitride material device region 190 comprises optional cap layer 190E, which as shown in FIG. 1E, is positioned over optional back barrier layer 190A, over optional channel layer 190B, over optional spacer layer 190C, and over optional front barrier layer 190D. Cap layers have been found useful in optimizing the semiconductor surface of the device structure, according to certain embodiments. For example, in certain cases in which the cap layer(s) comprises GaN, the resulting surface morphology may be smoother and/or include fewer defects, relative to surfaces formed when the cap layer(s) is not present. In addition, in some cases, a more uniform source composition may also be provided (i.e., terminated with gallium atoms rather than a mixture of gallium and aluminum atoms), which may, in some instances, aid in surface chemistry processing of the semiconductor surface and/or reduce the number of surface defects under the gate of the HFET. Such surface defects may, for example, act as shallow trapping centers and compromise the performance of the device, for example, due to increased gate leakage or lateral breakdown of the device, increased dispersion, increased gate and drain lag of the device, amongst other reductions in performance. Additionally, in certain cases, by providing a more consistently terminated semiconductor surface, the repeatability and consistency of the contact resistance may be enhanced, which can lead to higher manufacturing yields. In some embodiments, it may be desired to dope the cap layer(s). In some instances in which the barrier is doped, it may be desirable to use a GaN cap layer which is n-type doped (e.g., using silicon). The use of an n-type doped cap layer may, according to certain embodiments, reduce Idss degradation of the device. In some embodiments, the cap layer(s) may comprise a conductive GaN material layer, for example, used as a conductive field plate.

In certain embodiments, the cap layer(s) may be doped p-type, for example, with magnesium. Such doping may be desirable, for example, in certain cases in which a normally OFF or enhancement mode HFET is being fabricated. As one non-limiting example, by forming a localized p-type GaN region under the gate of the HFET, the 2DEG can be disrupted and the channel depleted such that under no bias, the device is normally off. In some such cases, a positive bias to the gate would then be needed to restore the 2DEG locally under the gate and allow current flow from the source to the drain. It should be noted that one or more layers may be used as the cap layer(s), and that whether a single cap layer or multiple cap layers are employed may depend, for example, on the specifics of the design device structure.

In some embodiments, the cap layer may include an in-situ silicon nitride cap layer and/or passivation layer. Such layer(s) may be used to terminate the III-Nitride structure and/or stabilize the surface of the GaN material.

In some embodiments, the III-nitride material device region comprises at least three device layers. In some embodiments, the first device layer can be the closest of the three layers to the substrate, the second device layer can be an intermediate layer (i.e., between the first device layer and a third device layer), and the third device layer can be the farthest of the three layers from the substrate. In some such embodiments, the first layer can be a channel layer, the second device layer can be a front-barrier layer, and the third device layer can be a cap layer. Referring to FIG. 1E, for example, III-nitride material device region 190 can comprise channel layer 190B, front-barrier layer 190D, and cap layer 190E. In some such embodiments, back-barrier layer 190A and spacer layer 190C are each optional, and one or both may be present or not present. According to some such embodiments, channel layer 190B can be the closest of these three layers (i.e., channel layer 190B, front barrier layer 190D, and cap layer 190E) to the underlying substrate. In certain embodiments, it may be preferable for the second device layer to have an aluminum concentration that is greater than the concentration of aluminum in the first layer and/or the third layer. For example, referring to FIG. 1E, in some embodiments, front-barrier layer 190D can have an aluminum concentration that is greater than the concentration of aluminum in channel layer 190B and cap layer 190E. In some embodiments, the first and second layers (e.g., channel layer 190B and front-barrier layer 190D in FIG. 1E, respectively) can be gallium nitride material layers, and the value of x (as used elsewhere herein with reference to gallium nitride material layers, in subscripts to denote the relative amount of aluminum in a compound (e.g., the "x" in $Al_xGa_{(1-x)}$) in the second gallium nitride material layer may have a value that is between about 0.15 and about 0.3 greater, or between about 0.15 and about 0.75 greater than the value of x in the first gallium nitride material layer. For example, the second device layer may be formed of $Al_{0.26}Ga_{0.74}N$, while the first device layer may be formed of GaN. This difference in aluminum concentration may lead to formation of a highly conductive region at the interface of the second and first device layer (i.e., a 2DEG region). In some embodiments, the first device layer may be formed of GaN.

According to certain embodiments, the III-nitride material device region (e.g., which may comprise at least one gallium nitride material layer) has a low crack level. As described above, the transition layer (particularly when compositionally-graded) and/or the nucleation layer may reduce crack formation. Gallium nitride materials and other III-nitride materials having low crack levels have been described, for example, in U.S. Pat. No. 6,649,287, which is incorporated herein by reference in its entirety for all purposes. In some cases, the III-nitride material device region (e.g., which may comprise at least one gallium nitride material layer) has a crack level of less than 0.005 $\mu m/\mu m^2$. In some embodiments, the III-nitride material device region (e.g., which may comprise at least one gallium nitride material layer) has a very low crack level of less than 0.001 $\mu m/\mu m^2$. In certain cases, it may be preferable for the III-nitride material device region (e.g., which may comprise at least one gallium nitride material layer) to be substantially crack-free as defined by a crack level of less than 0.0001 μm/μm².

In certain cases, the III-nitride material device region (e.g., which may comprise at least one gallium nitride material layer) has a single crystal (i.e., monocrystalline) structure. In some cases, the III-nitride material device region (e.g., which may comprise at least one gallium nitride material layer) includes one or more layers having a Wurtzite (hexagonal) structure.

The thickness of the III-nitride material device region (e.g., which may comprise at least one gallium nitride material layer) and the number of different layers within the III-nitride material device region are dictated, at least in part, on the application in which the structure is used. According to certain embodiments, at a minimum, the total thickness of the III-nitride material device region (or any individual layer within the III-nitride material device region) is sufficient to permit formation of the desired structure or device. The total thickness of the III-nitride material device region is, according to some embodiments, greater than about 0.1 micron, though not always. In some embodiments, the total thickness is greater than about 2.0 microns, or even greater than about 5.0 microns. In some embodiments, the thickness of at least one layer within the III-nitride material device region is greater than about 0.1 micron, greater than about 2.0 microns, or greater than about 5.0 microns.

The optional III-nitride material nucleation layer, the optional III-nitride material transition layer, and the optional III-nitride material buffer layer are not typically (though may be) part of the active region of devices formed from structures of the embodiments described herein. As described above, these layers may be formed to facilitate deposition of the layer(s) of the III-nitride material device region. However, in some cases, the optional III-nitride material nucleation layer, the optional III-nitride material transition layer, and/or the optional III-nitride material buffer layer may have other functions including functioning as a heat spreading layer that helps remove heat from active regions of the semiconductor structure during operation of a device. For example, such transition layers that function as heat spreading layers have been described in U.S. Patent Application Publication No. 2002/0117695, published Aug. 29, 2002, entitled "Gallium Nitride Materials Including Thermally-Conductive Regions," which is incorporated herein by reference in its entirety for all purposes.

Active regions of devices formed from certain of the structures described herein may be formed, in part, in one or more layers of the III-nitride material device region (e.g., gallium nitride material layers). Suitable gallium nitride material layer arrangements have been described, for example, in U.S. Pat. No. 7,071,498, entitled "Gallium Nitride Material Devices Including an Electrode-Defining Layer and Methods of Forming the Same," issued on Jul. 4, 2006, which is incorporated herein by reference in its entirety for all purposes. Other commonly used III-Nitride material device layers include channel layers, spacer layers, barrier layers, capping layers, and P-type layers used under the gate electrodes used for the design of enhancement mode (normally OFF) transistor designs. These III-Nitride material device layers may also include, according to certain embodiments, intentionally doped layers in addition to various III-Nitride layers exhibiting different alloy compositions.

The semiconductor structures described herein may, according to certain embodiments, form the basis of a variety of semiconductor devices. Suitable devices include, but are not limited to, transistors (e.g., FETs), Schottky diodes, as well as light-emitting devices including LEDs and laser diodes. It may be particularly advantageous, according to certain but not necessarily all embodiments, to use structures of the invention in devices that operate at high frequencies. Non-limiting examples of applications using III-nitride devices operating at higher frequencies include power management discretes and integrated circuits used to switch, rectify, monitor, or control electric power from a source to a load (e.g., buck converters, boost converters, half bridges, H-bridges, full bridges, three-phase bridges and multi-phase bridges). Other non-limiting examples of RF applications include discretes and integrated circuits used for wireless and wireline communications, RF energy, RF plasma lighting, wireless charging, RF induction and microwave heating, RF spark-plugs, ISM, medical devices, RADAR, and electronic warfare and countermeasure devices. In certain embodiments, there may be integrated circuits and/or multiple dice on a chip combining both RF devices and switching devices used to monitor, switch, or control the electric power delivery from a source to a load.

According to certain embodiments, the devices have active regions that are typically, at least in part, formed within the III-nitride material region (e.g., in one or more layers of the III-nitride material device region, such as one or more gallium nitride material layers). According to some embodiments, the devices include a variety of other functional layers and/or features (e.g., electrodes, dielectric layers, field plate layers, etc.).

According to certain embodiments, the semiconductor structure comprises a transistor (e.g., a field effect transistor (FET)). The transistor can comprise, according to certain embodiments, a source electrode and a drain electrode. The source electrode and the drain electrode can be electronically isolated from each other. For example, in some embodiments, the source electrode and the drain electrode are spatially separated by a dielectric material. In some embodiments, the transistor further comprises a gate electrode. The gate electrode may be a Schottky gate or an insulated gate electrode. According to certain embodiments, during use, application of a voltage at the gate electrode can create and/or modify an electric field at least partially positioned between the source electrode and the drain electrode, such that electrons are transferred from the source electrode to the drain electrode. Suitable transistors (e.g., FETs) that may be used in association with certain of the embodiments described herein include depletion mode (normally-ON) transistors and enhancement mode (normally OFF) transistors. A transistor can be associated with any of the semiconductor structures described elsewhere herein, including but not limited to those described with respect to FIGS. 1A-1B.

Figure 2A:
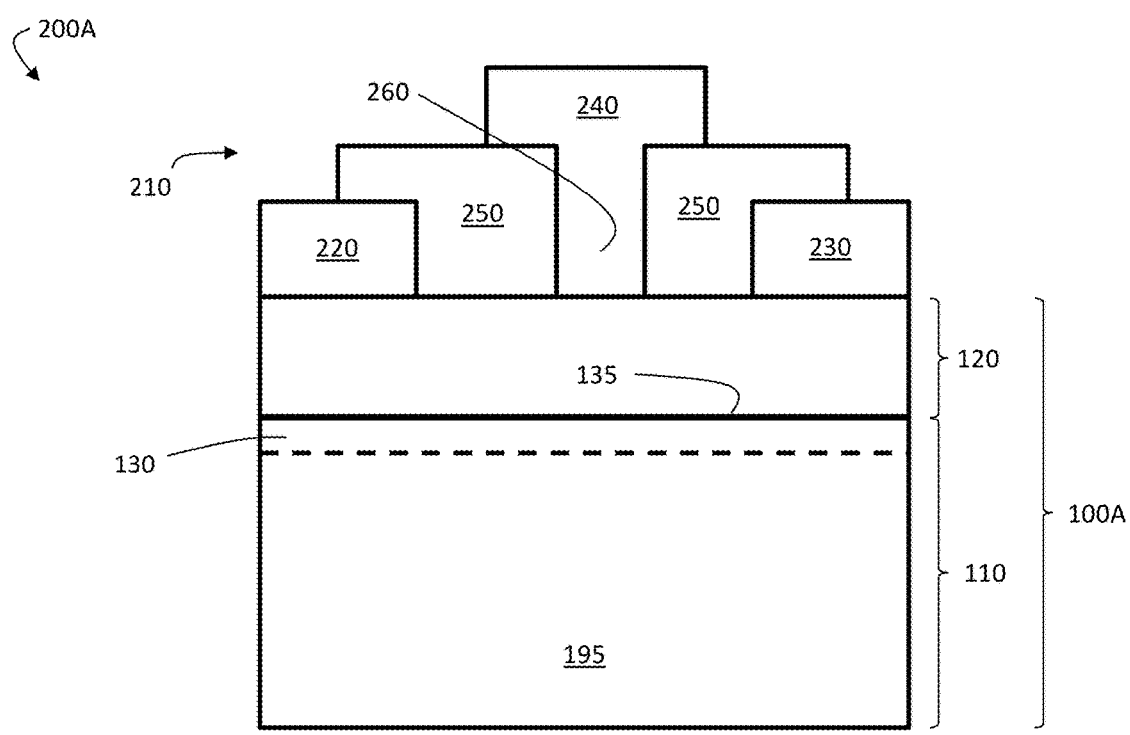
FIG. 2A is, according to some embodiments, a cross-sectional schematic illustration of a semiconductor structure comprising a transistor.

FIG. 2A is an exemplary cross-sectional schematic illustration of a semiconductor structure 200A comprising transistor 210, according to certain embodiments. In FIG. 2A, transistor 210 comprises source electrode 220 and drain electrode 230. Transistor 210 also comprises gate electrode 240. Source electrode 220, drain electrode 230, and gate electrode 240 are positioned on III-nitride material region 120. The device also includes dielectric layer(s) 250. The dielectric layer can be a passivating layer that protects and passivates the surface of the III-nitride material region. Via 260 is formed within the dielectric layer 250 in which gate electrode 240 is, in part, formed. In FIG. 2A, as described above, III-nitride material region 120 is formed directly on substrate 110. It is also noted that the configuration of gate electrode 240 in direct contact with the III-nitride material device region 190 forms a Schottky-gated FET. In other embodiments (not shown) there may be an insulator layer formed between gate electrode 240 and III-nitride material device region 190 configured as a Metal Insulated Field Effect Transistor (MISFET) or more generically an insulated gate transistor. It should also be noted that, although FIG. 2A shows via 260 formed within dielectric layer 250, in certain other embodiments, via 260 could extend down and terminate within III-nitride material region 120.

Figure 2B:
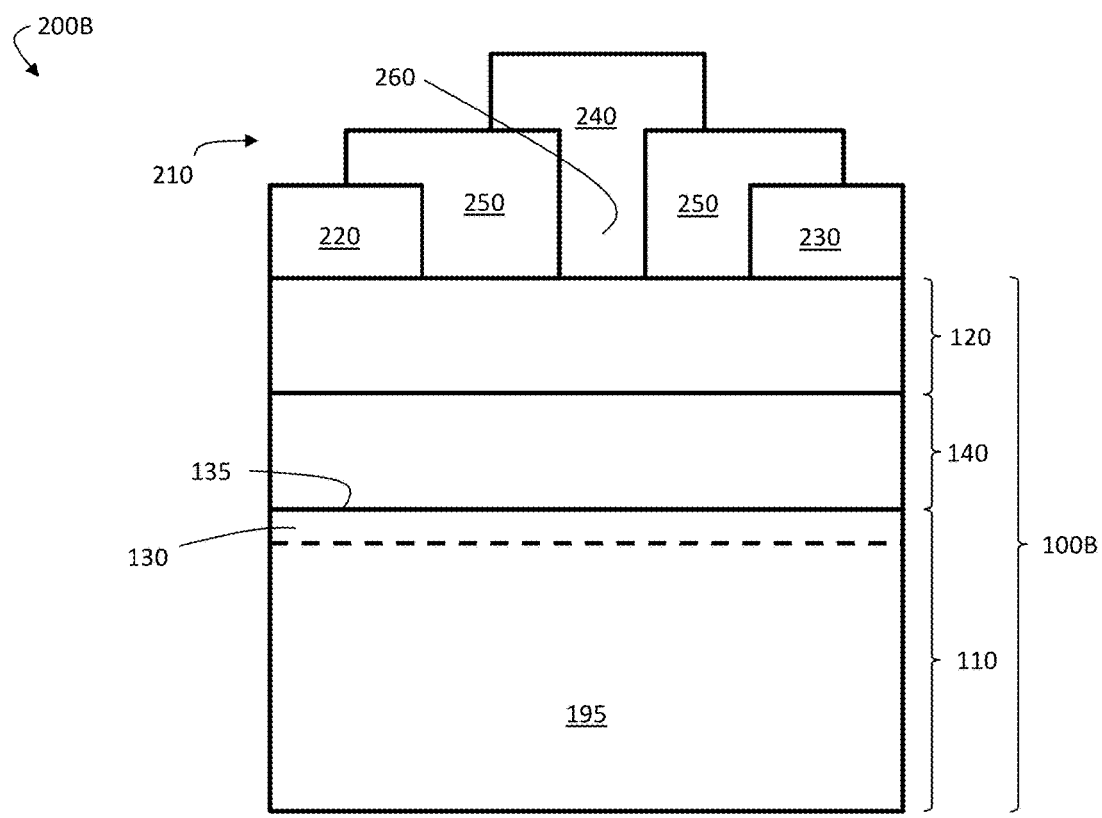
FIG. 2B is a cross-sectional schematic illustration of a semiconductor structure comprising an optional diffusion barrier region and a transistor, according to certain embodiments.

FIG. 2B is another exemplary cross-sectional schematic illustration of a semiconductor structure 200B comprising transistor 210 (e.g., a FET). In FIG. 2B, the electrodes of transistor 210 are formed over semiconductor structure 100B, as illustrated in FIG. 1B. Unlike in FIG. 2A, the III-nitride material region 120 is formed above optional diffusion barrier region 140, and optional diffusion barrier region 140 is formed above substrate 110.

Figure 2C:
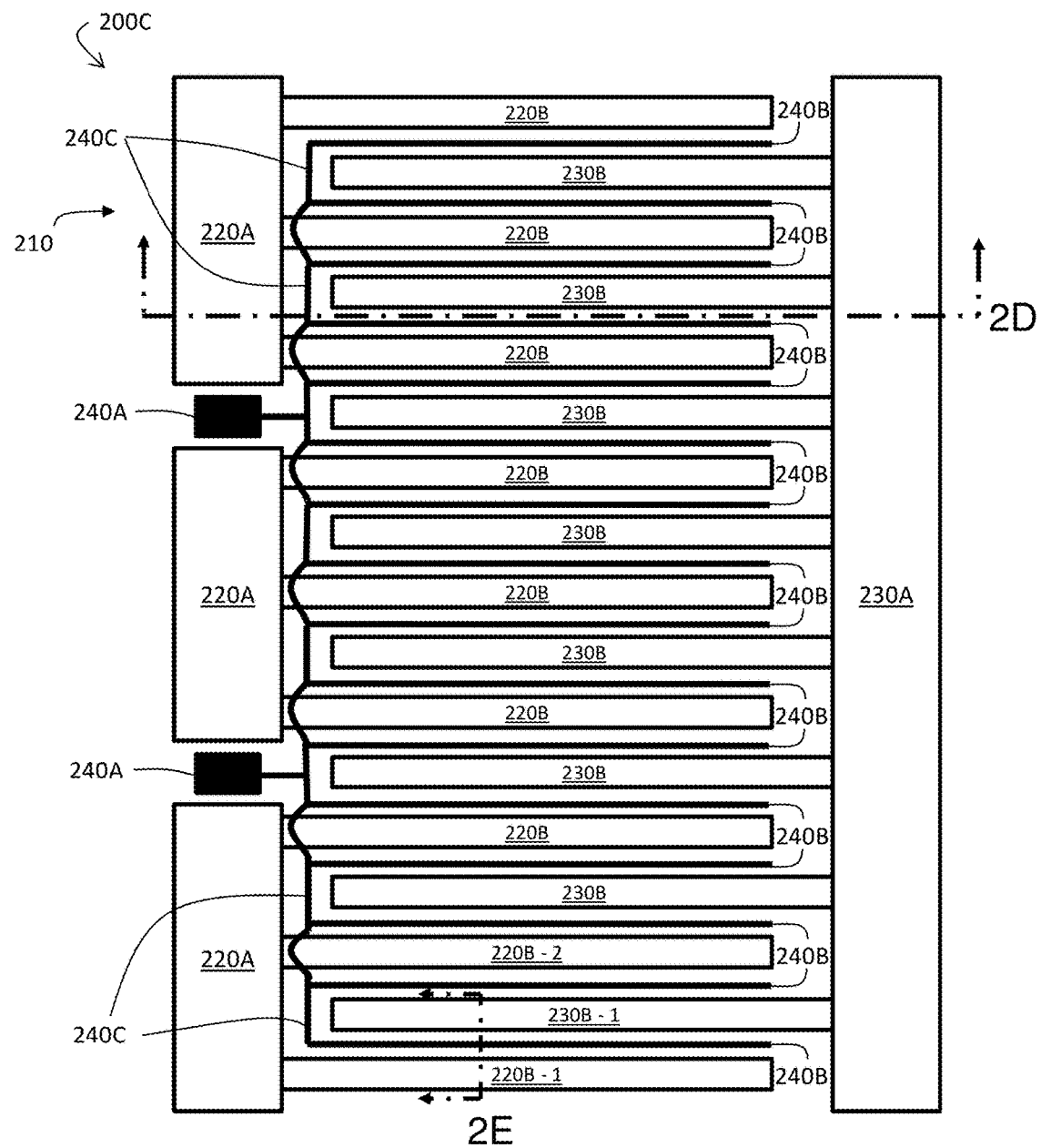
FIG. 2C is, according to certain embodiments, a top-view schematic illustration of a semiconductor structure comprising a transistor.
Figure 2D:
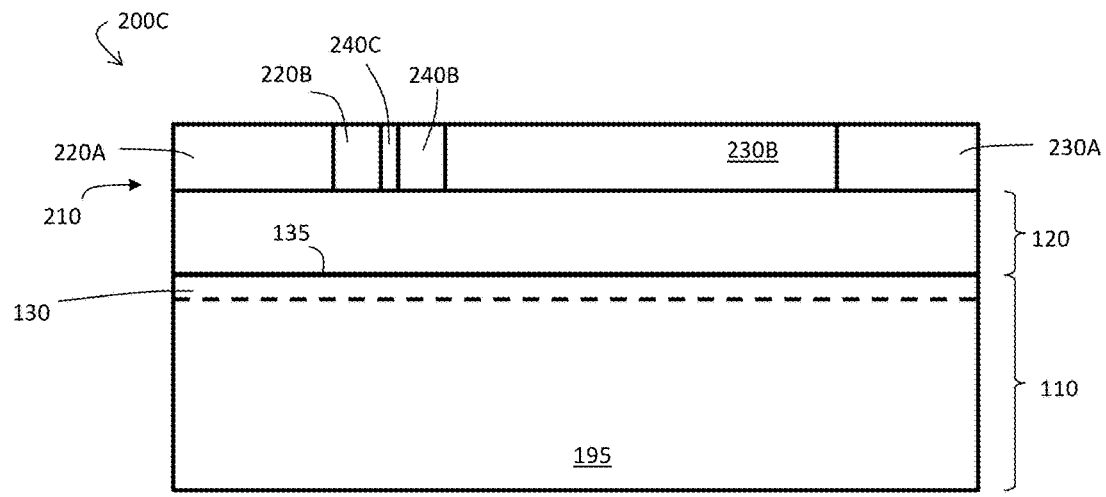
FIG. 2D is a side-view, cross-sectional schematic illustration of the semiconductor structure illustrated in FIG. 2C.
Figure 2E:
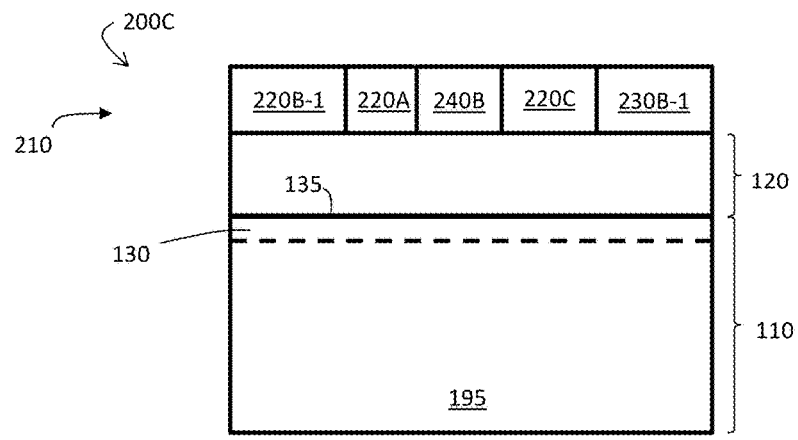
FIG. 2E is a side-view, cross-sectional schematic illustration of a portion of the semiconductor structure illustrated in FIG. 2C.

The transistor structure illustrated in FIGS. 2A-2B is exemplary, and other structures could also be used. For example, FIGS. 2C-2E are schematic illustrations of another exemplary semiconductor structure 200C, according to certain embodiments. FIG. 2C is a top view schematic illustration of semiconductor structure 200C. FIG. 2D is a front view cross-sectional illustration of semiconductor structure 200C from FIG. 2C, with the cross-section taken along line 2D shown in FIG. 2C. FIG. 2E is a side view cross-sectional illustration of semiconductor structure 200C from FIG. 2C, with the cross-section taken along line 2E shown in FIG. 2C.

In some embodiments, the transistor comprises one or more source pads coupled to a plurality of source finger electrode portions. For example, in FIG. 2C, transistor 210 of semiconductor structure 200C comprises a plurality of source pads 220A coupled to source finger electrode portions 220B. In some embodiments, the transistor comprises one or more drain pads coupled to a plurality of drain finger electrode portions. For example, in FIG. 2C, transistor 210 of semiconductor structure 200C comprises a plurality of drain pads 230A coupled to drain finger electrode portions 230B. According to certain embodiments, the transistor comprises one or more gate pads coupled to a plurality of gate finger electrode portions. For example, in FIG. 2C, transistor 210 of semiconductor structure 200C comprises a plurality of gate pads 240A coupled to gate finger electrode portions 240B via gate conductors 240C. Transistor 210 can also comprise other components, such as one or more dielectric layers, but such additional components are omitted from FIG. 2C for purposes of clarity.

According to certain embodiments, the plurality of source finger electrode portions can be elongated (e.g., having an aspect ratio of at least about 2:1, at least about 3:1, at least about 5:1, at least about 10:1, or longer). In some embodiments, the plurality of source finger electrode portions are substantially parallel to each other (i.e., the longitudinal axes of the source finger electrode portions are parallel to within about 5°, within about 2°, or within about 1° of each other). For example, in FIG. 2C, transistor 210 of semiconductor structure 200C comprises elongated source finger electrode portions 220B, which have longitudinal axes (extending horizontally across the page) that are parallel to each other. In some embodiments, the plurality of drain finger electrode portions can be elongated (e.g., having an aspect ratio of at least about 2:1, at least about 3:1, at least about 5:1, at least about 10:1, or longer). In some embodiments, the plurality of drain finger electrode portions are substantially parallel to each other (i.e., the longitudinal axes of the drain finger electrode portions are parallel to within about 5°, within about 2°, or within about 1° of each other). For example, in FIG. 2C, transistor 210 of semiconductor structure 200C comprises elongated drain finger electrode portions 230B, which have longitudinal axes (extending horizontally across the page) that are parallel to each other. In certain embodiments, the plurality of gate finger electrode portions can be elongated (e.g., having an aspect ratio of at least about 2:1, at least about 3:1, at least about 5:1, at least about 10:1, or longer). In some embodiments, the plurality of gate finger electrode portions are substantially parallel to each other (i.e., the longitudinal axes of the gate finger electrode portions are parallel to within about 5°, within about 2°, or within about 1° of each other). For example, in FIG. 2C, transistor 210 of semiconductor structure 200C comprises elongated gate finger electrode portions 240B, which have longitudinal axes (extending horizontally across the page) that are parallel to each other.

According to certain embodiments, at least some of the source finger electrode portions are interdigitated with drain finger electrode portions. In some embodiments, at least some of the drain finger electrode portions are interdigitated with source finger electrode portions. Generally, a first finger electrode portion is said to be "interdigitated" with other finger electrode portions when the longitudinal axis of the first finger electrode portion extends into a spatial cavity created by the other finger electrode portions. In FIG. 2C, for example, drain finger electrode portion 230B-1 is interdigitated with source finger electrode portions 220B-1 and 220B-2.

It should be understood that other structures and devices may be within the scope of the present invention including structures and devices that are not specifically described herein. Other structures may include other layers and/or features, amongst other differences.

In some cases, a parasitic channel can be present at (or proximate to) a surface of the substrate (e.g., a top surface of the substrate). In some embodiments, the parasitic channel can be formed in a surface region of the substrate, such as the top surface region of the substrate. As noted elsewhere, the surface region of the substrate can include an external surface of a substrate and/or a portion of the substrate underneath and close to the external surface. In some embodiments, the surface region of the substrate extends to a depth of about 5 microns, to a depth of about 2 microns, to a depth of about 1 micron, to a depth of about 500 nm, to a depth of about 200 nm, or less. For example, referring back to FIG. 1A, in some cases, a parasitic channel may be formed in surface region 130 of substrate 110, at or near substrate surface 135. The parasitic channel, when present, can generally be formed in a top surface region of the substrate, and can extend for a depth (d) into the substrate surface. In most cases, the parasitic channel extends to the top surface, but it is possible for the top surface region to include a thin portion at the top surface that is not parasitic and for the parasitic channel to be beneath that portion and, thus, proximate to the top surface. In general, depth (d) is the distance from the top surface at which the free carrier concentration of the parasitic channel is equal to the free carrier concentration of the bulk substrate. Thus, depth (d) depends, in part, on the free carrier concentration of the bulk substrate. In some embodiments, such as when the silicon substrate is highly resistive, the free carrier concentration of the bulk substrate may be less than about $10^{14}/cm^3$ (e.g., $10^{12}/cm^3$). Typical parasitic channel depths may be, in some cases, at least about 1 micron and may be less than about 5 microns. In some embodiments, the depth of the parasitic channel is less than or equal to about 5 microns, less than or equal to about 2 microns, less than or equal to about 1 micron, less than or equal to about 500 nm, less than or equal to about 200 nm, or less.

In some embodiments, the devices that are formed are free of parasitic channels or include only low-conductivity parasitic channels. In certain embodiments, the surface region of a device (e.g., the top surface region of the device) is free of a parasitic channel or includes only a low-conductivity parasitic channel. "Low-conductivity parasitic channels" are parasitic channels having a peak free carrier concentration that is less than about $10^{17}/cm^3$ and/or having a total integrated surface region charge of less than about $10^{12}/cm^2$. In some embodiments, the low-conductivity parasitic channel has a peak free carrier concentration that is less than about $10^{17}/cm^3$, less than about $5 \times 10^{16}/cm^3$, less than about $10^{16}/cm^3$, or less than about $10^{15}/cm^3$. Low-conductivity parasitic channels can have, in some embodiments, peak free carrier concentrations as low as about $10^{14}/cm^3$, or lower. In some embodiments, the low-conductivity parasitic channel has a total integrated surface region charge that is less than about $10^{11}/cm^2$, less than about $10^{10}/cm^2$, less than about $10^9/cm^2$, or less than about $10^8/cm^2$. Low-conductivity parasitic channels can have, in some embodiments, total integrated surface region charges as low as about $10^8/cm^2$, as low as about $10^5/cm^2$, or lower. Portions of parasitic channels having relatively low free carrier concentrations (e.g., less than about $10^{14}/cm^3$) and/or relatively low total integrated surface region charges may not have a significant, if any, impact on device performance. "High-conductivity parasitic channels" are parasitic channels having a peak free carrier concentration that is at least about $10^{17}/cm^3$ and having a total integrated surface region charge of at least about $10^{12}/cm^2$. In some cases, a high-conductivity parasitic channel can have a peak free carrier concentration that is at least about $5 \times 10^{17}/cm^3$, at least about $10^{18}/cm^3$, or at least about $10^{19}/cm^3$. In some cases, a high-conductivity parasitic channel can have a total integrated surface region charge that is at least about $10^{13}/cm^2$, at least about $10^{14}/cm^2$, at least about $10^{15}/cm^2$, or at least about $10^{16}/cm^2$.

In some embodiments, various of the processing (e.g., implantation) methods described herein can be used to reduce the peak free carrier concentration from above a first threshold level to below a second threshold level (which can be the same as or different from the first threshold level). For example, in some embodiments, processing (e.g., implantation) can be performed such that the peak free carrier concentration is reduced from a level above about $10^{17}/cm^3$ to below about $10^{17}/cm^3$ (or below about $5 \times 10^{16}/cm^3$, below about $10^{16}/cm^3$, below about $10^{15}/cm^3$, or below about $10^{14}/cm^3$); from a level above about $5 \times 10^{16}/cm^3$ to below about $5 \times 10^{16}/cm^3$ (or below about $10^{16}/cm^3$, below about $10^{15}/cm^3$, or below about $10^{14}/cm^3$); from a level above about $10^{16}/cm^3$ to a level below about $10^{16}/cm^3$ (or below about $10^{15}/cm^3$, or below about $10^{14}/cm^3$); from a level above about $10^{15}/cm^3$ to a level below about $10^{15}/cm^3$ (or below about $10^{14}/cm^3$ or from a level above about $10^{14}/cm^3$ to a level below about $10^{14}/cm^3$. Such reductions may be achieved within any of the regions described herein in which the reduction of free carrier concentrations is described.

In some embodiments, various of the processing (e.g., implantation) methods described herein can be used to reduce the total integrated surface region charge from above a first threshold level to below a second threshold level (which can be the same as or different from the first threshold level). For example, in some embodiments, processing (e.g., implantation) can be performed such that the total integrated surface region charge is reduced from a level above about $10^{11}/cm^2$ to below about $10^{11}/cm^2$ (or below about $10^{10}/cm^2$; below about $10^9/cm^2$, below about $10^8/cm^2$, or below about $10^5/cm^2$); from a level above about $10^{10}/cm^2$ to below about $10^{10}/cm^2$ (or below about $10^9/cm^2$, below about $10^8/cm^2$, or below about $10^5$ $cm^2$); from a level above about $10^9/cm^2$ to a level below about $10^9/cm^2$ (or below about $10^8/cm^2$, or below about $10^5/cm^2$); or from a level above about $10^8/cm^2$ to a level below about $10^8/cm^2$ (or below about $10^5/cm^2$). Such reductions may be achieved within any of the regions described herein in which the reduction of free carrier concentrations is described.

Figure 5:
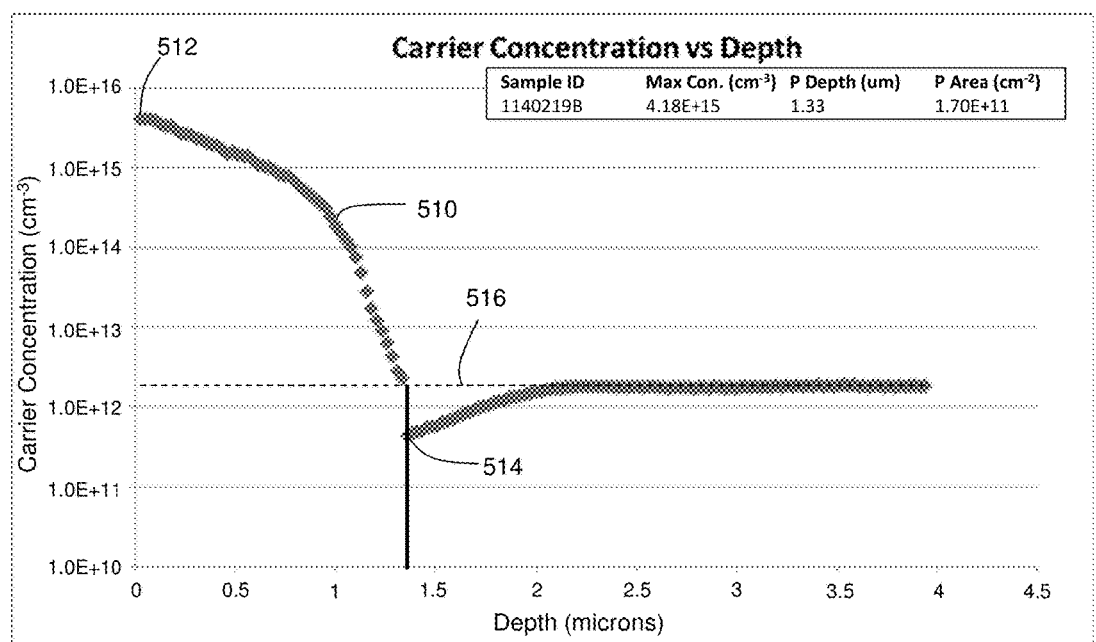
FIG. 5 is an exemplary plot of free carrier concentration as a function of depth in a substrate, according to certain embodiments.

The peak free carrier concentration of a parasitic channel may depend on a number of factors including the particular method used to reduce free carrier concentration. The peak free carrier concentration of a parasitic channel refers to the highest (or "peak") concentration of free carriers within the parasitic channel, and may be measured using standard techniques known to those of ordinary skill in the art including spreading resistance profiling (SRP) and Secondary Ion Mass Spectroscopy (SIMS). The free carrier concentration in the parasitic channel typically decreases with distance from the substrate top surface or from a maximum free carrier concentration that is displaced some depth below the substrate top surface. As one example, referring to FIG. 1A, the free carrier concentration may, in some embodiments, decrease from top surface 135 downward through the thickness of substrate 110. The free carrier concentration in the parasitic channel can, according to certain embodiments, exhibit a profile resulting from SRP measurement techniques similar to that shown in FIG. 5. In some embodiments, the free carrier concentration exhibits a maximum, which is referred to as the "peak free carrier concentration." The peak free carrier concentration can, in some cases, be located at or near a top surface of the substrate. For example, in FIG. 5, free carrier concentration curve 510 exhibits a maximum substantially at or near the top surface of the substrate (e.g., surface 135 in the figures) indicated as point 512 in FIG. 5. In some cases, the free carrier concentration decreases to a minimum at some depth within the substrate (e.g., at a depth of about 1 micron or less, at a depth of about 0.5 microns or less, or at a depth of about 0.2 microns or less). For example, in FIG. 5, free carrier concentration curve 510 exhibits a minimum at point 514, which corresponds to a depth of about 1.33 microns. In some cases, the substrate background free carrier concentration dominates the profile at the minimum.

As noted above, certain of the devices described herein can have relatively low total integrated surface region charges. The "total integrated surface region charge" refers to the average amount of free carriers per unit volume, determined by integrating the free carrier concentration profile curve from a surface of the substrate to the depth at which the parasitic channel free carrier concentration matches the background free carrier concentration of the substrate. The free carrier concentration profile curve can be determined using standard techniques known to those of ordinary skill in the art including spreading resistance profiling (SRP) and Secondary Ion Mass Spectroscopy (SIMS). As one example, the total integrated surface region charge for the device shown in FIG. 5 would be calculated by determining the area under curve 510 from x=0 (i.e., the surface of the substrate) to x=1.33 (i.e., the location on the x-axis corresponding to the depth within the substrate at which the value of curve 510 equals the background free carrier concentration, which is indicated by dotted line 516), and dividing the determined area by 1.33. In other words, the total integrated surface region charge for a given free carrier concentration profile is determined by integrating the free carrier concentration profile curve from x=0 (i.e., the surface of the device) to x=d (i.e., the depth at which the parasitic channel free carrier concentration matches the background free carrier concentration of the substrate).

In some cases, the free carrier within the parasitic channel region may be of a first type and the native background free carrier may be of the opposite type. For example, in some cases, the free carrier within the parasitic layer may be an acceptor, whereas the native background free carrier concentration of the substrate may be a donor. As such, a P-N junction can be formed in the substrate. For example, the P-N junction can comprise a P-type parasitic layer and an N-type background free carrier region (e.g., of a high resistivity silicon substrate). According to certain embodiments, the P-N junction does not exist within the substrate prior to forming the III-nitride material region. Rather, the P-N junction and parasitic layer in the silicon substrate are generally formed in such embodiments during the semiconductor growth process of the III-nitride material region (which may include, for example, the optional nucleation layer, the optional transition layer(s), the optional buffer layer(s), and/or optional layer(s) of the III-nitride material device region).

One feature of certain embodiments of the invention is that the peak free carrier concentration may be relatively low. For example, in some embodiments, the peak free carrier concentration may be less than about $10^{17}/cm^3$; in some cases, less than about $10^{16}/cm^3$; in some cases, less than about $10^{15}/cm^3$; in some cases, less than about $10^{14}/cm^3$; in some cases, less than about $10^{13}/cm^3$; or lower. In some embodiments, the peak free carrier concentration is less than about 100 times the free carrier concentration in the bulk of the substrate, less than about 10 times the free carrier concentration in the bulk of the substrate, less than about 5 times the free carrier concentration in the bulk of the substrate, less than about 2 times the free carrier concentration in the bulk of the substrate, less than about 1.5 times the free carrier concentration in the bulk of the substrate, or less than about 1.1 times the free carrier concentration in the bulk of the substrate. According to certain embodiments, both the peak free carrier concentration and the background bulk substrate free carrier concentration are less than about $10^{13}/cm^3$. Depth profiles may be generated using the SRP and SIMS techniques noted above.

According to certain embodiments, the substrate includes a bulk region below the top surface region. For example, referring to FIGS. 1A-1B, 2A-2B, 2D-2E, 3A-3B, 3D-3E, 3G-3H, 3J, and 4A-4B, substrate 110 can comprise bulk region 195 below top surface region 130. In some embodiments, the bulk region of the substrate has a lower peak free carrier concentration than the top surface region. For example, the top surface region of the substrate may have a relatively high peak free carrier concentration (e.g., when a low-conductivity or a high-conductivity parasitic channel is present), and the bulk region of the substrate may have a lower peak free carrier concentration. In some embodiments, the bulk region of the substrate is doped with a first free carrier type and the top surface region is doped with a second free carrier type (e.g., a Group III species such as Al, Ga, and/or In). In some embodiments, the second free carrier type is Al and/or Ga. According to certain embodiments, the peak free carrier concentration in the bulk region is less than about $10^{13}/cm^3$, less than about $10^{12}/cm^3$, less than about $10^{11}/cm^3$, less than about $10^{10}/cm^3$, or less than about $10^9/cm^3$.

As noted above, in some embodiments, semiconductor structures can be formed such that the adverse impact of an existing parasitic channel is reduced or eliminated. The impact of an existing parasitic channel can be reduced or eliminated, for example, by implanting one or more species into the semiconductor structure. Implanting the species into the semiconductor structure can, according to certain embodiments, disrupt the parasitic channel and/or reduce the electronic conductivity within the parasitic channel, or eliminate the parasitic channel entirely.

In certain embodiments, a method of forming a semiconductor structure is described comprising implanting a species having a relative atomic mass of less than 5 into a substrate comprising silicon. Those of ordinary skill in the art are familiar with "relative atomic mass" (also sometimes referred to as "atomic weight"), which refers to the ratio of the average mass of atoms of an element to 1/12 of the mass of an atom of carbon-12 (known as the unified atomic mass unit). As one example, atomic hydrogen has a relative atomic mass of 1.008. Atomic helium has a relative atomic mass of 4.003. Examples of species having a relative atomic mass of less than 5 include, but are not limited to, hydrogen and helium. The species having a relative atomic mass of less than 5 can be atomic (e.g., atomic helium (He)), ionic (e.g., hydrogen cations ($H^+$) also referred to herein as protons), or molecular (e.g., molecular hydrogen ($H_2$)). In some embodiments, a single species having a relative atomic mass of less than 5 is implanted into the substrate, while in other embodiments, multiple species having a relative atomic mass of less than 5 are implanted into the substrate.

In some embodiments, implanting the species having a relative atomic mass of less than 5 produces a surface region comprising a low-conductivity parasitic channel, or a surface region that does not comprise a parasitic channel. For example, referring to FIG. 1A, in some embodiments, a species having a relative atomic mass of less than 5 can be implanted into substrate 110. In some such embodiments, implantation of the species into substrate 110 can result in the formation of a low-conductivity parasitic channel in surface region 130. In some such embodiments, implantation of the species into substrate 110 can result in surface region 130 being free of a parasitic channel.

According to certain embodiments, during the implanting step, at least a portion of the species having a relative atomic mass of less than 5 is implanted through a III-nitride material region of the semiconductor structure. For example, referring to FIG. 1A, in some embodiments, a species having a relative atomic mass of less than 5 is implanted through III-nitride material region 120, through surface 135, and into substrate 110. In some such embodiments, the III-nitride material region is formed over the substrate in a first step (e.g., via any of the methods described elsewhere herein), after which the species having a relative atomic mass of less than 5 is implanted through the III-nitride material region.

It should be understood that, as described herein, a species is considered to be implanted through a III-nitride material region when it is implanted through the finally formed III-nitride material region as well as when it is implanted through only an intermediate portion of the III-nitride material region, which may have only a fraction of the thickness of the fully-formed III-nitride material region. For example, if a species is implanted through a partially-formed III-nitride material region (or a partially-formed III-nitride material layer), and subsequent to the implantation of the species, additional potion(s) of III-nitride material (or additional portion(s) of the layer of III-nitride material) are formed directly on the III-nitride material through which the species was implanted, the species would still be considered to have been implanted through a III-nitride material region.

In certain embodiments, the species having a relative atomic mass of less than 5 can be implanted through an optional III-nitride material nucleation layer. For example, referring to FIG. 1D, in some embodiments, a species having a relative atomic mass of less than 5 can be implanted through optional III-nitride material nucleation layer 155 (and subsequently through surface 135 and into substrate 110). In some such embodiments, the optional III-nitride material nucleation layer (or a portion thereof) is formed over the substrate in a first step (e.g., via any of the methods described elsewhere herein), after which the species having a relative atomic mass of less than 5 is implanted through the III-nitride material nucleation layer.

In some embodiments, the species having a relative atomic mass of less than 5 can be implanted through an optional III-nitride material transition layer. For example, referring to FIG. 1D, in some embodiments, a species having a relative atomic mass of less than 5 can be implanted through optional III-nitride material transition layer 170 (and subsequently through surface 135 and into substrate 110). In some such embodiments, the optional III-nitride material transition layer (or a portion thereof) is formed over the substrate in a first step (e.g., via any of the methods described elsewhere herein), after which the species having a relative atomic mass of less than 5 is implanted through the III-nitride material transition layer.

In some embodiments, the species having a relative atomic mass of less than 5 can be implanted through an optional III-nitride material buffer layer. For example, referring to FIG. 1D, in some embodiments, a species having a relative atomic mass of less than 5 can be implanted through optional III-nitride material buffer layer 180 (and subsequently through surface 135 and into substrate 110). In some such embodiments, the optional III-nitride material buffer layer (or a portion thereof) is formed over the substrate in a first step (e.g., via any of the methods described elsewhere herein), after which the species having a relative atomic mass of less than 5 is implanted through the III-nitride material buffer layer.

In some embodiments, the species having a relative atomic mass of less than 5 can be implanted through at least one layer of a III-nitride material device region (e.g., a GaN device layer). For example, referring to FIG. 1D, in some embodiments, a species having a relative atomic mass of less than 5 can be implanted through at least one layer of III-nitride material device region 190 (and subsequently through surface 135 and into substrate 110). In some such embodiments, a layer of the III-nitride material device region (or a portion thereof) is formed over the substrate in a first step (e.g., via any of the methods described elsewhere herein), after which the species having a relative atomic mass of less than 5 is implanted through the layer of the III-nitride material device region. In some such embodiments, the layer of the III-nitride material device region through which the species is implanted can be an epitaxial III-nitride material device material layer (e.g., an epitaxial GaN layer). In some such embodiments, the layer of the III-nitride material device region through which the species is implanted can be a monocrystalline III-nitride material device layer (e.g., a monocrystalline GaN layer).

According to certain embodiments, the species having a relative atomic mass of less than 5 can be implanted through a transistor (e.g., FET) of the semiconductor structure. For example, referring to FIG. 2A, in some embodiments a species having a relative atomic mass of less than 5 can be implanted through transistor 210 and III-nitride material region 120 (and subsequently through surface 135 and into substrate 110).

The species having a relative atomic mass of less than 5 can be implanted, in some embodiments, between III-nitride material formation steps. For example, in some embodiments, after the species has been implanted through a first III-nitride material region, a second III-nitride material region is formed over the first III-nitride material region through which the species was implanted. In some such embodiments, the second III-nitride material can be formed directly on the first III-nitride material region. In some such embodiments, the second III-nitride material can be a monocrystalline III-nitride material (e.g., a monocrystalline GaN layer). In some such embodiments, the second III-nitride material can be an epitaxial III-nitride material (e.g., an epitaxial GaN layer). In certain embodiments, the second III-nitride material region can include a 2DEG region. According to certain embodiments, by forming the second III-nitride material after the implantation step has been performed, one can avoid damaging the second III-nitride material region via the implantation step. For example, according to some embodiments, a species (e.g., having a relative atomic mass of less than 5) can be implanted through an optional III-nitride material nucleation layer, an optional III-nitride material transition layer, and/or an optional III-nitride material buffer layer. In some such embodiments, after the implantation step, at least a layer of a III-nitride material device region can be formed over the substrate (and/or the optional III-nitride material nucleation layer, the optional III-nitride material transition layer, and/or the optional III-nitride material buffer layer). In some embodiments, a species (e.g., having a relative atomic mass of less than 5) can be implanted through an optional III-nitride material nucleation layer and/or an optional III-nitride material transition layer. In some such embodiments, after the implantation step, a III-nitride material buffer layer and/or at least a layer of a III-nitride material device region can be formed over the substrate (and/or the optional III-nitride material nucleation layer and/or the optional III-nitride material transition layer). In some embodiments, a species (e.g., having a relative atomic mass of less than 5) can be implanted through an optional III-nitride material nucleation layer. In some such embodiments, after the implantation step, a III-nitride material transition layer, a III-nitride material buffer layer, and/or at least a layer of a III-nitride material device region can be formed over the substrate (and/or the optional III-nitride material nucleation layer). According to certain embodiments, a species (e.g., having a relative atomic mass of less than 5) can be implanted through an optional III-nitride material nucleation layer. In some such embodiments, after the implantation step, a III-nitride material transition layer, a III-nitride material buffer layer, and/or at least a layer of a III-nitride material device region can be formed over the substrate (and/or the optional III-nitride material nucleation layer).

According to certain embodiments, after the implantation has been performed, a transistor (e.g., a FET) may be formed over the III-nitride material region(s). For example, in some embodiments, a III-nitride material region is formed over the substrate, a species having a relative atomic mass of less than 5 is implanted into the substrate, after which one or more electrodes of the transistor are formed. In certain embodiments, at least part of the transistor is formed prior to the implantation of the species having a relative atomic mass of less than 5. For example, in some embodiments, a III-nitride material region is formed over the substrate, a transistor is formed over the III-nitride material region, and subsequently, a species having a relative atomic mass of less than 5 is implanted into the substrate (e.g., through the transistor and the III-nitride material region).

In some embodiments, a species having a relative atomic mass of less than 5 is implanted into the semiconductor substrate from the back side of the substrate. In some such embodiments, transport of the implanted species through the III-nitride material region is eliminated, which, in some cases, can help preserve the functionality and/or structure of the III-nitride material region.

Figure 4A:
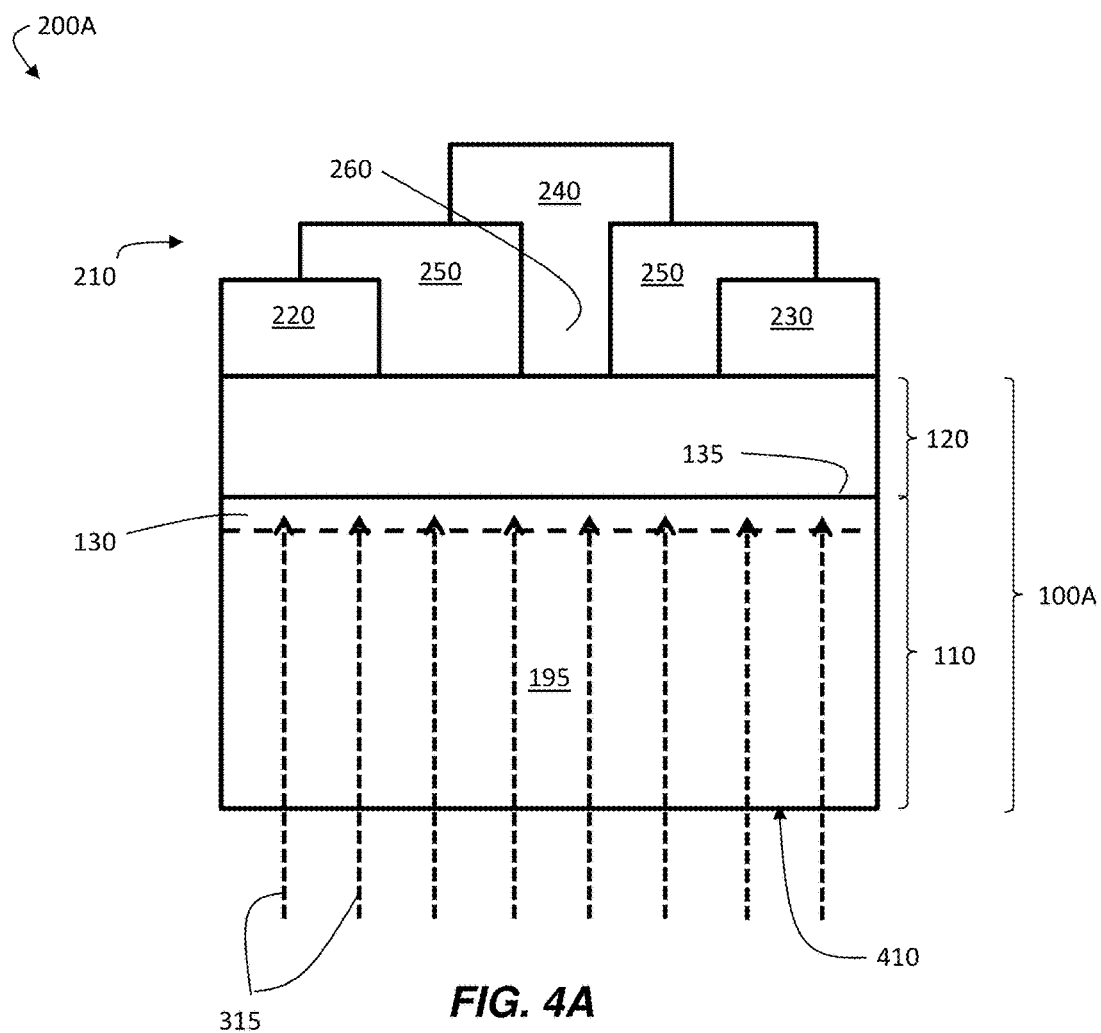
FIG. 4A is, according to some embodiments, a cross-sectional schematic illustration showing the transport of species into a back side of a substrate of a semiconductor structure.
Figure 4B:
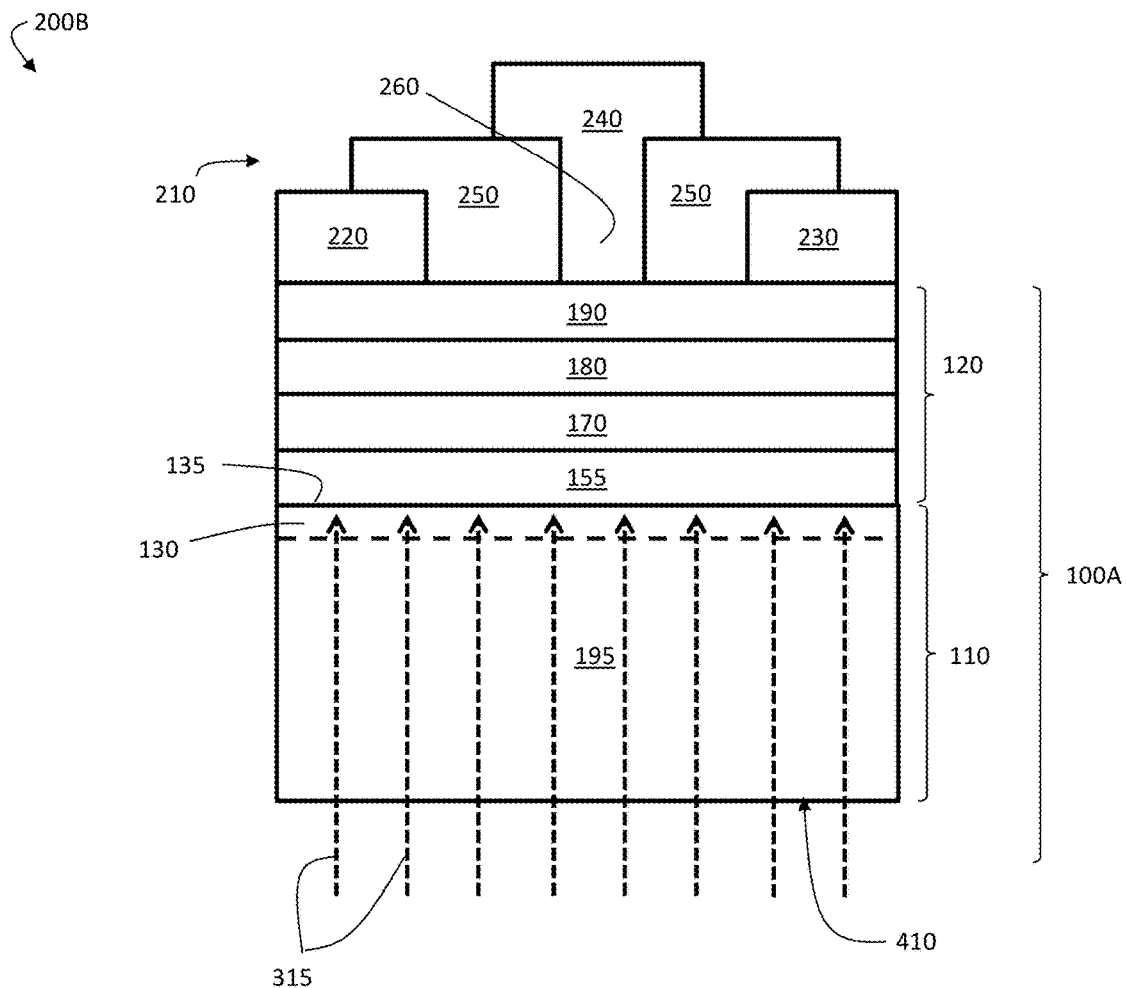
FIG. 4B is a cross-sectional schematic illustration showing the transport of species into a back side of a substrate of and into a semiconductor structure comprising multiple layers within a III-nitride material region, according to certain embodiments.

Accordingly, certain inventive methods comprise implanting a species having a relative atomic mass of less than 5 into a structure comprising a III-nitride material region and a substrate comprising silicon, wherein at least a portion of the species is implanted through the substrate without being implanted through the III-nitride material region. This may be achieved, according to certain embodiments, by implanting the species having a relative atomic mass of less than 5 into the substrate via the back side of the substrate (i.e., the side of the substrate opposite the substrate surface over which the diffusion barrier region, the III-nitride material region, and/or the transistor is positioned). One example of such an implantation method is illustrated in FIG. 4A. In FIG. 4A, species 315 is implanted through back side 410 of substrate 110. Species 315 is not implanted, however, through III-nitride material region 120. In addition, species 315 is not implanted through transistor 210 (e.g., when transistor 210 is present during the implantation step). Another example of such implantation is illustrated in FIG. 4B. In FIG. 4B, species 315 is implanted through back side 410 of substrate 110. In the embodiment shown in FIG. 4B, however, species 315 is not implanted through III-nitride material region 120. In certain embodiments, the species having a relative atomic mass of less than 5 is not implanted through the optional III-nitride material nucleation layer. For example, in FIG. 4B, species 315 is not implanted through optional III-nitride material nucleation layer 155. In certain embodiments, the species having a relative atomic mass of less than 5 is not implanted through the optional III-nitride material transition layer. For example, in FIG. 4B, species 315 is not implanted through optional III-nitride material transition layer 170. In certain embodiments, the species having a relative atomic mass of less than 5 is not implanted through the III-nitride material device region. For example, in FIG. 4B, species 315 is not implanted through III-nitride material device region 190.

In certain embodiments, the portion of the species that is not implanted through a particular region (e.g., the III-nitride region) may be implanted into the region but not completely through the region. For example, referring to FIGS. 4A-4B, in some cases, at least a portion of species 315 is implanted through substrate 110, across surface 135, and into III-nitride material region 120, but is not implanted through III-nitride material region 120. In other cases, the portion of the species that is not implanted through a particular region is not even implanted into the region. For example, referring to FIGS. 4A-4B, in some embodiments, at least a portion of species 315 is implanted into substrate 110 without crossing surface 135 (and, thus, without passing into III-nitride material region 120). Thus, said species is not even implanted into III-nitride material region 120 (and said species would not be implanted through III-nitride material region 120).

According to certain embodiments, at least a portion of the species having a relative atomic mass of less than 5 is not implanted through the transistor. For example, in FIG. 4B, species 315 is not implanted through transistor 210 (e.g., when transistor 210 is present during the implantation step). In certain embodiments, the transistor may not be formed until after the implantation of the species having a relative atomic mass of less than 5 is implanted.

Various of the implantation methods described herein can produce semiconductor structures in which the substrate comprises a region having a relatively high concentration of species having a relative atomic mass of less than 5. In some embodiments, at least a region of the substrate comprises at least one species having a relative atomic mass of less than 5 at a concentration of at least about $10^{19}/cm^3$ (or at least about $10^{20}/cm^3$, at least about $10^{21}/cm^3$, at least about $10^{22}/cm^3$, at least about $10^{23}/cm^3$, or more). The concentration of species having relative atomic masses of less than 5 can be measured using standard techniques known to those of ordinary skill in the art including spreading resistance profiling (SRP) and Secondary Ion Mass Spectroscopy (SIMS). In embodiments in which hydrogen is used as an implanted species, hydrogen forward scattering spectrometry (HFS) can be used to determine the concentration of hydrogen within regions of the semiconductor structure.

In some such embodiments, the region having a relatively high concentration of species having a relative atomic mass of less than 5 can be part of a surface region and/or a parasitic channel in the substrate. For example, referring to FIGS. 3A-3B, in some embodiments, one or more of regions 330 can include species having a relative atomic mass of less than 5 at a concentration within any of the ranges described above.

According to certain embodiments in which species having a relative atomic mass of less than 5 are implanted into the substrate, the substrate may also include a relatively high peak concentration of Group III species (e.g., Al, Ga, In, Tl, and B). The relatively high peak concentration(s) of Group III species can be present before the implantation or species having a relative atomic mass of less than 5, according to some embodiments. In certain embodiments, the relatively high peak concentration(s) of Group III species can be present after the implantation of species having a relative atomic mass of less than 5. The presence of the species having a relative atomic mass of less than 5 can reduce the electronic conductivity of the Group III species, inhibiting the formation of a high conductivity parasitic channel. In some embodiments in which species having a relative atomic mass of less than 5 are implanted into the substrate, the peak of the sum of the concentrations of Group III species in the substrate (e.g., the peak of the sum of the concentrations of Al, Ga, In, Tl, and B in the substrate) is at least about $10^{17}/cm^3$, at least about $10^{18}/cm^3$, at least about $10^{19}/cm^3$, at least about $10^{20}/cm^3$, at least about $10^{21}/cm^3$, at least about $10^{22}/cm^3$, or at least about $10^{23}/cm^3$. In some embodiments in which species having a relative atomic mass of less than 5 are implanted into the substrate, the peak of the sum of the concentrations of Al, Ga, and In in the substrate is at least about $10^{17}/cm^3$, at least about $10^{18}/cm^3$, at least about $10^{19}/cm^3$, at least about $10^{20}/cm^3$, at least about $10^{21}/cm^3$, at least about $10^{22}/cm^3$, or at least about $10^{23}/cm^3$. In some embodiments in which species having a relative atomic mass of less than 5 are implanted into the substrate, the peak concentration of Al, Ga, and/or In in the substrate is at least about $10^{17}/cm^3$, at least about $10^{18}/cm^3$, at least about $10^{19}/cm^3$, at least about $10^{20}/cm^3$, at least about $10^{21}/cm^3$, at least about $10^{22}/cm^3$, or at least about $10^{23}/cm^3$.

In some embodiments, the substrate comprises a high-conductivity parasitic channel before the implantation of species having a relative atomic mass of less than 5 and a low-conductivity parasitic channel (or no parasitic channel) after the implantation of species having a relative atomic mass of less than 5. In some embodiments, the bulk region of the substrate has a lower peak free carrier concentration than the top surface region of the substrate before and/or after the implantation of species having a relative atomic mass of less than 5. In some embodiments, the bulk region of the substrate is doped with a first free carrier type and the top surface region is doped with a second free carrier type (e.g., a Group III species such as Al, Ga, In, and/or Tl) before and/or after the implantation of species having a relative atomic mass of less than 5. According to certain embodiments, the peak free carrier concentration in the bulk region is less than about $10^{13}/cm^3$, less than about $10^{12}/cm^3$, less than about $10^{11}/cm^3$, less than about $10^{10}/cm^3$, or less than about $10^9/cm^3$ before and/or after the implantation of species having a relative atomic mass of less than 5.

In some embodiments, at least one species is implanted into the substrate in a spatially defined pattern. As a result, certain of the inventive semiconductor structures described herein include species located within the substrate (e.g., in a surface region of a substrate, such as surface region 130 in the figures) in a spatially defined pattern. Implanting species in a spatially defined pattern can allow one to select the regions of the semiconductor structure through which the species is transported, potentially limiting or eliminating damage caused by the implanted species within certain regions. Patterned implantation of the species can be performed using any of the semiconductor structures described herein.

Those of ordinary skill in the art would be capable of determining the amount of implanted species within various regions of a given semiconductor device using, for example, Secondary Ion Mass Spectroscopy (SIMS).

Certain embodiments comprise implanting a species into the substrate (e.g., into a surface region of the substrate) such that the implanted species forms a pattern spatially defined across at least one lateral dimension of the substrate (and, in some embodiments, across two lateral dimensions of the substrate). A "lateral dimension" of a substrate corresponds to a dimension of the substrate that is perpendicular to the thickness of the substrate. The lateral dimensions of the substrate can define the face of the substrate on which the barrier region, the III-nitride material region, and/or transistors (or other devices) are formed. The thickness of the substrate can be the smallest of the three coordinate dimensions of the substrate. For example, in the case of a silicon wafer, the wafer can have a thickness corresponding to its thinnest coordinate dimension and two lateral dimensions—which form the face of the wafer—each perpendicular to each other, and each perpendicular to the thickness of the wafer. Referring to FIG. 1A as a non-limiting example, substrate 110 comprises thickness 196 and lateral dimension 197. (Substrate 110 also has a second lateral dimension that extends into and out of the plane across which FIG. 1A is drawn.) In certain embodiments, the implanted species can form a pattern that is also spatially defined across the second lateral dimension of the substrate. In some embodiments, the spatially defined pattern in which the species is implanted can vary across the depth of (i.e., through the thickness of) the substrate. Implanting species according to such patterns can provide, according to certain embodiments, a number of advantages discussed in more detail below.

In some embodiments, at least one species can be implanted into a surface region of the substrate (e.g., into surface region 130 in the figures) such that the implanted species forms a pattern spatially defined across at least one lateral dimension (and, in some embodiments, across two lateral dimensions) of the surface region of the substrate. In some such embodiments, the species that is implanted into the substrate can be implanted through a III-nitride material region and subsequently into the substrate. In some such embodiments, after the implanting step, the implanted species is present within at least a portion of the surface region of the substrate at a concentration of at least about $10^{19}/cm^3$ (and/or, in some embodiments, at least about $10^{20}/cm^3$, at least about $10^{21}/cm^3$, at least about $10^{22}/cm^3$, or at least about $10^{23}/cm^3$). According to some such embodiments, after the implanting step, at least a second portion of the surface region of the substrate is substantially free of the first implanted species (i.e., the implanted species is present within the second portion in an amount of less than about $10^{15}/cm^3$, and, in some cases, less than about $10^{14}/cm^3$, less than about $10^{13}/cm^3$, less than about $10^{12}/cm^3$, less than about $10^{11}/cm^3$, less than about $10^{10}/cm^3$, or lower).

Figure 3A:
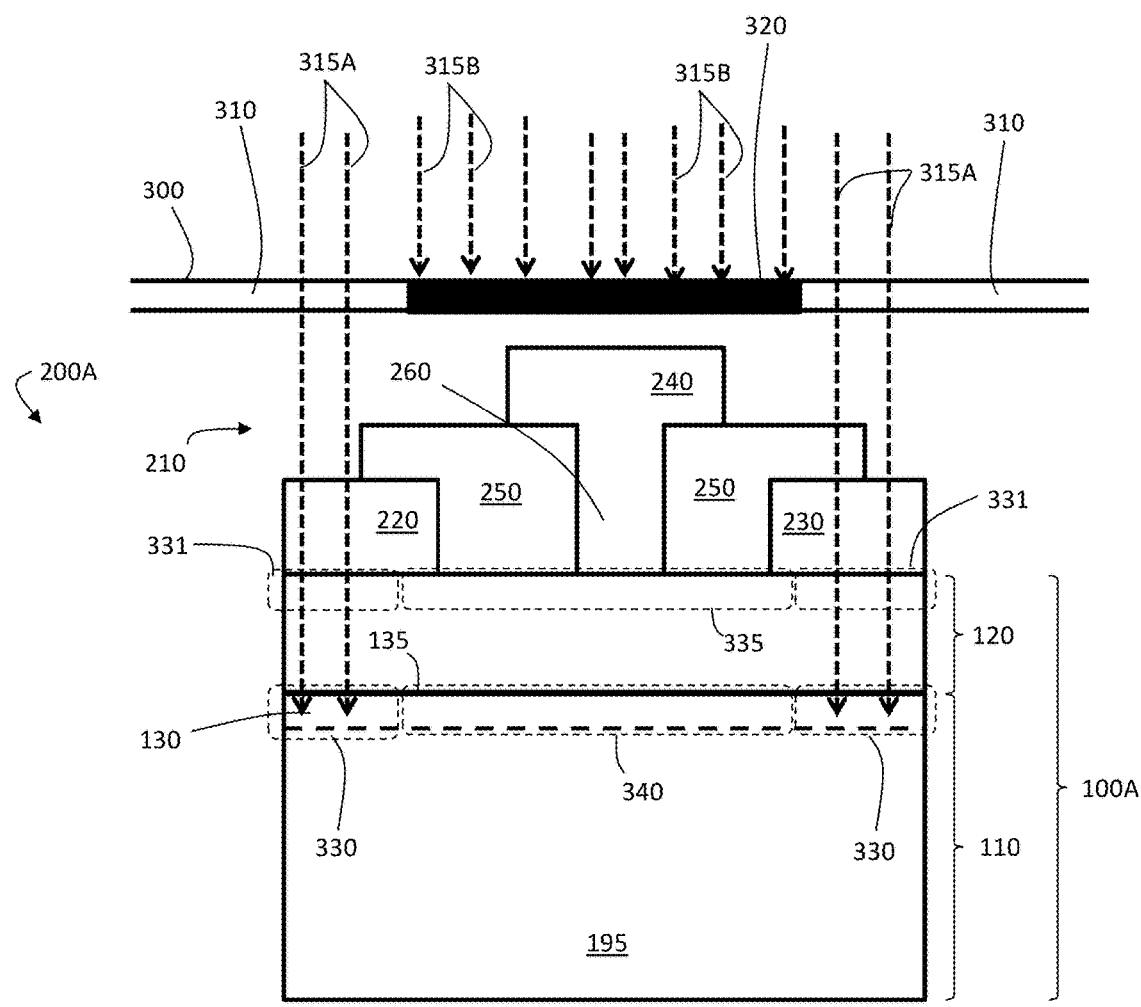
FIG. 3A is, according to some embodiments, a cross-sectional schematic illustration showing the transport of species into a semiconductor structure.
Figure 3B:
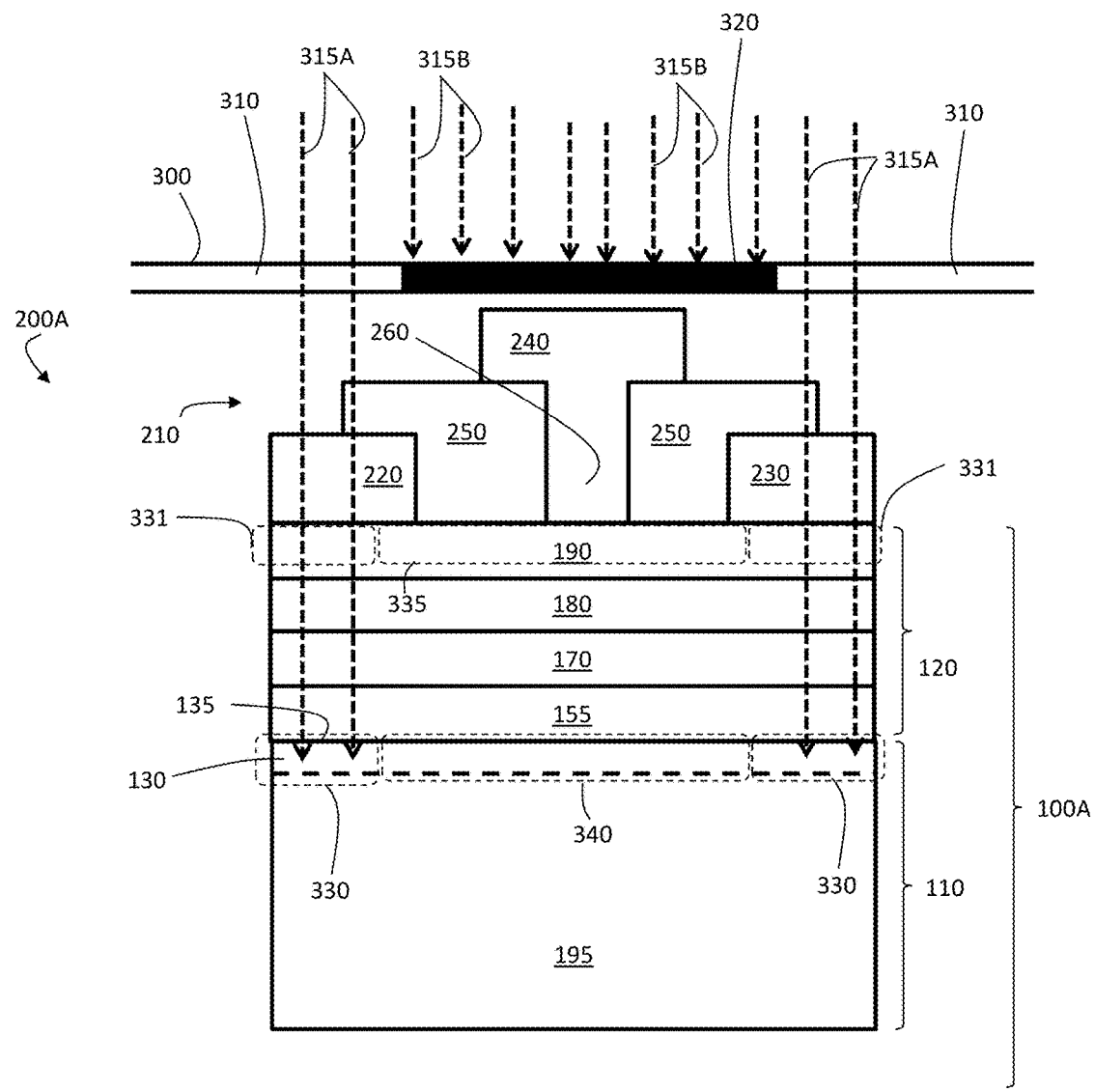
FIG. 3B is a cross-sectional schematic illustration showing the transport of species into a semiconductor structure comprising multiple layers within a III-nitride material region, according to certain embodiments.

According to certain embodiments, the species that is implanted into the substrate in a spatially defined pattern can have a relative atomic mass of less than 5. The species having a relative atomic mass of less than 5 can be atomic (e.g., atomic helium (He)), ionic (e.g., hydrogen cations ($H^+$)), or molecular (e.g., molecular hydrogen ($H_2$)). Other species could also be used including, but not limited to, p-type dopants (e.g., boron, aluminum, gallium, and/or indium) and n-type dopants (e.g., nitrogen, phosphorus, oxygen, and/or arsenic). In some embodiments, the spatially defined pattern in which the species is implanted can be a preselected spatially defined pattern. Such preselected spatially defined patterning may be achieved, for example, using an implantation mask. According to certain embodiments, the implanting is performed through a mask such that a first portion of the semiconductor structure is not substantially exposed to the implanted species and a second portion of the semiconductor structure is exposed to the implanted species. For example, an implantation mask comprising one or more open regions (which allow the implanted species to pass through the mask) and one or more blocking regions (which inhibit or prevent the implanted species from passing through the mask) can be employed. An exemplary schematic illustration showing such patterning is shown in FIG. 3A. In FIG. 3A, mask 300 comprises open regions 310, which allow implanted species 315A to pass through the mask and blocking region 320 which inhibits (or prevents) implanted species 315B from passing through mask 300. Another example of such patterning is shown in FIG. 3B, in which mask 300 comprises open regions 310, which allow implanted species 315A to pass through the mask and blocking region 320 which inhibits (or prevents) implanted species 315B from passing through mask 300. Although the open regions in FIGS. 3A and 3B are substantially rectangular in shape, mask openings with other shapes (e.g., circular or substantially circular, hexagonal or substantially hexagonal, parallelograms, etc.) may also be used.

According to some embodiments, the patterned implantation is performed such that at least one region of a parasitic channel (e.g., within a surface region of the substrate, such as surface region 130 in the figures) is exposed to the implanted species. In some such embodiments, at least a portion of the III-nitride material region is not exposed to the implanted species. In certain such embodiments, damage of the portions of the III-nitride material region that are not exposed to the implanted species can be avoided. For example, referring to FIGS. 3A-3B, in some embodiments, regions 330 of the parasitic channel within surface region 130 (and/or regions 331 of the III-nitride material region 120) are exposed to the implanted species while region 335 of III-nitride material region 120 (which region 335 can include a 2DEG region) and region 340 of a parasitic channel within surface region 130 are not exposed to the implanted species. According to some such embodiments, the structure of the material within region 335 (including, in some embodiments, the 2DEG region within region 335) is preserved while the number of free carriers within regions 330 is reduced or eliminated. According to certain embodiments, a 2DEG within region 335 is preserved while the 2DEG within regions 331 is reduced, eliminated, or interrupted, and the number of free carriers within regions 330 is reduced or eliminated.

According to certain embodiments, patterned implantation can reduce the conductivity of the parasitic channel region (or eliminate the parasitic channel region) while preserving the structure of one or more functional regions of the III-nitride material region (e.g., a 2DEG region). In some embodiments, after the species has been implanted into the semiconductor structure, the species is not substantially present within the III-nitride material region. Thus, in some embodiments, the III-nitride material region of the semiconductor structure (through which the species may be implanted) can be substantially free of the implanted species (i.e., the implanted species is not present or is present in an amount of less than about $10^{15}/cm^3$, and, in some cases, less than about $10^{14}/cm^3$, less than about $10^{13}/cm^3$, less than about $10^{12}/cm^3$, less than about $10^{11}/cm^3$, less than about $10^{10}/cm^3$, or lower). In some embodiments, the III-nitride material region comprises a 2DEG region, and the 2DEG region (through which the species may be implanted) is substantially free of the first implanted species (e.g., after the species is implanted).

In some embodiments, the implanted species is not implanted into at least a portion of a region between a source of the transistor and a drain of the transistor. The region between the source of the transistor and the drain of the transistor through which the species is not implanted may correspond to, in some embodiments, a 2DEG region. Thus, in some embodiments, the III-nitride material region of the semiconductor comprises a 2DEG region that is substantially free of the implanted species (i.e., the implanted species is not present or is present in an amount of less than about $10^{15}/cm^3$, and, in some cases, less than about $10^{14}/cm^3$, less than about $10^{13}/cm^3$, less than about $10^{12}/cm^3$, less than about $10^{11}/cm^3$, less than about $10^{10}/cm^3$, or lower). According to certain embodiments, the species is not implanted into at least a portion of a region between a source of the transistor and a gate of the transistor. In some embodiments, the species is not implanted into at least a portion of a region between a drain of the transistor and a gate of the transistor.

In certain embodiments, after the implanting step, at least a portion of the substrate underneath a channel between a source of the transistor and a drain of the transistor is substantially free of the implanted species (i.e., the implanted species is not present or is present in an amount of less than about $10^{15}/cm^3$, and, in some cases, less than about $10^{14}/cm^3$, less than about $10^{13}/cm^3$, less than about $10^{12}/cm^3$, less than about $10^{11}/cm^3$, less than about $10^{10}/cm^3$, or lower). In some embodiments, at least a portion of the substrate underneath a region between a source of the transistor and a gate of the transistor is substantially free of the implanted species. For example, referring to FIGS. 3A-3B, in some embodiments, region 340 (which is underneath a region between source 220 and drain 230 of transistor 210 (and which has portions between source 220 and gate 240 of transistor 210, and between gate 240 and drain 230 of transistor 210) is substantially free of the implanted species.

Figure 3C:
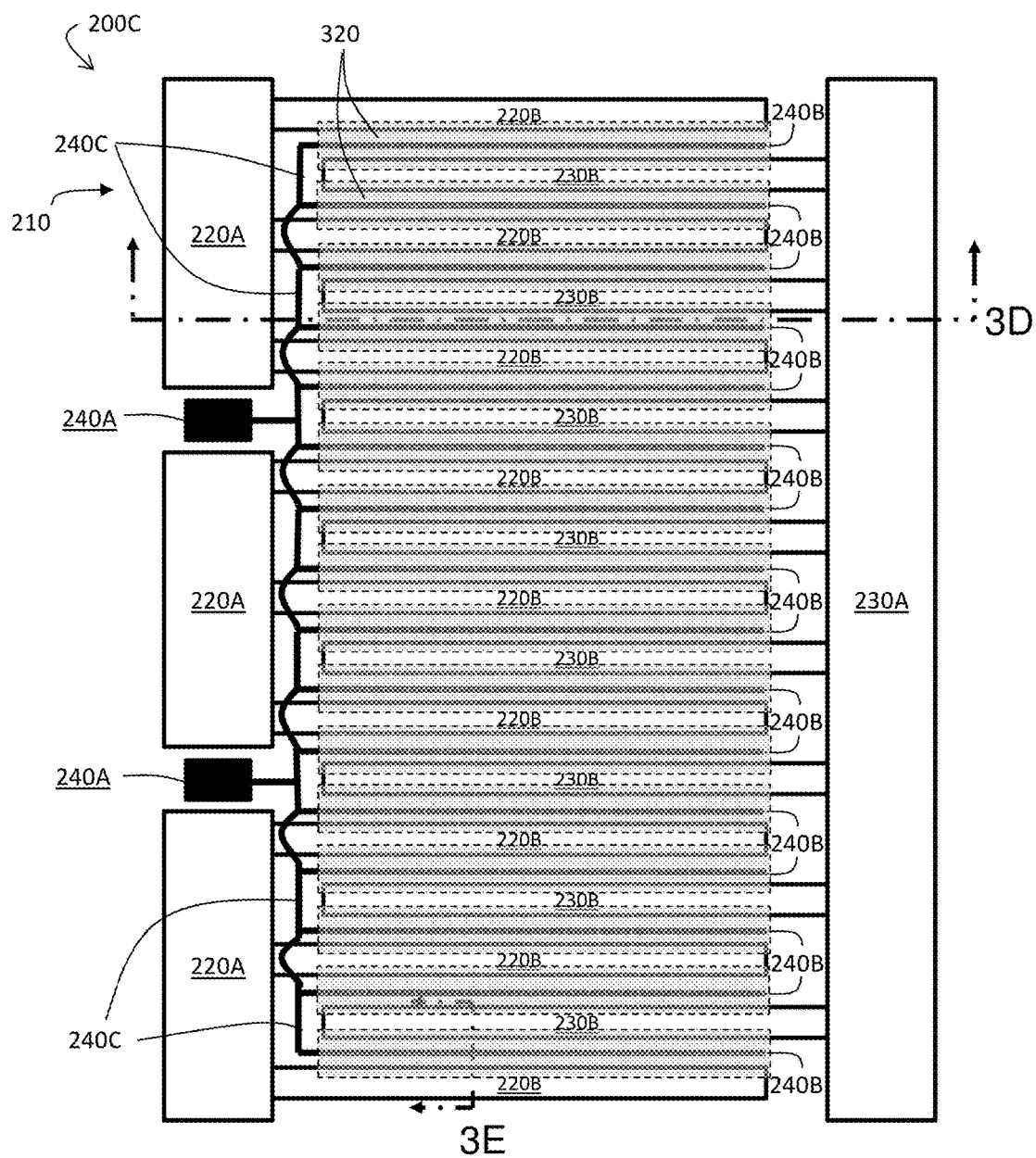
FIG. 3C is, according to certain embodiments, a top-view schematic illustration of a semiconductor structure comprising a transistor, including an implantation mask.
Figure 3D:
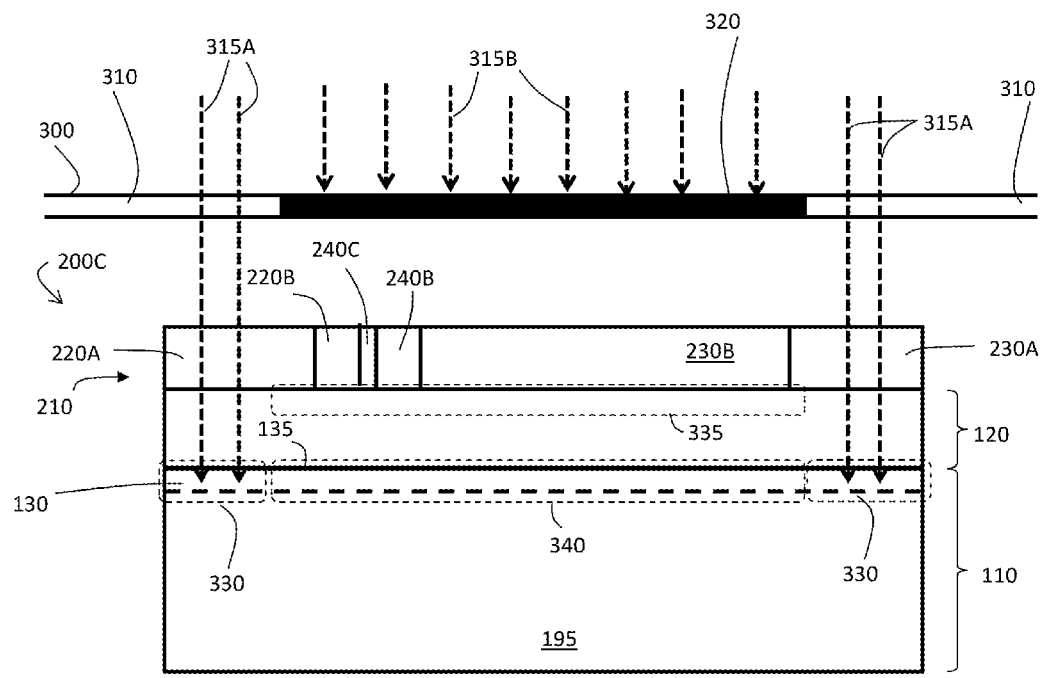
FIG. 3D is a side-view, cross-sectional schematic illustration of the semiconductor structure illustrated in FIG. 3C.
Figure 3E:
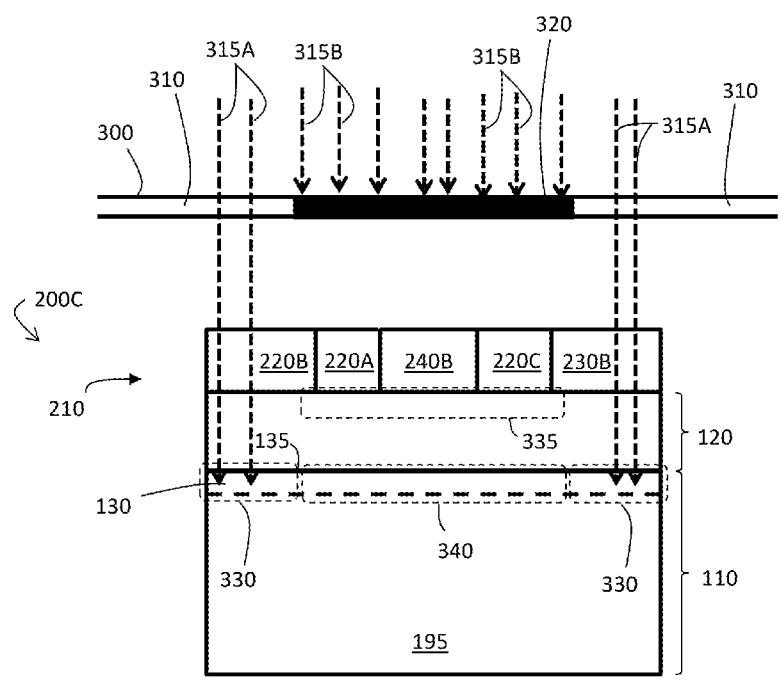
FIG. 3E is a side-view, cross-sectional schematic illustration of a portion of the semiconductor structure illustrated in FIG. 3C.

In some embodiments, the implanted species is not implanted into at least a portion of a region between at least a portion of a source electrode of the transistor and at least a portion of a drain electrode of the transistor. For example, in some embodiments, the implanted species is not implanted into at least a portion of a region between a source finger electrode portion and a drain finger electrode portion. Such arrangement of the implanted species can be achieved, for example, using an implantation mask. FIG. 3C is a top-view schematic illustration showing an embodiment in which a mask comprising blocking regions 320 (shown as shaded areas inside dotted rectangles) is used to avoid implanting a species in multiple regions between source finger electrode portions and drain finger electrode portions of a transistor (which can correspond to transistor 210 of semiconductor structure 200C from FIGS. 2C-2E). FIG. 3D is a front view cross-sectional illustration of semiconductor structure 200C from FIG. 3C, with the cross-section taken along line 3D shown in FIG. 3C. FIG. 3E is a side view cross-sectional illustration of semiconductor structure 200C from FIG. 3C, with the cross-section taken along line 3E shown in FIG. 3C. As shown in FIGS. 3D-3E, mask 300 comprises open regions 310, which allow implanted species 315A to pass through the mask and blocking region 320 which inhibits (or prevents) implanted species 315B from passing through mask 300. As a result, in some embodiments, regions 330 of the parasitic channel within surface region 130 (and/or regions 331 of the III-nitride material region 120) are exposed to the implanted species while region 335 of III-nitride material region 120 (which region 335 can include a 2DEG region) and region 340 of a parasitic channel within surface region 130 are not exposed to the implanted species. According to some such embodiments, the structure of the material within region 335 (including, in some embodiments, the 2DEG region within region 335) is preserved while the number of free carriers within regions 330 is reduced or eliminated. According to certain embodiments, a 2DEG within region 335 is preserved while the 2DEG within regions 331 is reduced, eliminated, or interrupted and the number of free carriers within regions 330 is reduced or eliminated.

According to certain embodiments, the implanted species is implanted into at least a portion of a substrate region (e.g., a substrate surface region) underneath a source electrode, a gate electrode, and/or a drain electrode of the transistor. In some embodiments, implantation of the species can be inhibited across at least a portion of (and, in some embodiments, a relatively large percentage of (e.g., at least about 50% of, at least about 75% of, or at least about 90% of)) the active area of the transistor, while that species is implanted into one or more regions underneath a source electrode, a drain electrode, and/or a gate electrode of the transistor. For example, in some embodiments, implantation of the species can be inhibited within at least one substrate surface region between a source electrode and a gate electrode and/or within at least one substrate surface region between a gate electrode and a drain electrode while, at the same time, the species can be implanted into at least one substrate surface region underneath a source electrode, a gate electrode, and/or a drain electrode. Such patterned implantation can be achieved, for example, using an implantation mask. For example, in some embodiments, the implantation mask can be used to inhibit the implantation of species within an active area of the transistor (and, in some cases, across a relatively large percentage of the active area of the transistor) but can allow for implantation of species underneath one or more regions underneath the source electrode (e.g., a source electrode pad), the gate electrode (e.g., a gate electrode pad), and/or the drain electrode (e.g., a drain electrode pad).

Figure 3F:
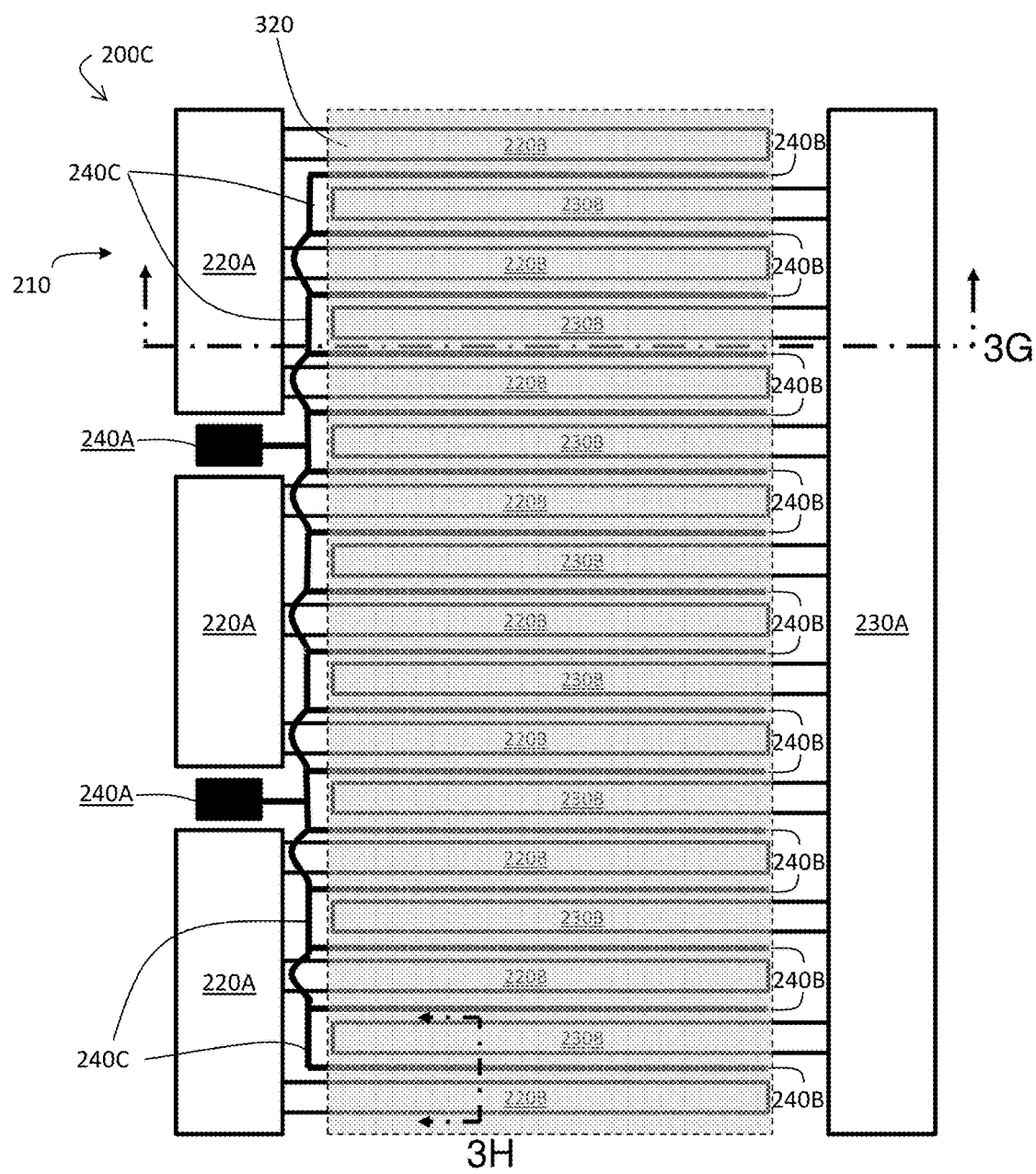
FIG. 3F is, according to certain embodiments, a top-view schematic illustration of a semiconductor structure comprising a transistor, including an implantation mask.
Figure 3G:
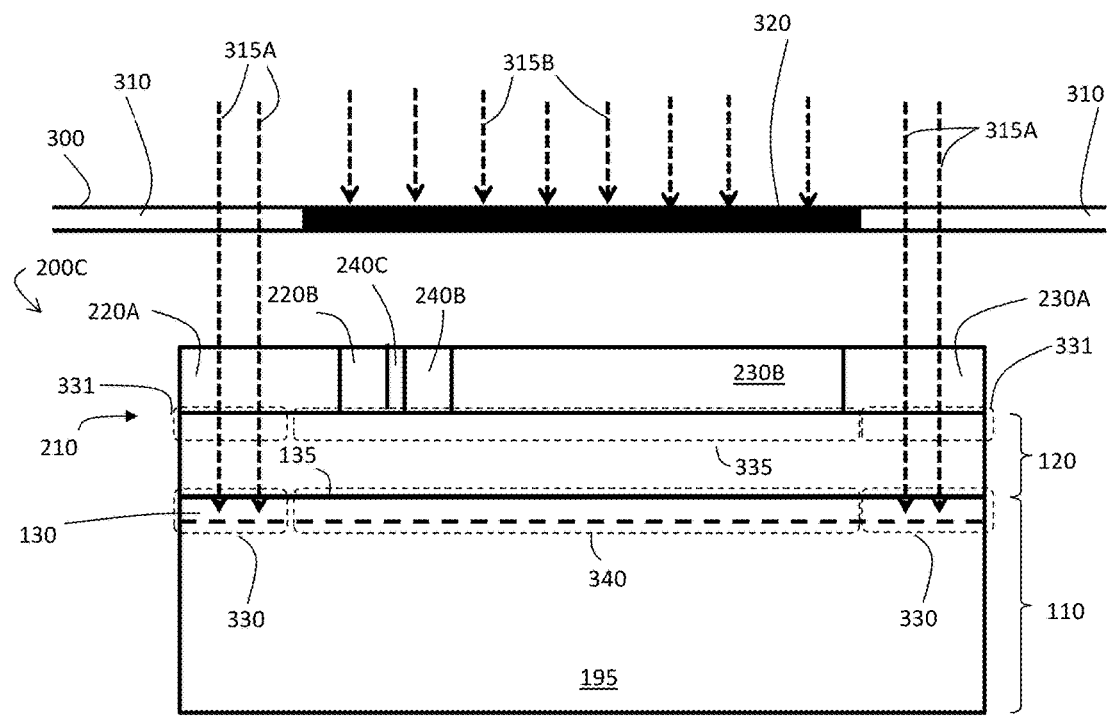
FIG. 3G is a side-view, cross-sectional schematic illustration of the semiconductor structure illustrated in FIG. 3F.
Figure 3H:
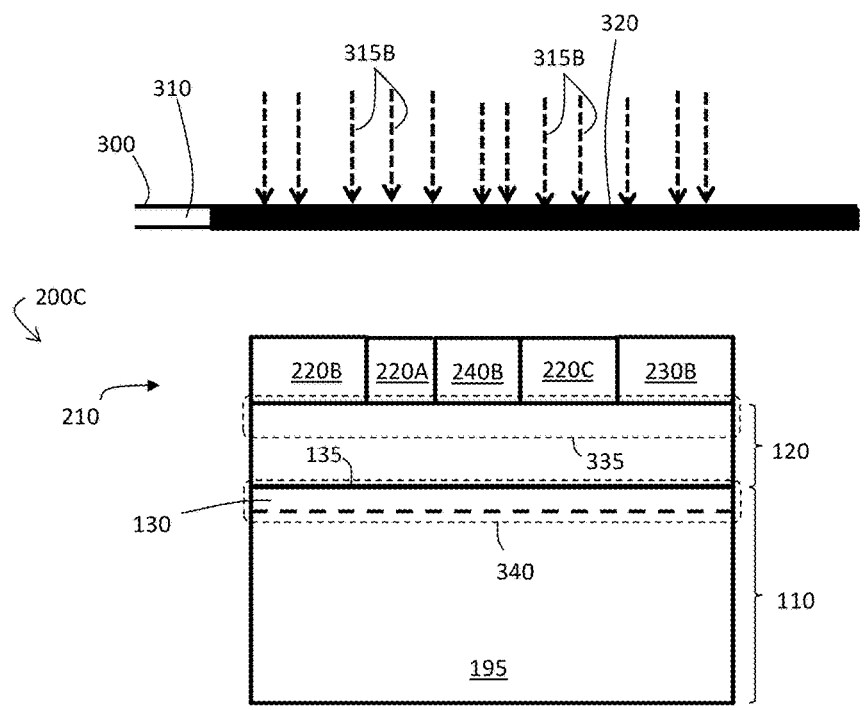
FIG. 3H is a side-view, cross-sectional schematic illustration of a portion of the semiconductor structure illustrated in FIG. 3F.

FIG. 3F is a top-view schematic illustration showing an embodiment in which a mask comprising blocking region 320 (shown as a shaded area inside a dotted rectangle) is used to avoid implanting within a large area of the active region of transistor 210 of semiconductor structure 200C (which can correspond to transistor 210 of semiconductor structure 200C from FIGS. 2C-2E). FIG. 3G is a front view cross-sectional illustration of semiconductor structure 200C from FIG. 3F, with the cross-section taken along line 3G shown in FIG. 3F. FIG. 3H is a side view cross-sectional illustration of semiconductor structure 200C from FIG. 3F, with the cross-section taken along line 3H shown in FIG. 3F. In the exemplary embodiment shown in FIGS. 3F-3H, substantially the entire active area of the transistor is masked to prevent implantation of the species into the active area. However, implantation of the implanted species can occur outside of the active region (e.g., in the field region of the transistor, such as under the source, gate, and/or drain pads; in the isolation regions of the transistor, and/or in saw street(s) between the transistor and an adjacent transistor). According to certain embodiments, by implanting outside the active area of the transistor, a high-conductivity parasitic channel area can remain intact in the active area of the transistor, while only a low-conductivity parasitic channel (or no parasitic channel) remains outside the active area, due to interaction of the implanted species into the surface region of the substrate. For example, as shown in FIGS. 3F-3H, mask 300 comprises open regions 310, which allow implanted species 315A to pass through the mask and blocking region 320 which inhibits (or prevents) implanted species 315B from passing through mask 300. As a result, in some embodiments, regions 330 of the parasitic channel within surface region 130 (and/or regions 331 of the III-nitride material region 120) are exposed to the implanted species while region 335 of III-nitride material region 120 (which region 335 can include a 2DEG region) and region 340 of a parasitic channel within surface region 130 are not exposed to the implanted species. According to some such embodiments, the structure of the material within region 335 (including, in some embodiments, the 2DEG region within region 335) is preserved while the number of free carriers within regions 330 is reduced or eliminated. According to certain embodiments, a 2DEG within region 335 is preserved while the 2DEG within regions 331 is reduced, eliminated, or interrupted and the number of free carriers within regions 330 is reduced or eliminated.

As noted above, in some embodiments, a species can be implanted in a field region of a semiconductor structure to reduce the conductivity of or eliminate a parasitic channel. Such implantation schemes may be useful, for example, in eliminating high-conductivity parasitic channels underneath contact pads of a transistor and/or between adjacent transistors of a semiconductor structure.

Figure 3I:
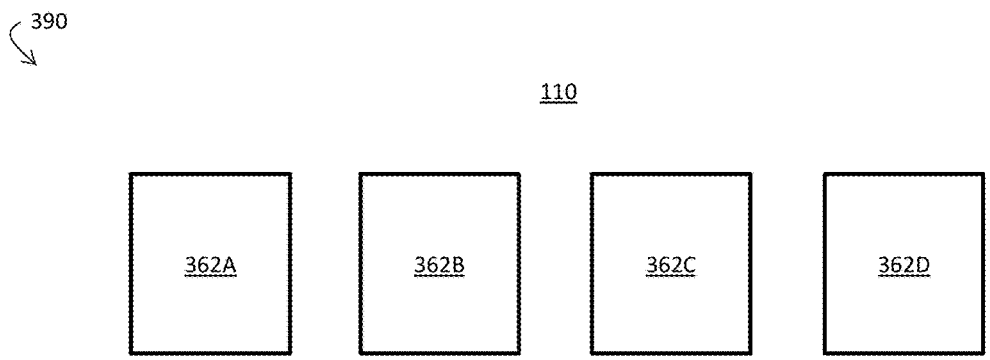
FIG. 3I is, according to certain embodiments, a top-view schematic illustration of a semiconductor structure comprising multiple transistors.
Figure 3J:
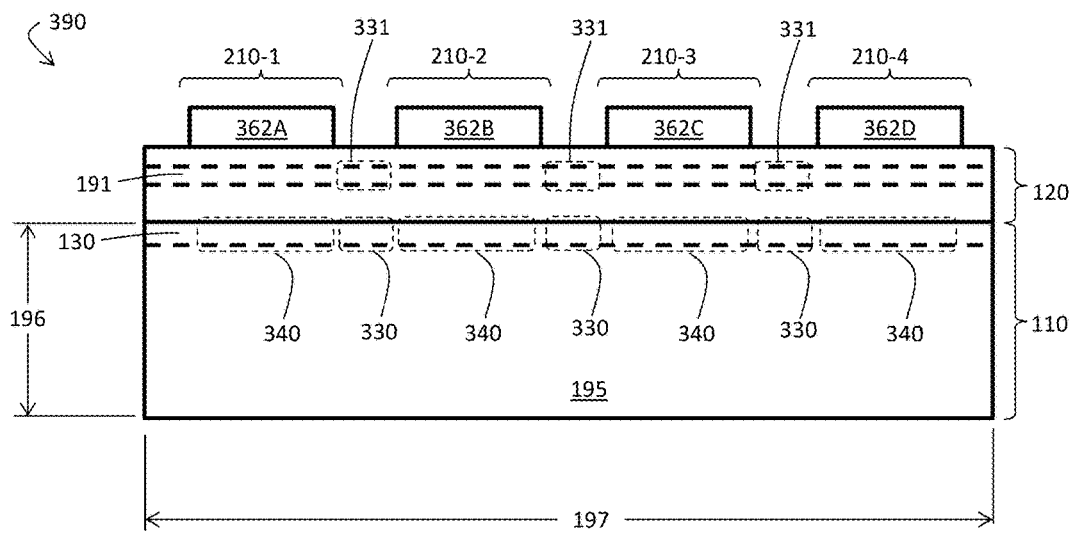
FIG. 3J is a side-view, cross-sectional illustration of the semiconductor structure illustrated in FIG. 3I.

In some embodiments, the semiconductor structure comprises a first transistor and a second transistor laterally spaced apart from the first transistor. For example, referring to FIGS. 3I-3J, semiconductor structure 390 comprises a first transistor 210-1 and a second transistor 210-2 laterally spaced apart from first transistor 210-1 (i.e., spaced apart along lateral dimension 197 of substrate 110). In certain embodiments, more than two transistors may be present. For example, in FIGS. 3I-3J, semiconductor structure 390 also comprises an optional third transistor 210-3 laterally spaced apart from first transistor 210-1 and second transistor 210-2, and an optional fourth transistor 210-4 laterally spaced apart from first transistor 210-1, second transistor 210-2, and third transistor 210-3. In FIGS. 3I-3J, the electrodes (e.g., the source, drain, and gate electrodes) and the insulating materials between the electrodes are shown simply as block 362, for purposes of maintaining clarity in the figures. Accordingly, each of blocks 362A, 362B, 362C, and 362D can include a source electrode, a gate electrode, a drain electrode, and/or one or more dielectric layers, arranged in any suitable configuration (including, but not limited to, any of the configurations described herein).

According to certain embodiments, after an implanting step, at least a portion of the surface region of the substrate between the first transistor and the second transistor has a concentration of the implanted species of at least about $10^{19}/cm^3$ (or, in some embodiments, at least about $10^{20}/cm^3$, at least about $10^{21}/cm^3$, at least about $10^{22}/cm^3$, at least about $10^{23}/cm^3$, or more). For example, referring to FIG. 3J, in some embodiments, region 330 of surface region 130 of substrate 110 between first transistor 210-1 and second transistor 210-2 (and/or between second transistor 210-2 and third transistor 210-3, and/or between third transistor 210-3 and fourth transistor 210-4) has a concentration of the implanted species of at least about $10^{19}/cm^3$. According to certain embodiments, after an implanting step, the presence of the implanted species within the surface region of the substrate between the first transistor and the second transistor (and/or between the second transistor and the third transistor, and/or between the third transistor and the fourth transistor) can reduce the conductivity of a parasitic channel region within surface region 130 of substrate 110 such that a formerly high-conductivity parasitic channel region becomes a low-conductivity parasitic channel region or ceases to be a parasitic channel region. According to certain embodiments, after an implanting step, at least a portion of the surface region of the substrate below the first transistor and/or the second transistor is substantially free of the implanted species (i.e., the implanted species is not present or is present in an amount of less than about $10^{15}/cm^3$, and, in some cases, less than about $10^{14}/cm^3$, less than about $10^{13}/cm^3$, less than about $10^{12}/cm^3$, less than about $10^{11}/cm^3$, less than about $10^{10}/cm^3$, or lower). For example, referring to FIG. 3J, in some embodiments, region 340 under first transistor 210-1 can be substantially free of the implanted species. In some embodiments, region 340 under second transistor 210-2 (and/or third transistor 210-3, and/or fourth transistor 210-4) can be substantially free of the implanted species.

According to certain embodiments, after an implanting step, the presence of the implanted species within the surface region of the substrate between the first transistor and the second transistor (and/or between the second transistor and the third transistor, and/or between the third transistor and the fourth transistor) can reduce the conductivity of a parasitic channel region within the surface region of the substrate such that a formerly high-conductivity parasitic channel region becomes a low-conductivity parasitic channel region (or ceases to be a parasitic channel region), while a 2DEG within the III-nitride material region is reduced, eliminated, or interrupted.

Figure 3K:
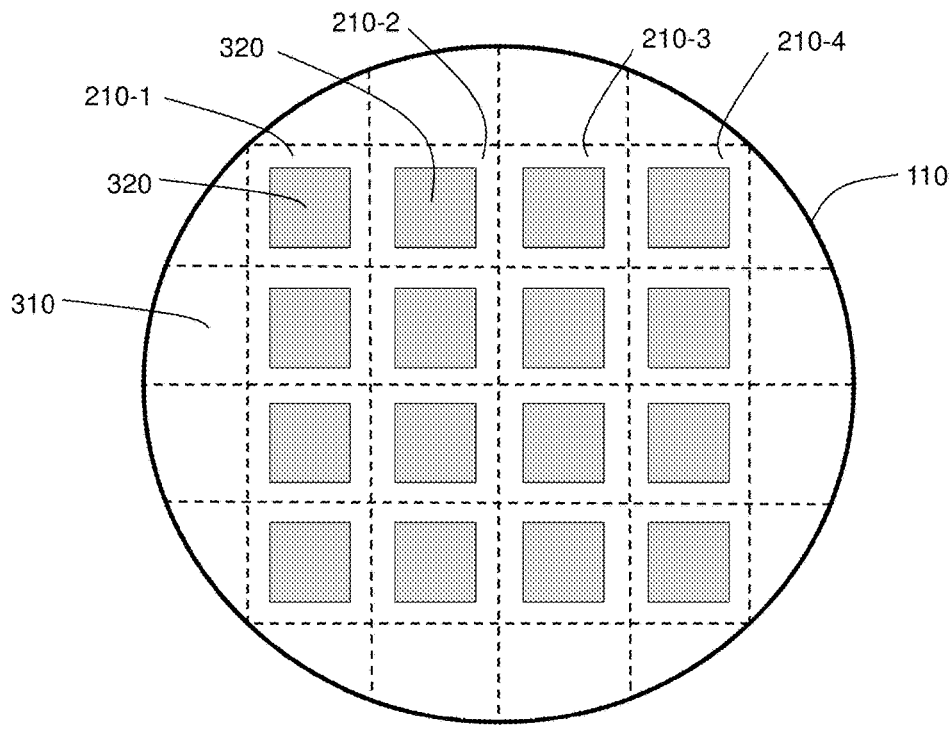
FIG. 3K is a schematic illustration of an implantation mask, according to certain embodiments.
Figure 3L:
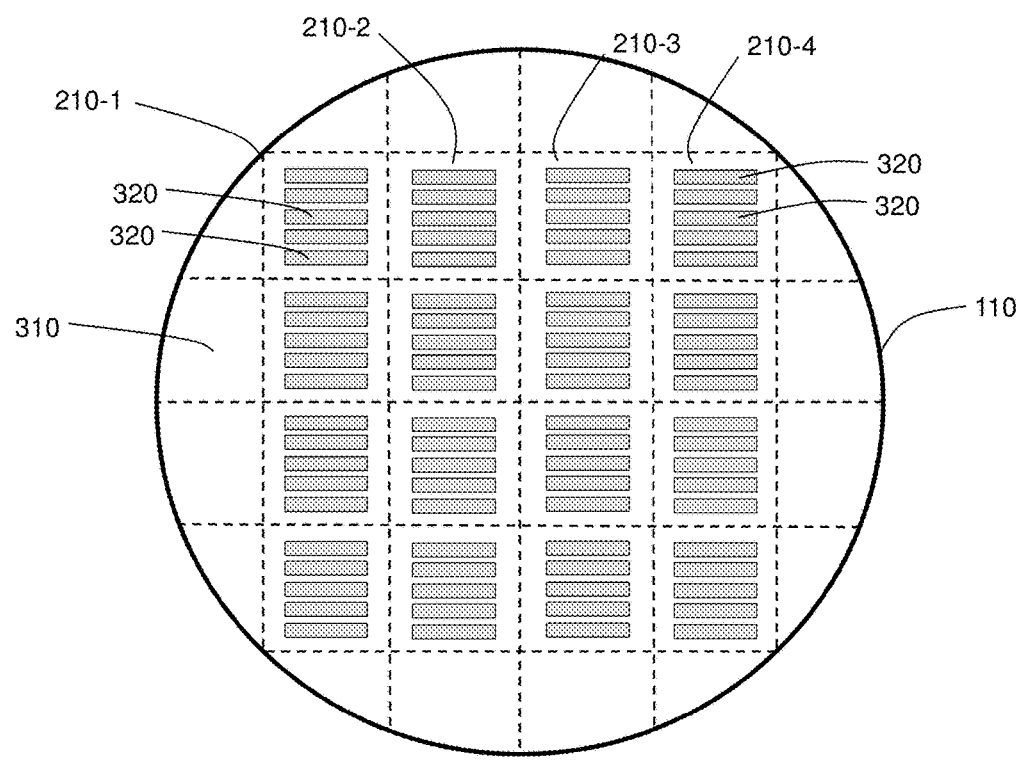
FIG. 3L is a schematic illustration of an implantation mask, according to certain embodiments.
Figure 3M:
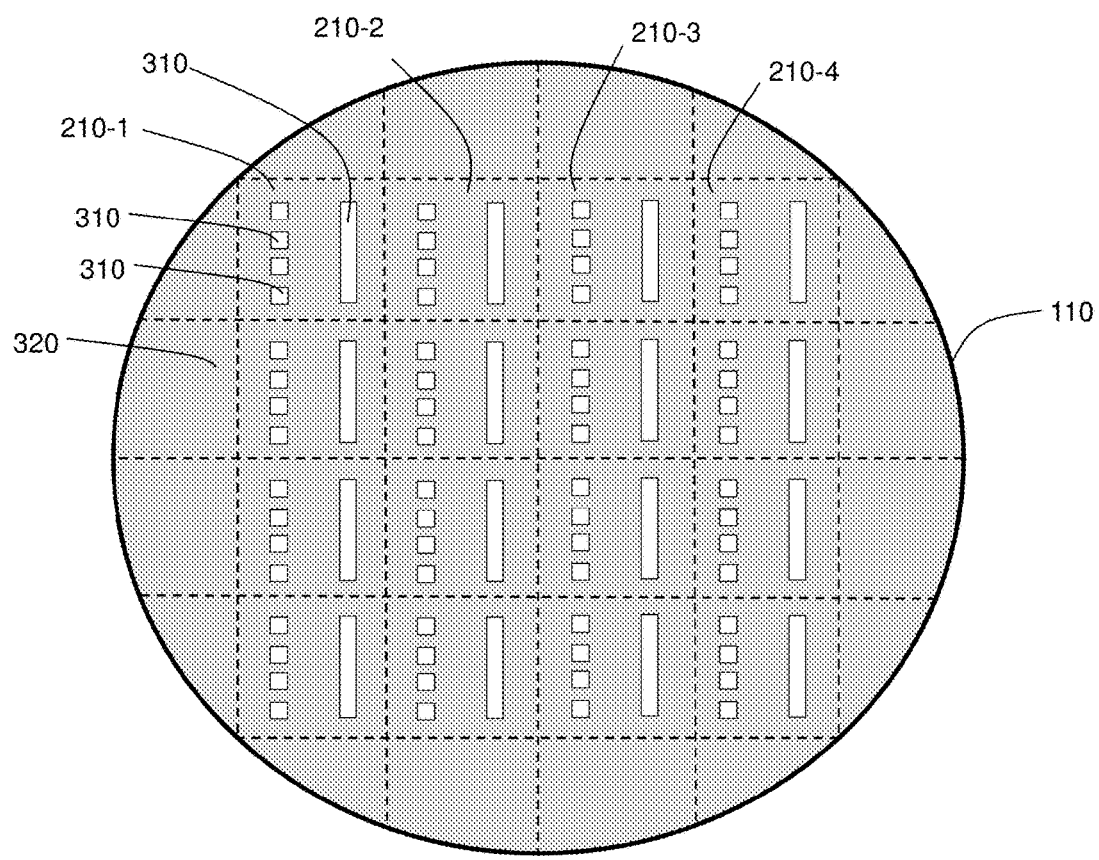
FIG. 3M is a schematic illustration of an implantation mask, according to certain embodiments.

FIGS. 3K-3M are top-view schematic illustrations showing exemplary implantation masks that can be used to implant one or more species into a semiconductor structure comprising multiple devices (e.g., transistors, such as FETs), according to certain embodiments. Transistors can be laterally spaced across the top surface of substrate, for example, in an array. For example, in FIGS. 3K-3M, transistors 210 (including transistors 210-1, 210-2, 210-3, and 210-4) are arranged in a two-dimensional array. The mask can include multiple blocking regions, which can inhibit or prevent the implantation of species into the underlying semiconductor structure. For example, in FIGS. 3K-3M, the illustrated masks include blocking regions 320, which inhibit or prevent implantation of species into the semiconductor structure underlying regions 320. FIG. 3K includes a pattern similar to the pattern described with respect to FIG. 3F, repeated over each of the transistors on the substrate. FIG. 3L includes a pattern similar to the pattern described with respect to FIG. 3C, repeated over each of the transistors on the substrate. In certain embodiments, the mask can be configured such open regions cover a relatively large percentage (e.g., at least about 80%, at least about 90%, at least about 95%, or at least about 99%) of the area of the substrate covered by electrode pads, and blocking regions cover a relatively large percentage (e.g., at least about 80%, at least about 90%, at least about 95%, or at least about 99%) of the remaining substrate. One particular example is shown in FIG. 3M, in which the mask comprises open regions 310 positioned over contact pads of transistors 210, and blocking region 320 covers the remaining part of substrate 110. Although the open regions in FIGS. 3K-3M are substantially rectangular in shape, mask openings with other shapes (e.g., circular or substantially circular, hexagonal or substantially hexagonal, parallelograms, etc.) may also be used.

Certain embodiments comprise implanting a first species and a second species into the semiconductor structure. According to certain such embodiments, the first species and the second species can be implanted into the semiconductor structure at different depths. This can produce, for example, a semiconductor structure in which a first species is implanted at a first depth (e.g., with a surface region of the substrate) and a second species is present at a different depth (e.g., within the III-nitride material region, such as within a 2DEG region).

According to certain embodiments, the first implanted species and the second implanted species are compositionally different. In some embodiments, the first species that is implanted into the semiconductor structure can have a relative atomic mass of less than 5. The species having a relative atomic mass of less than 5 can be atomic (e.g., atomic helium (He)), ionic (e.g., hydrogen cations (H$^+$)), or molecular (e.g., molecular hydrogen (H$_2$)). In certain embodiments, more than one first species having an atomic mass of less than 5 may be implanted. In some embodiments, the second species that is implanted into the semiconductor structure can be a p-type dopant (e.g., boron, aluminum, gallium, and/or indium) or an n-type dopants (e.g., nitrogen, oxygen, phosphorus, and/or arsenic).

In some embodiments, the first species is implanted into the substrate of the semiconductor structure, such as into a surface region of the substrate (e.g., surface region 130 in the figures). In some such embodiments, the first implanted species is arranged within the substrate (e.g., within the surface region of the substrate) in a first pattern spatially defined across at least one lateral dimension of the substrate (and, in some embodiments, across two lateral dimensions of the substrate). Various such patterns are described above, for example, with respect to FIGS. 3A-3J. In some embodiments, during the implanting of the first species, at least a portion of the first species is implanted through the III-nitride material region. For example, referring to FIGS. 3A-3B, in some embodiments, a first species is implanted through III-nitride material region 120 into surface region 130 of substrate 110 (e.g., into regions 330 of surface region 130). Similarly, referring to FIGS. 3D-3E and 3G-3H, in some embodiments, a first species is implanted through III-nitride material region 120 into surface region 130 of substrate 110 (e.g., into regions 330 of surface region 130). According to certain embodiments, after the first species is implanted, the first species is present within at least a portion of the surface region of the substrate at a concentration of at least about $10^{19}$/cm$^3$ (or, in some embodiments, at least about $10^{20}$/cm$^3$, at least about $10^{21}$/cm$^3$, at least about $10^{22}$/cm$^3$, at least about $10^{23}$/cm$^3$, or more). For example, referring to FIGS. 3A-3B, in some embodiments, after a first species is implanted through III-nitride material region 120 into surface region 130 of substrate 110 (e.g., into regions 330 of surface region 130), the concentration of the first species within surface region 130 (e.g., within region 330 of surface region 130) can be at least about $10^{19}$/cm$^3$. As another example, referring to FIGS. 3D-3E and 3G-3H, in some embodiments, after a first species is implanted through III-nitride material region 120 into surface region 130 of substrate 110 (e.g., into regions 330 of surface region 130), the concentration of the first species within surface region 130 (e.g., within region 330 of surface region 130) can be at least about $10^{19}$/cm$^3$.

In some embodiments, after the first species is implanted, at least a second portion of the surface region of the substrate is substantially free of the first implanted species (i.e., the first implanted species is not present or is present in an amount of less than about $10^{15}$/cm$^3$, and, in some cases, less than about $10^{14}$/cm$^3$, less than about $10^{13}$/cm$^3$, less than about $10^{12}$/cm$^3$, less than about $10^{11}$/cm$^3$, less than about $10^{10}$/cm$^3$, or lower). For example, referring to FIGS. 3A-3B, in some embodiments, after a first species is implanted through III-nitride material region 120 into surface region 130 of substrate 110 (e.g., into regions 330 of surface region 130), region 340 of surface region 130 of substrate 110 can be substantially free of the first implanted species. As another example, referring to FIGS. 3D-3E and 3G-3H, according to certain embodiments, after a first species is implanted through III-nitride material region 120 into surface region 130 of substrate 110 (e.g., into regions 330 of surface region 130), region 340 of surface region 130 of substrate 110 can be substantially free of the first implanted species.

According to certain embodiments, after the first species is implanted, the III-nitride material region is substantially free of the first species (i.e., the first species is not present or is present in an amount of less than about $10^{15}$/cm$^3$, and, in some cases, less than about $10^{14}$/cm$^3$, less than about $10^{13}$/cm$^3$, less than about $10^{12}$/cm$^3$, less than about $10^{11}$/cm$^3$, less than about $10^{10}$/cm$^3$, or lower). For example, referring to FIGS. 3A-3B, in some embodiments, after a first species is implanted through III-nitride material region 120 into surface region 130 of substrate 110 (e.g., into regions 330 of surface region 130), III-nitride material region 120 can be substantially free of the first implanted species. As another example, referring to FIGS. 3D-3E and 3G-3H, according to certain embodiments, after a first species is implanted through III-nitride material region 120 into surface region 130 of substrate 110 (e.g., into regions 330 of surface region 130), III-nitride material region 120 can be substantially free of the first implanted species. In some such embodiments, the III-nitride material region comprises a 2DEG region, and the 2DEG region (e.g., after the first species is implanted) is substantially free of the first implanted species. For example, referring to FIGS. 3A-3B, in some embodiments, III-nitride material region 120 comprises a 2DEG region and, after a first species is implanted through III-nitride material region 120 into surface region 130 of substrate 110 (e.g., into regions 330 of surface region 130), the 2DEG region can be substantially free of the first implanted species. As another example, referring to FIGS. 3D-3E and 3G-3H, according to certain embodiments, III-nitride material region 120 comprises a 2DEG region and, after a first species is implanted through III-nitride material region 120 into surface region 130 of substrate 110 (e.g., into regions 330 of surface region 130), the 2DEG region can be substantially free of the first implanted species.

In certain embodiments, the second species is implanted into a III-nitride material region of the semiconductor structure. The second implanted species may be arranged, according to certain embodiments, within the III-nitride material region in a second pattern spatially defined across at least one lateral dimension (and, in some embodiments, across two lateral dimensions) of the substrate. The second implanted species may also be arranged within the III-nitride material region such that the second species forms a pattern spatially defined across at least one lateral dimension (and, in some embodiments, across two lateral dimensions) of the III-nitride material region.

According to some embodiments, the first implanted species can be used to form a spatially defined implantation pattern in a parasitic channel region within a semiconductor structure, and the second implanted species can be used to form a spatially defined implantation pattern in a III-nitride material region (e.g., a 2DEG region within a III-nitride material region) within the semiconductor structure. The first implanted species can be used, in some such embodiments, to reduce or eliminate the conductivity of certain regions of a parasitic channel within a surface region of a substrate (e.g., as described above). The second implanted species can be used, in some such embodiments, to reduce or eliminate the conductivity of certain portions of a 2DEG region within a III-nitride material region of the semiconductor structure. In some embodiments, the second implanted species can be used as an implant isolation step (e.g., in addition to or instead of an etched isolation step) in the fabrication process. The second implant species could be used, in some embodiments, to enhance ohmic contact from the source and/or drain electrodes of the device and the 2DEG and/or channel layer. In some such embodiments, the implant species may be a n-type dopant such as silicon or germanium.

An example of such patterned implantation is shown in FIG. 3A. In FIG. 3A, an optional second implantation step can be performed in which a second species (e.g., high energy boron or nitrogen to damage the III-nitride crystal lattice and disrupt the 2DEG) has been implanted into regions 331 of semiconductor structure 200A. In some such embodiments, the semiconductor structure includes both a first implanted species to reduce or eliminate the conductivity of a parasitic channel in patterned or selected regions of the substrate (e.g., in selected regions of a surface region of the substrate), as well as a second implanted species to reduce or eliminate the conductivity of patterned or selected regions of a 2DEG region in the III-nitride material region. The implantation of multiple species in this way may be advantageous according to certain, although not necessarily all, embodiments, such as, for example, in certain cases when implant isolation is used in the field regions of semiconductor structures to electrically isolate one device (e.g., transistor) form another device (e.g., transistor), and when implant species are also used to eliminate or reduce the impact of an existing parasitic channel. Another example illustrating the implantation of multiple species at different depths is shown in FIGS. 3B and 3H. In FIGS. 3B and 3H, an optional second implantation step can be performed in which a second species has been implanted into regions 331 of semiconductor structure 200A.

In certain embodiments, a semiconductor device may comprise a region in which the conductivity of a 2DEG region has been reduced or eliminated, for example, by implanting a second species (e.g., boron or nitrogen). In some such embodiments, the semiconductor device may also include a region—positioned under the region in which the conductivity of the 2DEG region has been reduced or eliminated—in which the conductivity of a parasitic channel has been reduced or eliminated. For example, referring to FIGS. 3A-3B, in certain embodiments, the semiconductor structure 200 may comprise a region 331 in which the conductivity of a 2DEG region within III-nitride material region 120 has been reduced, disrupted, or eliminated (for example, by implanting a second species) and a region 330, positioned under region 331, in which the conductivity of a parasitic channel has been reduced (or even eliminated). In some such embodiments, region 331 has a concentration of both the parasitic species (e.g., Ga, Al, etc.) and a concentration of the first implanted species (e.g., a species having a relative atomic mass of less than 5). In some embodiments, the semiconductor device may also comprise a region having a high-conductivity 2DEG and a region—positioned under the high-conductivity 2DEG region—having a high-conductivity parasitic channel. For example, referring to FIGS. 3A-3B, in some embodiments, the semiconductor device may have a region 335 which includes a high-conductivity 2DEG, as well as a region 340 formed under region 335 which includes a high-conductivity parasitic channel (for example, due to a relatively high concentration of one or more parasitic species, such as Ga, Al, and the like).

According to certain embodiments, implantation of the second species can reduce the electrical conductivity of the 2DEG by at least about 5%, at least about 10%, at least about 25%, at least about 50%, at least about 75%, at least about 90%, at least about 95%, at least about 99%, or more, relative to the electrical conductivity of the 2DEG prior to the implantation of the second species.

The patterned implantation of the second species can be achieved, for example, using an implantation mask. As shown in FIGS. 3A, 3B, and 3G, the second species is implanted into regions 331 using the same implantation mask 300 that is used to pattern the implantation of the first species. In other embodiments, the implantation of the second species can be achieved using a second implantation mask that is different from the first implantation mask. For example, in certain embodiments in which the implantation mask shown in FIG. 3C is used to implant the first species, a different implantation mask may be used to implant the second species (e.g., to avoid implanting the second species within active regions of the transistor). As one example, in some embodiments, the mask illustrated in FIG. 3C can be used to implant the first species and the mask illustrated in FIG. 3F can be used to implant the second species.

The III-nitride material region into which the second species is implanted may comprise, in some embodiments, a 2DEG region. In some such embodiments, the second implanted species can be implanted within the 2DEG region of the III-nitride material region. In some such embodiments, after implantation of the second species into the 2DEG region, the second implanted species forms a pattern spatially defined across at least one lateral dimension of the 2DEG region (and, in some embodiments, across two lateral dimensions of the 2DEG region).

In some embodiments, the concentration of the second implanted species within the III-nitride material region is relatively high. For example, in some cases, after the second species is implanted into the semiconductor structure, the second species is present within at least a portion of the III-nitride material region (e.g., within at least a portion of a 2DEG region of the III-nitride material) at a concentration of at least about $10^{16}/cm^3$ (and/or, in some embodiments, at least about $10^{17}/cm^3$, at least about $10^{18}/cm^3$, at least about $10^{19}/cm^3$, at least about $10^{20}/cm^3$, or more). Referring to FIGS. 3A-3B, for example, in some embodiments, after a second species is implanted into III-nitride material region 120, the concentration of the second species within III-nitride material region 120 (e.g., within region 331 of III-nitride material region 120) can be at least about $10^{16}/cm^3$. As another example, referring to FIG. 3G, in some embodiments, after a second species is implanted into III-nitride material region 120, the concentration of the second species within surface region 130 (e.g., within region 331 of III-nitride material region 120) can be at least about $10^{16}/cm^3$.

In some embodiments, after the second species is implanted, at least a second portion of the III-nitride material region is substantially free of the second implanted species (i.e., the second implanted species is not present or is present in an amount of less than about $10^{15}/cm^3$, and, in some cases, less than about $10^{14}/cm^3$, less than about $10^{13}/cm^3$, less than about $10^{12}/cm^3$, less than about $10^{11}/cm^3$, less than about $10^{10}/cm^3$, or lower). Referring to FIGS. 3A-3B, for example, in some embodiments, after a second species is implanted into III-nitride material region 120, region 335 of III-nitride material region 120 can be substantially free of the second implanted species. As another example, referring to FIG. 3G, in some embodiments, after a second species is implanted into III-nitride material region 120, region 335 of III-nitride material region 120 can be substantially free of the second implanted species. The first and second species can be implanted, according to certain embodiments, into a semiconductor structure comprising a transistor (e.g., a FET) located over the substrate. According to some such embodiments, after the first species is implanted into the semiconductor structure, at least a portion of the substrate underneath a channel between a source of the transistor and a drain of the transistor is substantially free of the first implanted species (i.e., the first implanted species is not present or is present in an amount of less than about $10^{15}/cm^3$, and, in some cases, less than about $10^{14}/cm^3$, less than about $10^{13}/cm^3$, less than about $10^{12}/cm^3$, less than about $10^{11}/cm^3$, less than about $10^{10}/cm^3$, or lower). For example, referring to FIGS. 3A-3B, in some embodiments, after the first species is implanted (e.g., using mask 300 shown in FIGS. 3A-3B), regions 335 and 340 can be substantially free of the first implanted species. As another example, referring to FIGS. 3E and 3G, in some embodiments, after the first species is implanted, regions 335 and 340 can be substantially free of the first implanted species. In some such embodiments, after the second species is implanted, at least a portion of the III-nitride material region underneath a channel between a source of the transistor and a drain of the transistor is substantially free of the second implanted species (i.e., the second species is not present or is present in an amount of less than about $10^{15}/cm^3$, and, in some cases, less than about $10^{14}/cm^3$, less than about $10^{13}/cm^3$, less than about $10^{12}/cm^3$, less than about $10^{11}/cm^3$, less than about $10^{10}/cm^3$, or lower). For example, referring to FIGS. 3A-3B, in some embodiments, after the second species is implanted, regions 335 and 340 can be substantially free of the second implanted species. As another example, referring to FIGS. 3E and 3G, in some embodiments, after the second species is implanted, regions 335 and 340 can be substantially free of the second implanted species.

In some embodiments, the first and/or second species can be implanted between first and second transistors in a semiconductor structure comprising multiple transistors. For example, as noted above, in some embodiments, the semiconductor structure comprises first transistor located over the substrate and a second transistor located over the substrate and laterally spaced apart from the first transistor. In some such embodiments, after the first species is implanted, a portion of the surface region of the substrate between the first transistor and the second transistor has a concentration of the first implanted species of at least about $10^{19}/cm^3$ (or, in some embodiments, at least about $10^{20}/cm^3$, at least about $10^{21}/cm^3$, at least about $10^{22}/cm^3$, at least about $10^{23}/cm^3$, or more). For example, referring to FIG. 3J, in some embodiments, after the first species is implanted, region 330 of surface region 130 of substrate 110 between first transistor 210-1 and second transistor 210-2 has a concentration of the first implanted species of at least about $10^{19}/cm^3$. In some embodiments, region 330 between second transistor 210-2 and third transistor 210-3 and/or region 330 between third transistor 210-3 and fourth transistor 210-4 has a concentration of the first implanted species of at least about $10^{19}/cm^3$.

In some such embodiments, after the second species is implanted, a portion of the III-nitride material region between the first transistor and the second transistor has a concentration of the second implanted species of at least about $10^{16}/cm^3$ (or, in some embodiments, at least about $10^{17}/cm^3$, at least about $10^{18}/cm^3$, at least about $10^{19}/cm^3$, at least about $10^{20}/cm^3$, or more). The second species can be implanted, according to some embodiments, such that a portion of a 2DEG region between the first transistor and the second transistor has a concentration of the second implanted species of at least about $10^{16}/cm^3$ (or, in some embodiments, at least about $10^{17}/cm^3$, at least about $10^{18}/cm^3$, at least about $10^{19}/cm^3$, at least about $10^{20}/cm^3$, or more). For example, referring to FIG. 3J, in some embodiments, after the second species is implanted, region 331 of III-nitride material region 120 between first transistor 210-1 and second transistor 210-2 (which can include a portion of a 2DEG region 191 between first transistor 210-1 and second transistor 210-2) has a concentration of the second implanted species of at least about $10^{16}/cm^3$. In some embodiments, region 331 between second transistor 210-2 and third transistor 210-3 and/or region 331 between third transistor 210-3 and fourth transistor 210-4 (which can include portions of a 2DEG region 191 between second transistor 210-2 and third transistor 210-3 and/or between third transistor 210-3 and fourth transistor 210-4, respectively) has a concentration of the second implanted species of at least about $10^{16}/cm^3$.

According to certain embodiments, the second species can be implanted such that it surrounds at least one transistor of the semiconductor structure. As one example, in some embodiments, an implantation mask similar to the mask shown in FIG. 3K can be used to pattern the implantation of the second species. In some such cases, when the second species is implanted across open region 310, the second implanted species can surround each of transistors 210 positioned over substrate 110.

Those of ordinary skill in the art, given the guidance provided by the instant specification, would be capable of selecting appropriate implantation conditions to achieve a desired implantation pattern. When implanting multiple species at different depths within semiconductor structures, each implantation step may, in some cases, be performed using different implant conditions (e.g., dose, energy, and/or implant species) may be employed. For example, in some cases, the conditions (e.g., dose, energy, etc.) used to implant the first species (e.g., having an atomic mass of less than 5) to reduce or eliminate the conductivity of an existing parasitic channel may be different than the conditions (e.g., dose, energy, etc.) used to implant the second species (e.g., a p-type dopant or an n-type dopant) or introduce nitrogen vacancies to reduce or eliminate the conductivity of a 2DEG region of a III-Nitride material device region). This difference can, in certain cases, be due to (at least in part) the different depths at which the parasitic channel and the 2DEG region are positioned. For example, the parasitic channel may be located at a relatively deep location (e.g., 2-5 microns below surface 135 of the substrate, or more) while the 2DEG region may be relatively shallow.

According to certain embodiments, patterned implantation of the first and/or second species may result in the formation of at least one p-n junction defined laterally across a portion of the semiconductor structure.

For example, patterned implantation of the first species into a surface region of the substrate may form, according to certain embodiments, a p-n junction defined laterally across the surface region of the substrate. Referring to FIG. 3A, surface region 130 of substrate 110 may have an original doping profile (e.g., n-type or p-type). In some cases, formation of III-nitride material region 120 may result in the diffusion of one or more dopants (e.g., Ga, In, As, N, and the like) into substrate 110, causing the doping type of surface region 130 to change (e.g., from an n-type region to a p-type region, or from a p-type region to an n-type region). In some embodiments, patterned implantation of the first species into regions 330 of surface region 130 can cause the doping type of regions 330 to change again (e.g., from n-type to p-type, or from p-type to n-type). In some such embodiments, region 340, because it is not exposed to the first implanted species, retains the doping type present after diffusion of the parasitic species into surface region 130. In some such embodiments, regions 330 form p-n junctions with region 340.

As another example, patterned implantation of the second species into a III-nitride material region (e.g., into a 2DEG region of a III-nitride material region) may form, according to certain embodiments, a p-n junction defined laterally across the III-nitride material region (e.g., defined laterally across a 2DEG region within a III-nitride material region) of the semiconductor structure. Referring to FIG. 3A, for example, III-nitride material region 120 may have an original doping profile (e.g., n-type or p-type). In some embodiments, patterned implantation of the second species into regions 331 of III-nitride material region 120 can cause the doping types of regions 331 to change (e.g., from p-type to n-type, or from n-type to p-type). In some such embodiments, region 335, because it is not exposed to the second implanted species, retains the doping type present after formation of the III-nitride material region. In some such embodiments, regions 331 form p-n junctions with region 335.

According to certain embodiments, one or more counter-dopants can be used to counteract the electronic effect of a dopant within the parasitic region of the semiconductor structure. The counter-doping may be performed, according to some such embodiments, to reduce the free carrier concentration within the parasitic region of the semiconductor structure.

Accordingly, certain embodiments comprise implanting a counter-dopant into the semiconductor structure such that a concentration profile of the counter-dopant substantially matches a concentration profile of a second dopant present within the substrate. Generally, the concentration profile of a first dopant type matches the concentration profile of a second dopant type within a region (e.g., within a substrate) when both the first and second dopant types are present in the substrate, and the maximum free carrier concentration through the thickness of the region (e.g., through the thickness of the substrate) is less than about $10^{17}/cm^3$. In some embodiments, a concentration profile of a first dopant type matches the concentration profile of a second dopant type within a region (e.g., within a substrate) such that the maximum free carrier concentration through the thickness of the region (e.g., through the thickness of the substrate) is less than about $10^{16}/cm^3$, less than about $10^{15}/cm^3$, less than about $10^{14}/cm^3$, less than about $10^{13}/cm^3$, less than about $10^{12}/cm^3$, less than about $10^{11}/cm^3$, or less than about $10^{10}/cm^3$. One of ordinary skill in the art would understand that, when determining the n-type dopant concentration profile, the contributions of all n-type dopants are considered as a whole. Thus, when multiple n-type dopants are present, the n-type dopant concentration profile corresponds to the profile generated when summing the concentrations of all n-type dopants through the thickness of the substrate. Similarly, when determining the p-type dopant concentration profile, the contributions of all p-type dopants are considered as a whole. Thus, when multiple p-type dopants are present, the p-type dopant concentration profile corresponds to the profile generated when summing the concentrations of all p-type dopants through the thickness of the substrate.

The counter-dopant and the second dopant originally present in the parasitic channel of the substrate can be of the opposite type. For example, in some embodiments, the parasitic channel comprises a p-type dopant (e.g., Al and/or Ga), and the counter-dopant comprises an n-type dopant (e.g., As and/or P). In certain embodiments, the parasitic channel comprises an n-type dopant (e.g., As and/or P), and the counter-dopant comprises a p-type dopant (e.g., Al and/or Ga).

Those of ordinary skill in the art are familiar with a variety of systems and methods that can be used to perform counter-doping. For example, counter-doping may be performed by growing a counter-doped layer (e.g., a counter-doped epitaxial layer) over the substrate (e.g., ex-situ). Counter-doping may also be performed, for example, by implanting (or diffusing) a counter-dopant into a surface of the substrate (e.g., surface 135 of substrate 110 in the figures). As yet another example, counter-doping may be performed by implanting a counter-dopant using high energies (e.g., such that the surface region of the substrate becomes non-conductive).

Certain embodiments are related to semiconductor structures comprising substrates with multiple dopants whose concentration profiles are substantially matched. Such structures may be formed, for example, using the counter-doping methods described above. According to certain embodiments, the substrate of the semiconductor structure (e.g., any of the semiconductor structures described elsewhere herein) comprises a p-type dopant having a first concentration profile, and an n-type dopant having a second concentration profile that is substantially matched to the first concentration profile. The n-type dopant may be, for example, As and/or P. The p-type dopant may be, for example, Al and/or Ga.

According to certain embodiments in which counter-dopant(s) are implanted into the substrate, the substrate may also include a relatively high peak concentration of Group III species (e.g., Al, Ga, In, Tl, and B). The relatively high peak concentration(s) of Group III species can be present before the implantation step, according to some embodiments. In certain embodiments, the relatively high peak concentration(s) of Group III species can be present after the implantation step. In some embodiments, the presence of the counter-dopant(s) can reduce the electronic conductivity of the Group III species, inhibiting the formation of a high conductivity parasitic channel. In some embodiments in which counter-dopant(s) are implanted into the substrate, the peak of the sum of the concentrations of Group III species in the substrate (e.g., the peak of the sum of the concentrations of Al, Ga, In, Tl, and B in the substrate) is at least about $10^{17}/cm^3$, at least about $10^{18}/cm^3$, at least about $10^{19}/cm^3$, at least about $10^{20}/cm^3$, at least about $10^{21}/cm^3$, at least about $10^{22}/cm^3$, or at least about $10^{23}/cm^3$. In some embodiments in which counter-dopant(s) are implanted into the substrate, the peak of the sum of the concentrations of Al, Ga, and In in the substrate is at least about $10^{17}/cm^3$, at least about $10^{18}/cm^3$, at least about $10^{19}/cm^3$, at least about $10^{20}/cm^3$, at least about $10^{21}/cm^3$, at least about $10^{22}/cm^3$, or at least about $10^{23}/cm^3$. In some embodiments in which counter-dopant(s) are implanted into the substrate, the peak concentration of Al, Ga, and/or In in the substrate is at least about $10^{17}/cm^3$, at least about $10^{18}/cm^3$, at least about $10^{19}/cm^3$, at least about $10^{20}/cm^3$, at least about $10^{21}/cm^3$, at least about $10^{22}/cm^3$, or at least about $10^{23}/cm^3$.

In some embodiments, the substrate comprises a high-conductivity parasitic channel before the implantation of counter-dopant(s) and a low-conductivity parasitic channel (or no parasitic channel) after the implantation of counter-dopant(s). In some embodiments, the bulk region of the substrate has a lower peak free carrier concentration than the top surface region of the substrate before and/or after the implantation of counter dopant(s). In some embodiments, the bulk region of the substrate is doped with a first free carrier type and the top surface region is doped with a second free carrier type (e.g., a Group III species such as Al, Ga, In, and/or Tl) before and/or after the implantation of counter-dopant(s). According to certain embodiments, the peak free carrier concentration in the bulk region is less than about $10^{13}/cm^3$, less than about $10^{12}/cm^3$, less than about $10^{11}/cm^3$, less than about $10^{10}/cm^3$, or less than about $10^9/cm^3$ before and/or after the implantation of counter-dopant(s).

According to certain embodiments, one or more active species capable of reacting with a species originating in a location external to the substrate (also referred to herein as an "external species") is incorporated into the substrate (e.g., into a surface region of a substrate, which can be all or part of a silicon layer). The active species within the substrate can inhibit (or prevent) the formation of parasitic channels within the substrate (e.g., within the surface region of the substrate) by, for example, reacting with one or more external species that diffuses into or is otherwise transported into the substrate (e.g., during growth of the III-nitride material region). In some such embodiments, the presence of the active species ensures that the peak free carrier concentration within the substrate (e.g., within the surface region of the substrate) remains lower than it otherwise would be in the absence of the active species but under otherwise identical conditions.

Accordingly, certain inventive methods comprise forming a III-nitride material region over a surface of a substrate such that an active species within the substrate (e.g., within a surface region of the substrate) reacts with at least a portion of an external species that contacts the substrate during the formation of the III-nitride material region. For example, referring to FIGS. 1A-1B, in some embodiments, during at least a portion of the time during which at least a portion of III-nitride material region 120 is formed, an active species within substrate 110 (e.g., within surface region 130 of substrate 110) may react with a species external to substrate 110. In some such embodiments, the free carrier concentration within the parasitic channel within surface region 130 may remain relatively low. In certain embodiments, the parasitic channel within surface region 130 may even be completely eliminated from substrate 110.

A variety of active species capable of reacting with the species originating from a location external to the substrate can be used. Generally, such species are non-silicon species. The active species may be molecular or atomic, and may be charged or uncharged. In some embodiments, the species capable of reacting with the external species comprises oxygen (e.g., $O_2$, $O^+$), nitrogen (e.g., $N_2$), carbon, copper (e.g., in metallic form), and/or iron (e.g., in metallic form). According to certain embodiments, the species capable of reacting with the external species comprises $O^+$. In some embodiments, the active species capable of reacting with the external species comprises oxygen, and the oxygen oxidizes an external species that diffuses into the substrate during at least a portion of the time during which the III-nitride material region is formed.

The active species capable of reacting with a species external to the substrate can be, in some embodiments, formed in the substrate prior to the III-nitride material region growth step. Suitable processes for forming such regions in the substrate are known to those of ordinary skill in the art. For example, in some embodiments, the active species can be formed in the substrate by growing a layer comprising the active species over the substrate (e.g., ex-situ). In certain embodiments, the active species can be formed in the substrate by implanting (or diffusing) the active species into a surface of the substrate (e.g., surface 135 of substrate 110 in the figures). As yet another example, the active species can be formed in the substrate by implanting the active species using high energies.

The species external to the substrate (with which the active species reacts) may arise from a variety of sources. In some cases, the species external to the substrate may accumulate on the substrate surface (or an overlying layer/region), for example, after being introduced into a reaction chamber in which the substrate is placed, but prior to formation of the III-nitride material region on the substrate. For example, the species external to the substrate can be a contaminant originating from a reactant fed to the reactor. The species external to the substrate can also be a contaminant originating from a non-reactant source outside the reactor. For example, in some embodiments, the species external to the substrate may accumulate on the substrate (or an overlying layer) before the substrate is introduced into the reactor and may accompany the substrate as the substrate is introduced into the reactor. In certain cases, the species external to the substrate may be present within the reactor before the substrate is inserted into the reactor. For example, in some cases, the species external to the substrate may be a species that forms a part of the reactor (e.g., a metal such as Fe, Ni, and/or Cr) in which the III-nitride material region is grown. As another example, in some cases, the species external to the substrate may be a contaminant within the reactor that was present prior to insertion of the substrate into the reactor. In still further cases, the species external to the substrate can be a residual reactant left over from a previous reaction process. In certain embodiments, the external species is all or part of a precursor of the III-nitride material. In some embodiments, the species external to the substrate is an organic species (e.g., an organic component of a reaction precursor of the III-nitride material). The species external to the substrate could also be, in some embodiments, a group III element (e.g., Ga, In, and/or Al). Combinations of any or all of the above species external to the substrate are also possible.

Certain embodiments are related to semiconductor structures comprising substrates containing at least one active species. The active species, when present in the substrate (e.g., a surface region of the substrate), can be coupled with an external species (i.e., coupled with a species that originated from outside the substrate) or can be capable of reacting with a species external to the substrate (e.g., any of the external species mentioned above). In some embodiments, the concentration, within the substrate (e.g., within the surface region of the substrate), of the active species coupled to the external species or capable of reacting with the external species is at least about at least about $10^{19}/cm^3$ (or at least about $10^{20}/cm^3$, at least about $10^{21}/cm^3$, at least about $10^{22}/cm^3$, at least about $10^{23}/cm^3$, or more). The concentration of active species (either coupled to an external species or capable of reacting with an external species) can be measured using standard techniques known to those of ordinary skill in the art including Secondary Ion Mass Spectroscopy (SIMS).

According to certain embodiments in which active species are included in the substrate, the substrate may also include a relatively low peak concentration of Group III species (e.g., Al, Ga, In, Tl, and B), for example, after growth of the III-nitride region and/or after formation of the transistor. In some such embodiments, the one or more active species can react with Group III species, inhibiting the buildup of Group III species in the substrate. In some embodiments in which active species are included in the substrate, the peak of the sum of the concentrations of Group III species in the substrate (e.g., the peak of the sum of the concentrations of Al, Ga, In, Tl, and B in the substrate) is less than about $10^{17}/cm^3$, less than about $10^{16}/cm^3$, less than about $10^{15}/cm^3$, less than about $10^{14}/cm^3$, less than about $10^{13}/cm^3$, less than about $10^{12}/cm^3$, less than about $10^{11}/cm^3$, or less than about $10^{10}/cm^3$ (e.g., after the formation of the III-nitride region and/or after formation of the transistor). In some embodiments in which active species are included in the substrate, the peak of the sum of the concentrations of Al, Ga, and In in the substrate is less than about $10^{17}/cm^3$, less than about $10^{16}/cm^3$, less than about $10^{15}/cm^3$, less than about $10^{14}/cm^3$, less than about $10^{13}/cm^3$, less than about $10^{12}/cm^3$, less than about $10^{11}/cm^3$, or less than about $10^{10}/cm^3$ (e.g., after formation of the III-nitride region and/or after formation of the transistor). In some embodiments in which active species are included in the substrate, the peak concentration of Al, Ga, and/or In in the substrate is less than about $10^{17}/cm^3$, less than about $10^{16}/cm^3$, less than about $10^{15}/cm^3$, less than about $10^{14}/cm^3$, less than about $10^{13}/cm^3$, less than about $10^{12}/cm^3$, less than about $10^{11}/cm^3$, or less than about $10^{10}/cm^3$ (e.g., after formation of the III-nitride region and/or after formation of the transistor).

As noted above, certain embodiments relate to methods (and associated structures) in which diffusion barrier regions are used to inhibit or prevent the diffusion of material that increases the conductivity of the substrate (which increased conductivity can lead to the formation of high-conductivity parasitic channels). Dopants and/or other species can generally diffuse into the substrate after accumulating on the substrate surface, or on the surface of a layer overlying the substrate through which the dopants also diffuse. Thus, as described further below, certain methods can include forming one or more layers that inhibits or prevents the diffusion of dopants or other species into the substrate.

According to certain embodiments in which diffusion barrier regions are included in the semiconductor structure, the substrate may also include a relatively low peak concentration of Group III species (e.g., Al, Ga, In, Tl, and B), for example, after growth of the III-nitride region and/or after formation of the transistor. In some such embodiments, the diffusion barrier region can inhibit or prevent the diffusion of Group III species into the substrate, inhibiting the buildup of Group III species in the substrate.

In some embodiments in which in which diffusion barrier regions are included in the semiconductor structure, the peak of the sum of the concentrations of Group III species in the substrate (e.g., the peak of the sum of the concentrations of Al, Ga, In, Tl, and B in the substrate) is less than about $10^{17}/cm^3$, less than about $10^{16}/cm^3$, less than about $10^{15}/cm^3$, less than about $10^{14}/cm^3$, less than about $10^{13}/cm^3$, less than about $10^{12}/cm^3$, less than about $10^{11}/cm^3$, or less than about $10^{10}/cm^3$ (e.g., after formation of the III-nitride region and/or after formation of the transistor). In some embodiments in which diffusion barrier regions are included in the semiconductor structure, the peak of the sum of the concentrations of Al, Ga, and In in the substrate is less than about $10^{17}/cm^3$, less than about $10^{16}/cm^3$, less than about $10^{15}/cm^3$, less than about $10^{14}/cm^3$, less than about $10^{13}/cm^3$, less than about $10^{12}/cm^3$, less than about $10^{11}/cm^3$, or less than about $10^{10}/cm^3$ (e.g., after formation of the III-nitride region and/or after formation of the transistor). In some embodiments in which diffusion barrier regions are included in the semiconductor structure, the peak concentration of Al, Ga, and/or In in the substrate is less than about $10^{17}/cm^3$, less than about $10^{16}/cm^3$, less than about $10^{15}/cm^3$, less than about $10^{14}/cm^3$, less than about $10^{13}/cm^3$, less than about $10^{12}/cm^3$, less than about $10^{11}/cm^3$, or less than about $10^{10}/cm^3$ (e.g., after formation of the III-nitride region and/or after formation of the transistor).

According to certain embodiments, the diffusion barrier can inhibit or prevent the formation of a parasitic channel in the substrate during a subsequent step of forming a III-nitride material region over the substrate. For example, some embodiments comprise forming a III-nitride material region over a substrate over which a diffusion barrier region has been positioned (e.g., formed). According to some such embodiments, after forming the III-nitride material region over the diffusion barrier region, the surface region of the substrate over which the III-nitride material is formed comprises a low-conductivity parasitic channel or the surface region (and/or the remainder of the substrate) is free of a parasitic channel. This can lead to the formation of semiconductor devices comprising III-nitride material regions positioned over substrates in which the substrate has no parasitic channel or includes only a low-conductivity parasitic channel (e.g., in the surface region over which the III-nitride material region is formed). For example, referring to FIG. 1B, in some embodiments, after forming III-nitride material region 120 over diffusion barrier region 140, surface region 130 of substrate 110 over which III-nitride material region 120 is formed comprises a low-conductivity parasitic channel or surface region 130 (and/or the remainder of substrate 110) is free of a parasitic channel.

The diffusion barrier region can comprise, in some embodiments, a single-crystal diffusion barrier layer. In some embodiments, the diffusion barrier region comprises an epitaxial layer.

According to certain embodiments, the diffusion barrier region comprises an AlN region. In some such embodiments, the diffusion barrier comprises a low-temperature AlN region located over the substrate and a high-temperature AlN region located over the substrate. For example, in the embodiment illustrated in FIG. 1C, diffusion barrier region 140 comprises low-temperature AlN region 140A (which can be positioned over substrate 110). In addition, diffusion barrier region 140 comprises high-temperature AlN region 140B (which can be positioned over substrate 110 and over low-temperature AlN region 140A). In addition, as shown in FIG. 1B, semiconductor structure 100B comprises III-nitride material region 120, which can be located over low-temperature AlN region 140A and over high-temperature AlN region 140B when diffusion barrier region 140 includes such layers. While a multi-layer AlN diffusion barrier region is illustrated and described in association with FIG. 1C, it should be understood that such diffusion barrier regions could be used in any of diffusion barrier regions 140 shown in the figures.

Those of ordinary skill in the art would be capable of determining whether a particular AlN region is formed at low temperatures (e.g., temperatures below about 950° C.) or high temperatures (e.g., temperatures of about 950° C. or higher). Low-temperature AlN regions typically exhibit a relatively rough morphology, often including a three-dimensional surface structure. Such low-temperature AlN regions can include protrusions that are triangular and/or columnar in cross-section. High-temperature AlN regions, on the other hand, generally have a smoother morphology and develop a two-dimensional step-wise surface. According to certain embodiments, the low-temperature AlN region can be formed first, after which the high-temperature AlN region can be formed. In some such embodiments, the low-temperature AlN region is unsuitable for gallium nitride material growth, and the high-temperature AlN region can be used to provide a suitable substrate for subsequent gallium nitride material growth. Another artifact of using a low temperature and high temperature AlN nucleation bilayer is a change in impurity levels found within the two layers, for example the carbon impurity concentration. Typically, higher growth temperature AlN layers contain lower levels of carbon impurities, and lower growth temperature AlN contain higher levels of carbon impurities. Therefore, in certain cases, if two different growth temperatures were used for the AlN layers, there would be two distinct levels of carbon impurities present. Accordingly, in some embodiments, the semiconductor structure comprises a first AlN layer with a first level of impurities (e.g., carbon impurities) and a second AlN layer with a second level of impurities (e.g., carbon impurities) different from the first level of impurities (e.g., at least about 2 at % different, at least about 5 at % different, or more, relative to the level of impurities in the first AlN layer).

Certain embodiments relate to inventive methods for forming semiconductor structures comprising multiple AlN regions. According to certain embodiments, a first AlN region is formed over a substrate, wherein the temperature of the environment in which the first AlN region is formed is below about 950° C. (e.g., between about 700° C. and about 950° C.). Some embodiments comprise forming a second AlN region over the substrate, wherein the temperature of the environment in which the second AlN region is formed is at least about 950° C. (e.g., from about 950° C. to about 1150° C.). Certain such embodiments comprise forming a III-nitride material region over the first AlN region and over the second AlN material region.

In some embodiments, the low-temperature AlN region is formed first and the high-temperature AlN region is formed after the low-temperature AlN region is formed. For example, referring to FIG. 1C, in some embodiments, low-temperature AlN region 140A is formed over substrate 110, and subsequently, high-temperature AlN region 140B is formed over substrate 110 and over low-temperature AlN region 140A. In some such embodiments, the III-nitride material region is then formed. For example, in FIG. 1C, III-nitride material region 120 can be formed over substrate 110 after low-temperature AlN region 140A and high-temperature AlN region 140B have been formed over substrate 110.

In certain embodiments, the high-temperature AlN region is formed first and the low-temperature AlN region is formed after the high-temperature AlN region is formed. In such embodiments, the high-temperature AlN region can be positioned over the substrate and the low-temperature AlN region can be positioned over both the substrate and the high-temperature AlN region.

In certain embodiments, the device comprises an amorphous or non-single crystalline silicon nitride-based or aluminum-nitride based layer between the substrate and the III-nitride material nucleation layer. In some such embodiments, the amorphous or non-single crystalline layer may be formed of $Si_xN_y$ and/or $Al_xSi_{(1-x)}N$, and may optionally comprise one or more additional elements (e.g., oxygen). The amorphous or non-single crystalline layer may be relatively thin, according to some embodiments. For example, in some embodiments, the amorphous or non-single crystalline layer may have a thickness of less than about 30 Angstroms, less than about 20 Angstroms, or less than about 10 Angstroms (and/or, in some embodiments, down to 5 Angstroms thick, or less). The use of a relatively thin layer can allow one to avoid destroying the epitaxial template used to perform heteroepitaxial III-nitride material growth.

In some embodiments, the amorphous or non-single crystalline silicon nitride-based or aluminum-nitride based layer can be amorphous. In certain embodiments, the amorphous or non-single crystalline silicon nitride-based or aluminum-nitride based layer can be formed directly on the substrate (e.g., a silicon portion of the substrate). In some such embodiments, the amorphous or non-single crystalline silicon nitride-based or aluminum-nitride based layer may be formed by nitridating a top surface of the silicon substrate. In a nitridation process, nitrogen reacts with a top surface region of the silicon substrate to form a silicon nitride-based layer. The top surface may be nitridated by exposing the silicon substrate to a gaseous source of nitrogen at elevated temperatures. For example, ammonia may be introduced into a process chamber in which a silicon substrate is positioned. The temperature in the process chamber may be between about 1000° C. and about 1100° C. and the pressure may be between about 20 torr and about 40 torr (in some cases, about 30 torr). The reaction between nitrogen and the silicon substrate can be allowed to proceed for a reaction time selected to produce a layer having a desired thickness. It should be understood that other processes may be used to form silicon nitride-based layers including processes (e.g., CVD processes) that use separate nitrogen and silicon sources.

According to certain embodiments, the diffusion barrier region comprises a layer comprising a rare-earth oxide and/or a rare-earth nitride. The category "rare-earth oxide and/or rare-earth nitride" includes rare-earth oxides, rare-earth nitrides, and combination rare-earth oxides and rare-earth nitrides (e.g., rare-earth oxynitrides). In some embodiments, referring to FIG. 1B, diffusion barrier region 140 can comprise, a layer comprising a rare-earth oxide and/or a rare-earth nitride.

Some embodiments are related to methods of forming semiconductor structures comprising layers comprising a rare-earth oxide and/or a rare-earth nitride. For example, in some embodiments, a layer comprising a rare-earth oxide and/or a rare-earth nitride is formed over a substrate. In some such embodiments, a III-nitride material region is formed over the layer comprising the a rare-earth oxide and/or a rare-earth nitride. Referring to FIG. 1B, for example, in some embodiments, a layer comprising a rare-earth oxide and/or a rare-earth nitride is formed as part (or all) of diffusion barrier region 140. In some such embodiments, III-nitride material region 120 is subsequently formed over diffusion barrier region 140.

While a diffusion barrier region containing a rare-earth oxide and/or a rare-earth nitride is illustrated and described in association with FIG. 1B, it should be understood that such diffusion barrier regions could be used in any of diffusion barrier regions 140 shown in the figures.

A variety of types of rare-earth oxides and/or rare-earth nitrides can be used in the diffusion barrier region. As used herein, a "rare-earth" element refers to an element selected from the group consisting of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

A "rare-earth oxide" is any oxide species containing at least one rare-earth element. In some embodiments, the rare-earth oxide contains a single rare-earth element. In other embodiments, the rare-earth oxide contains two or more rare-earth elements. In some embodiments, the diffusion barrier region comprises an erbium oxide (e.g., $Er_2O_3$), a gadolinium oxide (e.g., $Gd_2O_3$), a cerium oxide (e.g., $CeO_2$), and/or a yttrium oxide (e.g., $Y_2O_3$). In some embodiments, the rare-earth oxide is free of nitrogen. In certain embodiments, the rare-earth oxide is not a rare-earth oxynitride.

A "rare-earth nitride" is any nitride species containing at least one rare-earth element. In some embodiments, the rare-earth nitride contains a single rare-earth element. In other embodiments, the rare-earth nitride contains two or more rare-earth elements. In some embodiments, the diffusion barrier region comprises an erbium nitride (e.g., $Er_2N$), a gadolinium nitride (e.g., GdN), a cerium nitride (e.g., CeN), and/or a yttrium nitride (e.g., YN). In some embodiments, the rare-earth nitride is free of oxygen. In certain embodiments, the rare-earth nitride is not a rare-earth oxynitride.

A "rare-earth oxynitride" is a compound in which both oxygen and nitrogen are present, along with at least one rare-earth element. A rare-earth oxynitride is considered to be both a rare-earth oxide and a rare-earth nitride. In some embodiments, the rare-earth oxynitride contains a single rare-earth element. In other embodiments, the rare-earth oxynitride contains two or more rare-earth elements. In some embodiments, the diffusion barrier region comprises an erbium oxynitride, a gadolinium oxynitride, a cerium oxynitride, and/or a yttrium oxynitride.

In certain embodiments, the amount(s) of the rare-earth element(s) of the rare-earth oxide and/or rare-earth nitride may be graded across the thickness of the rare-earth oxide and/or rare earth nitride in various grading schemes (e.g., compositionally graded, step-wise graded, continuously or discontinuously graded). According to some embodiments, the amount(s) of oxygen and/or nitrogen may be graded across the thickness of the rare-earth oxide and/or rare-earth nitride in various grading schemes (e.g., compositionally graded, step-wise graded, continuously or discontinuously graded). In some embodiments, both the amount(s) of rare-earth element(s) as well as the amount(s) of oxygen and/or nitrogen may be graded in various grading schemes (e.g., compositionally graded, step-wise graded, continuously or discontinuously graded).

According to certain embodiments, the diffusion barrier region containing the rare-earth oxide and/or rare-earth nitride can be made up of a relatively high percentage of rare-earth oxide and/or rare-earth nitride material. For example, in some embodiments, at least about 80 weight percent (wt %), at least about 90 wt %, at least about 95 wt %, at least about 98 wt %, at least about 99 wt %, or at least about 99.9 wt % of the diffusion barrier region is made up of rare-earth oxide and/or rare-earth nitride material. In some embodiments, at least about 80 wt %, at least about 90 wt %, at least about 95 wt %, at least about 98 wt %, at least about 99 wt %, or at least about 99.9 wt % of the diffusion barrier region is made up of rare-earth oxide material. In some embodiments, at least about 80 wt %, at least about 90 wt %, at least about 95 wt %, at least about 98 wt %, at least about 99 wt %, or at least about 99.9 wt % of the diffusion barrier region is made up of rare-earth nitride material. In some embodiments, at least about 80 wt %, at least about 90 wt %, at least about 95 wt %, at least about 98 wt %, at least about 99 wt %, or at least about 99.9 wt % of the diffusion barrier region is made up of rare-earth oxynitride material.

In some embodiments, diffusion barrier region 140 may comprise multiple layers of rare-earth oxide and/or rare-earth nitride material. For example, diffusion barrier region 140 may comprise at least one rare-earth oxide containing layer and at least one rare-earth nitride containing layer. In some embodiments, diffusion barrier region 140 may comprise at least two rare-earth oxide containing layers and/or at least two rare-earth nitride containing layers.

In some embodiments in which the diffusion barrier region comprises a rare-earth oxide and/or rare-earth nitride material, the diffusion barrier region comprising the rare-earth oxide and/or rare-earth nitride can be relatively thin. For example, in some embodiments, the diffusion barrier region comprising the rare-earth oxide and/or rare-earth nitride (either in the form of a single layer or in the form of multiple layers) can have a thickness of less than about 500 nm, less than about 200 nm, less than about 100 nm, less than about 50 nm, less than about 20 nm, or less than about 10 nm (and/or, in some embodiments, as thin as 5 nm, as thin as 1 nm, or thinner).

According to certain embodiments, the diffusion barrier region comprises a silicon carbide region. For example, referring to FIG. 1B, diffusion barrier region 140 can comprise, according to some embodiments, a layer comprising silicon carbide.

Some embodiments are related to methods of forming semiconductor structures comprising layers comprising silicon carbide. For example, in some embodiments, a silicon carbide region is formed over a substrate. In some such embodiments, a III-nitride material region is formed over the silicon carbide region and the substrate.

While diffusion barrier regions comprising silicon carbide regions are illustrated and described in association with FIG. 1B, it should be understood that such diffusion barrier regions could be used in any of diffusion barrier regions 140 shown in the figures.

In some embodiments, the silicon carbide region comprises an epitaxial layer of 3C—SiC (e.g., formed on the surface of the substrate). In certain embodiments, a silicon carbide region is formed via reaction and/or consumption of a silicon surface of a silicon substrate with a carbon species. For example, in some embodiments, a silicon carbide region is formed by contacting carbon with a near surface layer of a silicon substrate, and carbonizing or carburizing the near surface layer of a silicon substrate. In some embodiments, a silicon carbide region may be formed of two or more layers of 3C—SiC formed using different growth techniques. For example, in one embodiments, the silicon carbide region comprises a thin carbonized layer formed on the silicon surface, followed by a thicker epitaxially grown 3C—SiC layer above the carbonized layer. In some embodiments, the two or more layers of silicon carbide may include other types of silicon carbide, not limited to 3C—SiC polytypes. For example, the silicon carbide region can comprise, in some embodiments, a layer of 4H—SiC, 6H—SiC, or another silicon carbide polytype.

In certain embodiments, the silicon carbide containing diffusion barrier region can be relatively thick. For example, in some embodiments, the silicon carbide region can be greater than about 0.1 microns thick, greater than about 1 micron thick, or greater and about 2 microns thick (and/or, in some embodiments, up to 3 microns thick, or thicker). Such large thicknesses can be used, according to certain embodiments, due to the relatively high thermal conductivity of silicon carbide.

In certain embodiments, the diffusion barrier region may comprise at least one doped 3C—SiC layer. For example, epitaxial 3C—SiC as deposited may have a relatively low resistivity (for example, about 100 ohm-cm or less). In certain embodiments, it may be desired to use a highly resistivity 3C—SiC diffusion barrier. Certain embodiments comprise doping the 3C—SiC (e.g., with vanadium dopants). Doping the 3C—SiC may increase the resistivity of the 3C—SiC layer, for example, to greater than about 100 ohm-cm, greater than about 1000 ohm-cm, or greater than about 10,000 ohm-cm. In certain embodiments, it may be desired to us a conductive substrate. In some such cases, N- or P-type dopants may be added to the 3C—SiC layer(s) to increase electronic conductivity and/or to create a P-N junction within the 3C—SiC diffusion barrier.

According to certain embodiments, the diffusion barrier region comprises an elemental diboride diffusion barrier layer. For example, referring to FIG. 1B, diffusion barrier region 140 can comprise, according to some embodiments, a layer comprising an elemental diboride. "Elemental diboride," as used herein, refers to compounds having the formula $(X)_1B_2$, wherein B is boron and X is any other element or combination of elements. The formula $(X)_1B_2$ is used to indicate that the stoichiometric ratio of the total number of atoms of X elements in the compound (whether a single X element is present, or more than one X element is present) to the number of boron atoms in the compound is 1:2. In some embodiments, X can be a metal or combination of metals. In some embodiments, X can comprise a transition metal (or a combination of transition metals). In some embodiments, X can be selected from the group consisting of aluminum (Al), zirconium (Zr), Hafnium (Hf), and combinations and/or alloys of these. Examples of such compounds include $ZrB_2$, $HfB_2$, $AlB_2$, $Hf_{(x)}Zr_{(1-x)}B_2$, $Hf_{(x)}Al_{(1-x)}B_2$, $Al_{(x)}Zr_{(1-x)}B_2$, and $Al_{(x)}Hf_{(y)}Zr_{(1-x-y)}B_2$. In some embodiments, the elemental diboride comprises zirconium diboride ($ZrB_2$).

The elemental diboride layer can be, in some embodiments, a single-crystal elemental diboride layer. In some embodiments, the elemental diboride layer can be an epitaxial layer. In some embodiments, impurity atoms may be present within the elemental diboride layer (e.g., in interstitial spaces within the elemental diboride lattice).

Some embodiments are related to methods of forming semiconductor structures comprising diffusion barrier regions comprising an elemental diboride material layer. For example, in some embodiments, a diffusion barrier region comprising an elemental diboride material layer (e.g., a zirconium diboride ($ZrB_2$) material layer or any of the other elemental diboride materials described herein) is formed over a substrate. In some such embodiments, a III-nitride material region is formed over the diffusion barrier region comprising the elemental diboride.

While barrier regions comprising an elemental diboride are illustrated and described in association with FIG. 1B, it should be understood that such barrier regions could be used in any of barrier regions 140 shown in the figures.

In some embodiments in which the diffusion barrier region comprises an elemental diboride material, the diffusion barrier region comprising the elemental diboride can be relatively thin. For example, in some embodiments, the diffusion barrier region comprising the elemental diboride can have a thickness of less than about 500 nm, less than about 200 nm, less than about 100 nm, less than about 50 nm, or less than about 25 nm (and/or, in some embodiments, as thin as 15 nm, as thin as 10 nm, or thinner).

In certain embodiments in which the diffusion barrier region 140 comprises an elemental diboride, it may be (although is not necessarily) advantageous to use a miscut silicon substrate. Using the miscut silicon substrate can, according to certain embodiments, aid in the quality of the epitaxial elemental diboride layer according to some such embodiments.

According to certain embodiments, two or more of the parasitic channel mitigation/prevention strategies described herein can be used in combination. For example, in some embodiments, multiple diffusion barrier layers (e.g., two or more of AlN, rare-earth oxide and/or rare-earth nitride, silicon carbide, and elemental diboride) can be employed in combination, with one or more types of diffusion barrier materials within each diffusion barrier layer. In some embodiments, one or more diffusion barriers may be employed in combination with the implantation of a species capable of reacting with an external species, implantation of a species having an atomic mass of less than 5, and/or counter-doping of one or more species. In addition, the implantation of a species capable of reacting with an external species can be used in combination with the implantation of a species having an atomic mass of less than 5, in combination with counter-doping of one or more species, and/or in combination with the use of one or more diffusion barriers. According to certain embodiments, the implantation of a species having an atomic mass of less than 5 can be used in combination with the implantation of a species capable of reacting with an external species, the counter-doping of one or more species, and/or in combination with the use of one or more diffusion barriers. In some embodiments, counter-doping of one or more species can be used in combination with the implantation of a species having an atomic mass of less than 5, the implantation of a species capable of reacting with an external species, and/or in combination with the use of one or more diffusion barriers. Patterned implantation, at one or multiple depths, may also be used in combination with any of these strategies.

Various of the devices described herein may be made using conventional semiconductor processing techniques. Such processing techniques can involve, for example, growing layers on the substrate in a process chamber under vacuum conditions.

Some methods may include cleaning the substrate surface prior to growing overlying layers and, typically, before introduction into the process chamber. The substrate surface may be cleaned to remove residual dopant species that may diffuse into the substrate during processing. For example, the substrate may be cleaned by wet chemical cleaning agents such as buffered oxide etch (BOE), hydro-fluoric acid (HF), RCA clean (which is a commercial, proprietary silicon surface cleaning agent), etc. Substrates may also be cleaned by a combination of such agents. The surface of the substrate may be cleaned with organic solvents such as acetone, methanol, trichloroethylene, isopropyl alcohol, etc., for example, to rid a surface of organic contamination.

In some embodiments, methods may include controlling the residual (e.g., residual reaction by-products) amounts of dopant in the process chamber. For example, the amount of residual dopant may be reduced by purging the chamber with a gas (e.g., $NH_3$) while heating to an elevated temperature, prior to introducing the substrate into the chamber. Purging has been found to minimize accumulation of reaction-by-products on reaction chamber walls and components.

In certain embodiments in which a diffusion barrier layer is present, the diffusion barrier layer may be formed in-situ with overlying layers (e.g., the III-nitride material region) of the structure. That is, the diffusion barrier layer may be formed during the same deposition step as the III-nitride material region (e.g., including the optional III-nitride material nucleation layer, the optional III-nitride material transition layer, the optional III-nitride material buffer layer, and/or the III-nitride material device region).

The III-nitride material region may be formed using known growth techniques.

In some embodiments, the optional III-nitride nucleation layer, the optional III-nitride transition layer, the optional III-nitride buffer layer, and/or the III-nitride device region are grown using a metalorganic chemical vapor deposition (MOCVD) process. It should be understood that other suitable techniques known in the art may also be utilized to deposit these layers including molecular beam epitaxy (MBE), hydride vapor phase epitaxy (HVPE), and the like. In certain embodiments, more than one growth technique may be used to grow different III-nitride material layers. For example, in one set of embodiments, MBE could be used to grow the nucleation layer, and the remaining III-nitride material layers may be formed using MOCVD. Other combinations are also possible.

Generally, the MOCVD process involves introducing different reactive source gases (e.g., Al source gases, Ga source gases, N source gases) into the process chamber and providing conditions which promote a reaction between the gases to form a layer. The reaction proceeds until a layer of desired thickness is achieved. The composition of the layer may be controlled, as described further below, by several factors including gas composition, gas concentration, and the reaction conditions (e.g., temperature and pressure).

Examples of suitable source gases for MOCVD growth of the optional III-nitride material nucleation layer, the optional III-nitride material transition layer, the optional III-nitride material buffer layer, and/or the III-nitride material device region include trimethylaluminum (TMA) or triethylaluminum (TEA) as sources of aluminum; trimethylindium (TMI) or triethylindium (TEI) as sources of indium; trimethylgallium (TMG) or trimethylgallium (TEG) as sources of gallium; and ammonia ($NH_3$) as a source of nitrogen. The particular source gas used depends upon the desired composition of the layers. For example, an aluminum source (e.g., TMA or TEA), a gallium source (TMG or TEG), and a nitrogen source are used to deposit films having an $Al_xGa_{1-x}N$ composition.

The flow rates of the source gases, the ratios of the source gases, and the absolute concentrations of the source gases may be controlled to provide layers (e.g., transition layers and gallium nitride material regions) having a desired composition. For the growth of $Al_xGa_{1-x}N$ layers, typical TMA flow rates are between about 5 μmol/min and about 50 μmol/min with a flow rate of about 20 μmol/min being preferred in some cases; typical TMG flow rates are between about 5 μmol/min and 250 μmol/min, with a flow rate of 115 μmol/min being preferred in some cases; and the flow rate of ammonia is typically between about 3 slpm to about 10 slpm. According to certain embodiments, relatively high flow rates (and also higher gas velocities) can be used, which have been found to be particularly effective in minimizing accumulation of dopants.

According to certain embodiments, the reaction temperatures are generally between about 900° C. and about 1200° C. In some embodiments, the process pressures are between about 1 Torr and about 760 Torr. It is to be understood that the process conditions, and in particular the flow rate, are highly dependent on the process system configuration. Typically, smaller throughput systems require less flow than larger throughput systems.

When forming a compositionally-graded layer (e.g., a compositionally graded transition layer, which might be formed, for example, within transition layer 170), process parameters may be suitably adjusted to control the compositional grading. The composition may be graded by changing the process conditions to favor the growth of particular compositions. For example, to increase incorporation of gallium in the transition layer thereby increasing the gallium concentration, the flow rate and/or the concentration of the gallium source (e.g., TMG or TEG) may be increased. Similarly, to increase incorporation of aluminum into the transition layer thereby increasing the aluminum concentration, the flow rate and/or the concentration of the aluminum source (e.g., TMA or TEA) may be increased. The manner in which the flow rate and/or the concentration of the source is increased (or decreased) can control the manner in which the composition is graded. In other embodiments, the temperature and/or pressure is adjusted to favor the growth of a particular compound. Growth temperatures and pressures favoring the incorporation of gallium into the transition layer differ from the growth temperatures and pressures favoring the incorporation of aluminum into the transition layer. Thus, the composition may be graded by suitably adjusting temperature and pressure.

When depositing a layer having a constant composition (e.g., a transition layer, a gallium nitride material layer, etc.), however, the process parameters can be maintained constant so as to provide a layer having a constant composition. When III-nitride material regions (e.g., gallium nitride material regions) include more than one material layer (e.g., more than one gallium nitride material layer) having different respective compositions, the process parameters may be changed at the appropriate time to change the composition of the layer being formed.

It should be understood that all of the layers/regions on the substrate (e.g., the optional III-nitride material nucleation layer, the optional III-nitride material transition layer, the optional III-nitride material buffer layer, and/or the III-nitride material device region) may be grown in the same process, or respective layers/regions may be grown separately.

The processes described herein have been described as involving growing the layers/regions (e.g., the optional III-nitride material nucleation layer, the optional III-nitride material transition layer, the optional III-nitride material buffer layer, and/or the III-nitride material device region) in vertical growth processes. That is, these layers/regions have been described as being grown in a vertical direction with respect to underlying layers/regions (including the substrate). However, in other embodiments of the invention (not shown), it is possible to grow at least a portion of the layer(s) of the III-nitride material region (e.g., gallium nitride material layer(s)) using a lateral epitaxial overgrowth (LEO) technique, for example, as described in U.S. Pat. No. 6,051,849; or a pendeoepitaxial technique that involves growing sidewalls of gallium nitride material posts into trenches until growth from adjacent sidewalls coalesces to form a gallium nitride material region, for example, as described in U.S. Pat. No. 6,265,289. U.S. Pat. No. 7,071,498 entitled "Gallium Nitride Material Devices Including an Electrode-Defining Layer and Methods of Forming the Same," filed Dec. 17, 2003, and issued Jul. 4, 2006, which is incorporated herein by reference above, further describes techniques used to grow other layers and features shown in the various embodiments described herein.

It should also be understood that other processes may be used to form structures and devices of the present invention as known to those of ordinary skill in the art.

Certain of the layers and/or regions are referred to as being "formed on," "formed over," "formed directly on," "formed directly over," and/or "covering" another layer or region (e.g., the substrate). It should be understood that such phrases include situations in which a top surface of an underlying region or layer (e.g., substrate) is converted to the layer or region that is being formed. Such phrases also refer to situations in which new layers are formed by depositing the new, separate layer on the top surface of the underlying layer and/or region (e.g., a substrate).

As noted above, the term "region" may refer to one layer or may refer to multiple layers. It should also be understood that, wherever a single layer is described, the single layer may be replaced, according to certain embodiments, with multiple layers. For example, in certain instances, single layers described herein can be replaced with multiple layers that perform a similar function.

The following examples are intended to illustrate certain embodiments of the present invention, but do not exemplify the full scope of the invention.

Example 1

Figure 6:
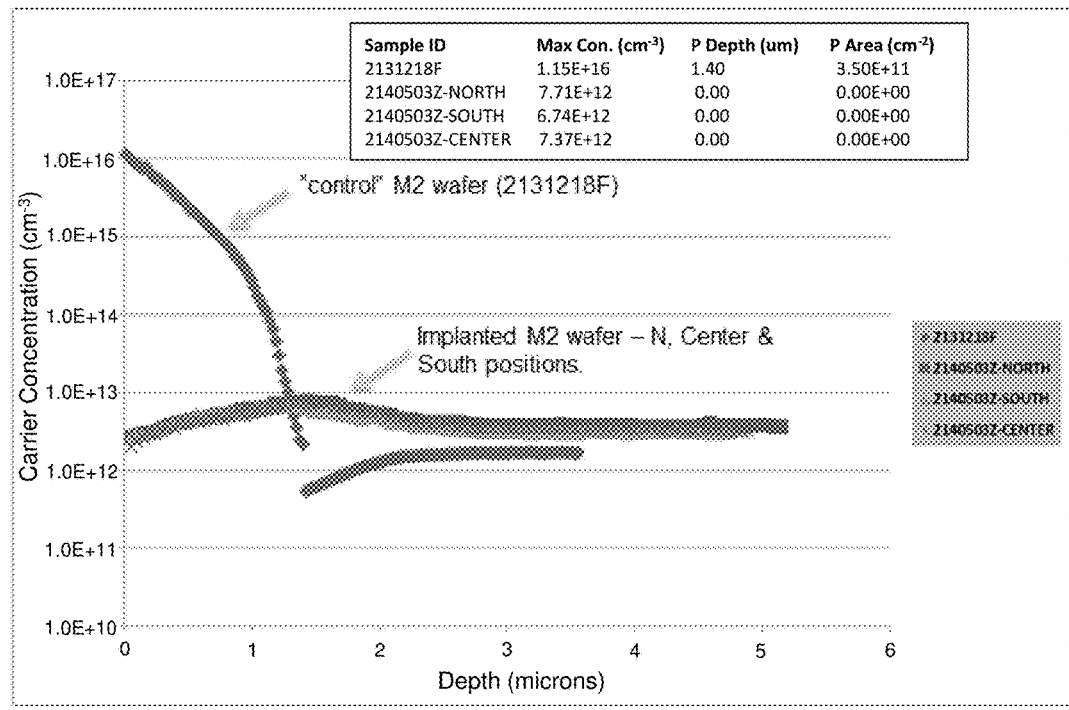
FIG. 6 is a plot of free carrier concentration as a function of depth into a substrate, including examples in which protons ($H^+$) were implanted into a substrate and examples in which protons ($H^+$) were not implanted into a substrate.

This example describes ion implantation of a species having a relative atomic mass of less than 5 into a GaN-on-Si HEMT epitaxial structure to reduce the impact of an existing parasitic channel. In this example, protons ($H^+$) were used as the implanted species. FIG. 6 is a plot of carrier concentration (in $cm^{-3}$) as a function of depth into the substrate (in microns), as determined by SRP.

Two similar GaN-on-Si HEMT epitaxial wafers were used in this demonstration. The parasitic channel level of the unimplanted wafer is shown as the "control" in FIG. 6. For the "control," the free carrier concentration was measured in the middle of the wafer, to characterize parasitic channel.

The second wafer (shown as the "implanted wafer" in FIG. 6) received a proton implant with an energy of 400 keV and a proton implant dose of $10^{14}$ $cm^{-2}$. SRP was performed at three locations across this wafer (at the crown, at the center, and at the flat regions) to assess parasitic channel level after proton implantation. The effect of the proton implant on the parasitic channel level was profound. Compared to the control wafer, the proton implant reduced the peak free carrier concentration by three orders of magnitude. The integrated background carrier charge was decreased by more than two orders of magnitude. The proton implant also completely changed the carrier type from p-type to n-type.

Parasitic channel reduction by proton implant was confirmed on more than one pair of control and implanted wafers.

Example 2

Figure 7:
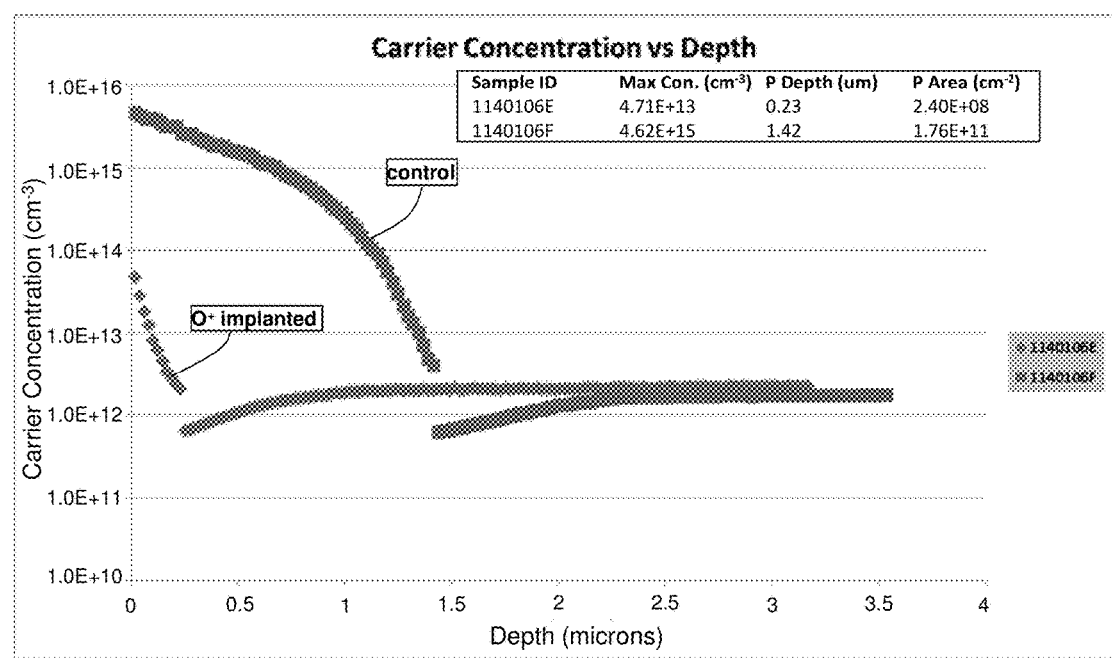
FIG. 7 is a plot of free carrier concentration as a function of depth into a substrate, including examples in which oxygen ($O^+$) was implanted into a substrate and examples in which oxygen ($O^+$) was not implanted into a substrate.

This example describes a set of experiments in which oxygen was implanted into a silicon substrate to reduce the free carrier concentration in the substrate after GaN formation. FIG. 7 is a plot of carrier concentration (in $cm^{-3}$) as a function of depth into the substrate (in microns), as determined by SRP.

Two silicon wafers comprising similar GaN-on-Si HEMT epitaxial structures were used. One silicon wafer was implanted with oxygen ($O^+$) prior to growth of an epitaxial GaN layer over the substrate. The oxygen implantation was performed using a 40 keV accelerating voltage and an oxygen implant dose of $5 \times 10^{15}$ $cm^{-2}$. The control substrate received no oxygen implant prior to GaN growth. Epitaxial GaN films were deposited on each substrate using the same epitaxial growth conditions.

As shown in FIG. 7, the wafer into which oxygen was implanted prior to GaN growth (shown as "O+ implanted" in the figure) had a parasitic channel substantially reduced compared to the wafer on which GaN was grown without oxygen implantation (shown as "control" in the figure). In particular, for the oxygen doped substrate, the peak carrier concentration was almost two orders of magnitude smaller and the total integrated parasitic channel charge was almost three orders of magnitude smaller, relative to the non-doped substrate.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, and/or method described herein. In addition, any combination of two or more such features, systems, articles, materials, and/or methods, if such features, systems, articles, materials, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A semiconductor structure, comprising:
a substrate comprising silicon; and
a III-nitride material region located over a surface region of the substrate,
a diffusion barrier region between the III-nitride material region and the substrate,
wherein:
the diffusion barrier region comprises at least one of a rare-earth oxide and/or a rare-earth nitride,
the surface region of the substrate comprises a low-conductivity parasitic channel or the substrate is free of a parasitic channel, and
at least a region of the substrate comprises at least one species having a relative atomic mass of less than 5 at a concentration of at least about $10^{19}/cm^3$.

2. The semiconductor structure of claim 1, wherein at least a portion of the surface region of the substrate comprises at least one species having a relative atomic mass of less than 5 at a concentration of at least about $10^{19}/cm^3$.

3. The semiconductor structure of claim 1, wherein the substrate comprises at least a layer having a resistivity of greater than about $10^2$ Ohms-cm.

4. The semiconductor structure of claim 1, wherein the substrate is a silicon substrate.

5. The semiconductor structure of claim 4, wherein the substrate is a bulk silicon wafer.

6. The semiconductor structure of claim 1, wherein the III-nitride material region comprises GaN.

7. The semiconductor structure of claim 1, wherein the species having a relative atomic mass of less than 5 comprises hydrogen and/or helium.

8. The semiconductor structure of claim 1, wherein the species having a relative atomic mass of less than 5 is located within the substrate in a spatially defined pattern.

9. The semiconductor structure of 1, wherein the surface region of the substrate comprises a low-conductivity parasitic channel.

10. The semiconductor structure of claim 9, wherein the low-conductivity parasitic channel has a peak free carrier concentration that is less than about $10^{17}/cm^3$.

11. The semiconductor structure of claim 9, wherein the low-conductivity parasitic channel has a total integrated surface region charge of less than about $10^{12}/cm^2$.

12. The semiconductor structure of claim 9, wherein the substrate comprises a bulk region below the surface region, the bulk region having a lower peak free carrier concentration than the surface region.

13. The semiconductor structure of claim 12, wherein the bulk region is doped with a first free carrier type and the surface region is doped with a second free carrier type.

14. The semiconductor structure of claim 12, wherein the peak free carrier concentration in the bulk region is less than about $10^{13}/cm^3$.

15. The semiconductor structure of claim 1, wherein the III-nitride material region comprises a III-nitride nucleation layer.

16. The semiconductor structure of claim 1, wherein the III-nitride material region comprises a III-nitride transition layer.

17. The semiconductor structure of claim 1, wherein the III-nitride material region comprises a III-nitride buffer layer.

18. The semiconductor structure of claim 1, wherein the III-nitride material region comprises a III-nitride device region.

\* \* \* \* \*